US012568759B2

(12) United States Patent
Kim et al.

(10) Patent No.: US 12,568,759 B2
(45) Date of Patent: Mar. 3, 2026

(54) ORGANIC LIGHT-EMITTING DEVICE AND DISPLAY APPARATUS INCLUDING THE SAME

(71) Applicant: Samsung Display Co., Ltd., Yongin-si (KR)

(72) Inventors: Seulong Kim, Yongin-si (KR); Tsuyoshi Naijo, Yongin-si (KR); Sungsoo Bae, Yongin-si (KR); Dongchan Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 358 days.

(21) Appl. No.: 16/546,041

(22) Filed: Aug. 20, 2019

(65) Prior Publication Data

US 2020/0235303 A1 Jul. 23, 2020

(30) Foreign Application Priority Data

Jan. 22, 2019 (KR) ........................ 10-2019-0008342

(51) Int. Cl.
*H10K 85/60* (2023.01)
*H10K 50/11* (2023.01)
*H10K 59/12* (2023.01)
*H10K 85/40* (2023.01)

(52) U.S. Cl.
CPC ........... *H10K 85/658* (2023.02); *H10K 50/11* (2023.02); *H10K 85/40* (2023.02); *H10K 85/622* (2023.02); *H10K 85/624* (2023.02); *H10K 85/653* (2023.02); *H10K 85/654* (2023.02); *H10K 85/655* (2023.02); *H10K 85/6572* (2023.02); *H10K 85/6574* (2023.02); *H10K 85/6576* (2023.02); *H10K 59/12* (2023.02)

(58) Field of Classification Search
CPC ........... H01L 2251/5384; H01L 51/008; H01L 51/5016; H01L 51/006; H01L 51/0067; H01L 51/0072; H01L 51/0073; H01L 51/0054; H01L 51/0056; H01L 51/0065; H01L 51/0068; H01L 51/0074; H01L 51/0094; C09K 11/06; C09K 2211/1037; C09K 2211/185; H10K 85/622; H10K 85/624; H10K 85/654; H10K 85/655; H10K 85/6574; H10K 85/653; H10K 85/6576; H10K 85/6572; H10K 85/40; H10K 85/322; H10K 85/658; H10K 2101/90; H10K 50/11
See application file for complete search history.

(56) References Cited

U.S. PATENT DOCUMENTS

| | | | | |
|---|---|---|---|---|
| 9,196,353 | B2 | 11/2015 | Ishii | |
| 10,680,186 | B2 | 6/2020 | Hatakeyama et al. | |
| 10,811,613 | B2 | 10/2020 | Hatakeyama et al. | |
| 10,826,000 | B2 | 11/2020 | Ito et al. | |
| 2002/0149710 | A1* | 10/2002 | Kim | H01L 27/3248 349/43 |
| 2004/0086745 | A1* | 5/2004 | Iwakuma | C07D 403/10 548/440 |
| 2007/0252516 | A1* | 11/2007 | Kondakova | H01L 51/5092 428/917 |
| 2014/0034940 | A1* | 2/2014 | Yu | H01L 51/0067 252/500 |
| 2015/0171346 | A1* | 6/2015 | Ahn | C07D 403/14 257/40 |
| 2015/0236274 | A1 | 8/2015 | Hatakeyama et al. | |
| 2015/0340618 | A1* | 11/2015 | Lee | C07D 213/06 544/294 |
| 2016/0087227 | A1 | 3/2016 | Kim et al. | |
| 2016/0126472 | A1 | 5/2016 | Oh et al. | |
| 2017/0179396 | A1* | 6/2017 | Kim | H10K 85/654 |
| 2017/0200899 | A1 | 7/2017 | Kim et al. | |
| 2017/0373267 | A1 | 12/2017 | Kim et al. | |
| 2018/0069182 | A1 | 3/2018 | Hatakeyama et al. | |
| 2018/0094000 | A1 | 4/2018 | Hatakeyama et al. | |
| 2018/0138425 | A1* | 5/2018 | Ma | C09K 11/06 |
| 2018/0301629 | A1 | 10/2018 | Hatakeyama et al. | |
| 2018/0301639 | A1* | 10/2018 | Zeng | C07D 487/04 |
| 2019/0058124 | A1 | 2/2019 | Hatakeyama et al. | |
| 2019/0207112 | A1 | 7/2019 | Hatakeyama et al. | |
| 2019/0259959 | A1* | 8/2019 | Duan | H01L 51/006 |
| 2019/0312207 | A1 | 10/2019 | Hatakeyama et al. | |
| 2020/0035922 | A1 | 1/2020 | Ogiwara et al. | |
| 2020/0168819 | A1* | 5/2020 | Ahn | C07F 7/0814 |

FOREIGN PATENT DOCUMENTS

| | | | |
|---|---|---|---|
| CN | 107068912 A | | 8/2017 |
| CN | 108727358 A | * | 11/2018 |
| CN | 109836426 A | * | 6/2019 |
| CN | 113169285 A | | 7/2021 |
| JP | WO2015/102118 A1 | | 7/2015 |
| JP | WO2016/152418 A1 | | 9/2016 |

(Continued)

OTHER PUBLICATIONS

Huh et al., machine translation of KR-20120078301-A (2012) pp. 1-51. (Year: 2012).*

(Continued)

*Primary Examiner* — Dylan C Kershner
(74) *Attorney, Agent, or Firm* — Womble Bond Dickinson (US) LLP

(57) ABSTRACT

Provided are an organic light-emitting device and a display apparatus including the same. The organic light-emitting device includes: a first electrode; a second electrode; and an organic layer between the first electrode and the second electrode, wherein the organic layer includes an emission layer, the emission layer includes a first compound, a second compound, and a third compound, the first compound is represented by Formula 1, the second compound is represented by Formula 2, the third compound is represented by Formula 3, and the first compound and the second compound are different from each other.

15 Claims, 2 Drawing Sheets

(56) References Cited

FOREIGN PATENT DOCUMENTS

| | | | | | |
|---|---|---|---|---|---|
| JP | WO2017/138526 | A1 | | 8/2017 | |
| JP | WO2018/047639 | A1 | | 3/2018 | |
| JP | 2018-156720 | A | | 10/2018 | |
| KR | 20120029751 | A | * | 3/2012 | |
| KR | 20120078301 | A | * | 7/2012 | |
| KR | 10-2015-0028579 | A | | 3/2015 | |
| KR | 10-2016-0034528 | A | | 3/2016 | |
| KR | 10-2016-0046076 | A | | 4/2016 | |
| KR | 10-2016-0119683 | A | | 10/2016 | |
| KR | 10-2017-0130435 | A | | 11/2017 | |
| KR | 10-2018-0108604 | A | | 10/2018 | |
| WO | 2016/143624 | A1 | | 9/2016 | |
| WO | 2016/143819 | A1 | | 9/2016 | |
| WO | 2016/152544 | A1 | | 9/2016 | |
| WO | 2017/126443 | A1 | | 7/2017 | |
| WO | WO-2017138526 | A1 | * | 8/2017 | ......... H01L 51/0059 |
| WO | 2017/188111 | A1 | | 11/2017 | |
| WO | 2018/150832 | A1 | | 8/2018 | |
| WO | 2018/181188 | A1 | | 10/2018 | |

OTHER PUBLICATIONS

Shin et al., machine translation of KR-20120029751-A (2012) pp. 1-26. (Year: 2012).*

Cai H et al., machine translation of CN-108727358-A (2018) pp. 1-25. (Year: 2018).*

Duan et al., machine translation of CN-109836426-A (2019) pp. 1-30. (Year: 2019).*

Office action for corresponding CN Patent Application No. 201911016948.5, dated Dec. 29, 2023, 9pp.

* cited by examiner

ORGANIC LIGHT-EMITTING DEVICE AND DISPLAY APPARATUS INCLUDING THE SAME

CROSS-REFERENCE TO RELATED APPLICATION

This application claims priority to and the benefit of Korean Patent Application No. 10-2019-0008342, filed on Jan. 22, 2019, in the Korean Intellectual Property Office, the entire content of which is incorporated herein in by reference.

BACKGROUND

1. Field

One or more embodiments relate to an organic light-emitting device and a display apparatus including the same.

2. Description of the Related Art

Organic light-emitting devices are self-emission devices that have wide viewing angles, high contrast ratios, short response times, as well as excellent characteristics in terms of brightness, driving voltage, and response speed, and produce full-color images.

An example of such organic light-emitting devices may include a first electrode on a substrate, and a hole transport region, an emission layer, an electron transport region, and a second electrode, which are sequentially on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transit (e.g., transition or relax) from an excited state to a ground state, thereby generating light.

SUMMARY

One or more embodiments include an organic light-emitting device and a display apparatus including the same.

Additional aspects of embodiments will be set forth in part in the description which follows and, in part, will be apparent from the description, or may be learned by practice of the presented embodiments.

An aspect of an embodiment of the present disclosure provides an organic light-emitting device including: a first electrode; a second electrode; and an organic layer between the first electrode and the second electrode, wherein the organic layer includes an emission layer, the emission layer includes a first compound, a second compound, and a third compound, the first compound is represented by Formula 1, the second compound is represented by Formula 2, the third compound is represented by Formula 3, and the first compound and the second compound are different from each other:

Formula 1

$$(Y_{11})_{c11}—(L_{11})_{c11}—(Y_{12})_{c12}$$

Formula 2

$$(Y_{21})_{c21}—(L_{21})_{c21}—(Y_{22})_{c22}$$

Formula 3

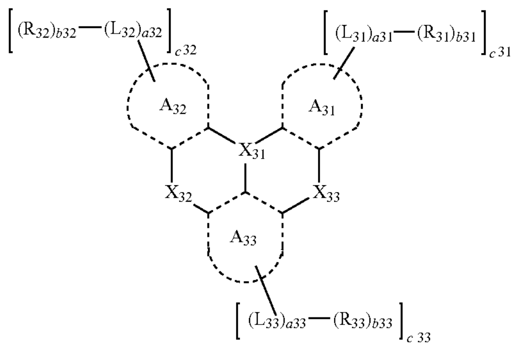

Formula 1A

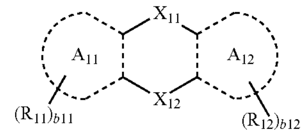

Formula 2A

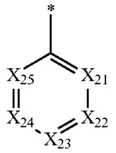

Formula 2B

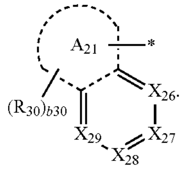

In Formulae 1 to 3, 1A, 2A, and 2B, $L_{11}$ may be selected from:

a π electron-depleted nitrogen-free cyclic group: and a π electron-depleted nitrogen-free cyclic group substituted with at least one selected from deuterium, a $C_1$-$C_{60}$ alkyl group, a π electron-depleted nitrogen-free cyclic group, and —$Si(Q_{31})(Q_{32})(Q_{33})$, a11 may be selected from 0, 1, 2, and 3, $Y_{11}$ may be a group represented by Formula 1A, $Y_{12}$ may be selected from:

a $C_1$-$C_{60}$ alkyl group, a π electron-depleted nitrogen-free cyclic group, and —$Si(Q_1)(Q_2)(Q_3)$;

a π electron-depleted nitrogen-free cyclic group substituted with at least one selected from deuterium, a $C_1$-$C_{60}$ alkyl group, a π electron-depleted nitrogen-free cyclic group, and —$Si(Q_{31})(Q_{32})(Q_{33})$; and a π electron-depleted nitrogen-free cyclic group substituted with a π electron-depleted nitrogen-free cyclic group that is substituted with at least one selected from deuterium, a $C_1$-$C_{60}$ alkyl group, a π electron-depleted nitrogen-free cyclic group, and —$Si(Q_{21})(Q_{22})(Q_{23})$, c11 and c12 may each independently be selected from 1, 2, and 3, $X_{11}$ may be selected from a single bond, $C(R_{13})(R_{14})$, $N(R_{13})$, O, and S, $X_{12}$ may be selected from a single bond, $C(R_{15})(R_{16})$, $N(R_{15})$, O, and S, $X_{11}$ and $X_{12}$ may not be a single bond simultaneously (e.g., $X_{11}$ and $X_{12}$ may not both be a single bond), $A_{11}$ and $A_{12}$ may each independently be a π electron-depleted nitrogen-free cyclic group, $R_{11}$ to $R_{16}$ may each independently be selected from:

a binding site, hydrogen, deuterium, a $C_1$-$C_{60}$ alkyl group, a π electron-depleted nitrogen-free cyclic group, and —Si($Q_1$)($Q_2$)($Q_3$);

a π electron-depleted nitrogen-free cyclic group substituted with at least one selected from deuterium, a $C_1$-$C_{60}$ alkyl group, a π electron-depleted nitrogen-free cyclic group, and —Si($Q_{31}$)($Q_{32}$)($Q_{33}$); and a π electron-depleted nitrogen-free cyclic group substituted with a π electron-depleted nitrogen-free cyclic group that is substituted with at least one selected from deuterium, a $C_1$-$C_{60}$ alkyl group, a π electron-depleted nitrogen-free cyclic group, and —Si($Q_{21}$)($Q_{22}$)($Q_{23}$), wherein one selected from $R_{11}$ to $R_{13}$ and $R_{15}$ may be a binding site, b11 and b12 may each independently be selected from 1, 2, 3, 4, 5, and 6, $L_{21}$ may be selected from:

a π electron-depleted nitrogen-containing cyclic group and a π electron-depleted nitrogen-free cyclic group; and a π electron-depleted nitrogen-containing cyclic group and a π electron-depleted nitrogen-free cyclic group, each substituted with at least one selected from deuterium, —F, a cyano group, a $C_1$-$C_{60}$ alkyl group, a π electron-depleted nitrogen-containing cyclic group, a π electron-depleted nitrogen-free cyclic group, and —Si($Q_{31}$)($Q_{32}$)($Q_{33}$), a21 may be selected from 0, 1, 2, and 3, $Y_{21}$ may be a group represented by Formula 2A or 2B, $Y_{22}$ may be selected from:

—F, a cyano group, a $C_1$-$C_{60}$ alkyl group, a π electron-depleted nitrogen-containing cyclic group, a π electron-depleted nitrogen-free cyclic group, and —Si($Q_1$)($Q_2$)($Q_3$);

a $C_1$-$C_{60}$ alkyl group, a π electron-depleted nitrogen-containing cyclic group, and a π electron-depleted nitrogen-free cyclic group, each substituted with at least one selected from deuterium, —F, a cyano group, a $C_1$-$C_{60}$ alkyl group, a π electron-depleted nitrogen-containing cyclic group, a π electron-depleted nitrogen-free cyclic group, and —Si($Q_{31}$)($Q_{32}$)($Q_{33}$); and a π electron-depleted nitrogen-containing cyclic group and a π electron-depleted nitrogen-free cyclic group, each substituted with at least one selected from a π electron-depleted nitrogen-containing cyclic group and a π electron-depleted nitrogen-free cyclic group that are each substituted with at least one selected from deuterium, a $C_1$-$C_{60}$ alkyl group, a π electron-depleted nitrogen-containing cyclic group, a π electron-depleted nitrogen-free cyclic group, and —Si($Q_{21}$)($Q_{22}$)($Q_{23}$), c21 and c22 may each independently be selected from 1, 2, 3, 4, 5, and 6, $A_{21}$ may be selected from a $C_5$-$C_{60}$ carbocyclic group and a $C_1$-$C_{60}$ heterocyclic group, $X_{21}$ may be selected from C($R_{21}$) and N, $X_{22}$ may be selected from C($R_{22}$) and N, $X_{23}$ may be selected from C($R_{23}$) and N, $X_{24}$ may be selected from C($R_{24}$) and N, $X_{25}$ may be selected from C($R_{25}$) and N, $X_{26}$ may be selected from C($R_{26}$) and N, $X_{27}$ may be selected from C($R_{27}$) and N, $X_{28}$ may be selected from C($R_{28}$) and N, $X_{29}$ may be selected from C($R_{29}$) and N, wherein at least one selected from $X_{21}$ to $X_{25}$ may be N, and at least one selected from $X_{26}$ to $X_{29}$ may be N, $R_{21}$ to $R_{30}$ may each independently be selected from:

hydrogen, deuterium, —F, a cyano group, a $C_1$-$C_{60}$ alkyl group, a π electron-depleted nitrogen-containing cyclic group, a π electron-depleted nitrogen-free cyclic group, and —Si($Q_1$)($Q_2$)($Q_3$);

a $C_1$-$C_{60}$ alkyl group, a π electron-depleted nitrogen-containing cyclic group, and a π electron-depleted nitrogen-free cyclic group, each substituted with at least one selected from deuterium, —F, a cyano group, a $C_1$-$C_{60}$ alkyl group, a π electron-depleted nitrogen-containing cyclic group, a π electron-depleted nitrogen-free cyclic group, and —Si($Q_{31}$)($Q_{32}$)($Q_{33}$); and a π electron-depleted nitrogen-containing cyclic group and a π electron-depleted nitrogen-free cyclic group, each substituted with at least one selected from a π electron-depleted nitrogen-containing cyclic group and a π electron-depleted nitrogen-free cyclic group that are each substituted with at least one selected from deuterium, a $C_1$-$C_{60}$ alkyl group, a π electron-depleted nitrogen-containing cyclic group, a π electron-depleted nitrogen-free cyclic group, and —Si($Q_{21}$)($Q_{22}$)($Q_{23}$), wherein $R_{21}$ to $R_{25}$ may optionally be linked to form a substituted or unsubstituted $C_5$-$C_{60}$ carbocyclic group or a substituted or unsubstituted $C_1$-$C_{60}$ heterocyclic group, and $R_{26}$ to $R_{30}$ may optionally be linked to form a substituted or unsubstituted $C_5$-$C_{60}$ carbocyclic group or a substituted or unsubstituted $C_1$-$C_{60}$ heterocyclic group, b30 may be selected from 1, 2, 3, 4, 5, 6, 7, 8, 9, and 10, $X_{31}$ may be selected from B and N, and $X_{32}$ and $X_{33}$ may each independently be selected from B($R_{34}$), N($R_{34}$), O, S, C($R_{34}$)($R_{35}$), and Si($R_{34}$)($R_{35}$), wherein, when $X_{31}$ is B, $X_{32}$ and $X_{33}$ may each independently be selected from N($R_{34}$), O, S, C($R_{34}$)($R_{35}$), and Si($R_{34}$)($R_{35}$), and when $X_{31}$ is N, $X_{32}$ and $X_{33}$ may each independently be selected from B($R_{34}$), O, S, C($R_{34}$)($R_{35}$), and Si($R_{34}$)($R_{35}$), $A_{31}$ to $A_{33}$ may each independently be selected from a $C_5$-$C_{60}$ carbocyclic group and a $C_1$-$C_{60}$ heterocyclic group, $L_{31}$ to $L_{33}$ may each independently be selected from a substituted or unsubstituted $C_5$-$C_{60}$ carbocyclic group and a substituted or unsubstituted $C_1$-$C_{60}$ heterocyclic group, a31 to a33 may each independently be selected from 0, 1, 2, and 3, $R_{31}$ to $R_{35}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_1)(Q_2)(Q_3)$, $—B(Q_1)(Q_2)$, $—N(Q_1)(Q_2)$, $—P(Q_1)(Q_2)$, $—C(=O)(Q_1)$, $—S(=O)(Q_1)$, $—S(=O)_2(Q_1)$, $—P(=O)(Q_1)(Q_2)$, and $—P(=S)(Q_1)(Q_2)$, and $R_{31}$ to $R_{33}$ may optionally be linked to form a substituted or unsubstituted $C_5$-$C_{60}$ carbocyclic group or a substituted or unsubstituted $C_1$-$C_{60}$ heterocyclic group, c31 to c33 may each independently be selected from 1, 2, 3, 4, 5, and 6, $Q_1$ to $Q_3$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a biphenyl group, and a terphenyl group, and indicates a binding site to a neighboring atom.

Another aspect of an embodiment of the present disclosure provides a display apparatus including: a thin-film transistor including a source electrode, a drain electrode, and an active layer; and the organic light-emitting device described above, wherein the first electrode of the organic light-emitting device is electrically coupled to one selected from the source electrode and the drain electrode of the thin-film transistor.

BRIEF DESCRIPTION OF THE DRAWINGS

These and/or other aspects of embodiments will become apparent and more readily appreciated from the following description of the embodiments, taken in conjunction with the accompanying drawings in which.

DETAILED DESCRIPTION

Figure 1:
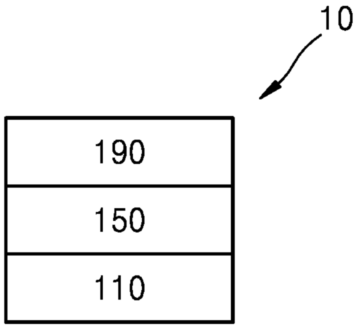
FIG. 1 is a schematic cross-sectional view of an organic light-emitting device according to an embodiment.

The subject matter of the present disclosure will now be described more fully with reference to exemplary embodiments. The subject matter of the present disclosure may, however, be embodied in many different forms and should not be construed as being limited to the embodiments set forth herein; rather, these embodiments are provided so that this disclosure will be thorough and complete, and will fully convey the concept of the disclosure to those skilled in the art. Features of embodiments of the disclosure, and how to achieve them, will become apparent by reference to the embodiments that will be described herein below in more detail, together with the accompanying drawings. The subject matter of this disclosure may, however, be embodied in many different forms and should not be limited to the exemplary embodiments.

Hereinafter, embodiments are described in more detail by referring to the attached drawings, and in the drawings, like reference numerals denote like elements, and a redundant explanation thereof may not be repeated herein.

As used herein, the singular forms "a," "an" and "the" are intended to include the plural forms as well, unless the context clearly indicates otherwise.

It will be further understood that the terms "comprises" and/or "comprising," as used herein, specify the presence of stated features or components, but do not preclude the presence or addition of one or more other features or components.

It will be understood that when a layer, region, or component is referred to as being "on" or "onto" another layer, region, or component, it may be directly or indirectly formed on the other layer, region, or component. For example, intervening layers, regions, or components may be present. In addition, it will also be understood that when an element or layer is referred to as being "between" two elements or layers, it can be the only element or layer between the two elements or layers, or one or more intervening elements or layers may also be present.

Sizes of components in the drawings may be exaggerated for convenience of explanation. In other words, because sizes and thicknesses of components in the drawings may be arbitrarily illustrated for convenience of explanation, the following embodiments of the present disclosure are not limited thereto.

The term "organic layer," as used herein, refers to a single layer and/or a plurality of layers between the first electrode and the second electrode of the organic light-emitting device. A material included in the "organic layer" is not limited to an organic material. For example, the "organic layer" may include an inorganic material.

An organic light-emitting device according to an embodiment may include: a first electrode; a second electrode; and an organic layer between the first electrode and the second electrode, wherein the organic layer may include an emission layer, the emission layer may include a first compound, a second compound, and a third compound, the first compound may be represented by Formula 1, the second compound may be represented by Formula 2, the third compound may be represented by Formula 3, and the first compound and the second compound may be different from each other:

Formula 1

$$(Y_{11})_{c11}—(L_{11})_{c11}—(Y_{12})_{c12}$$

Formula 2

$$(Y_{21})_{c21}—(L_{21})_{c21}—(Y_{22})_{c22}$$

Formula 3

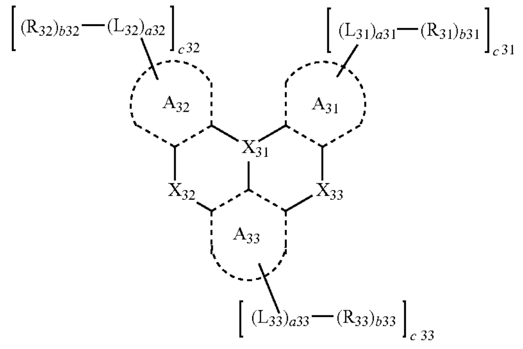

-continued

Formula 1A

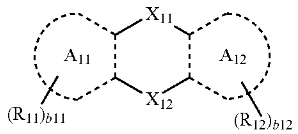

Formula 2A

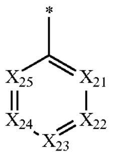

Formula 2B

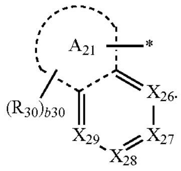

In Formulae 1 to 3, 1A, 2A, and 2B, $L_{11}$ may be selected from:

a π electron-depleted nitrogen-free cyclic group; and a π electron-depleted nitrogen-free cyclic group substituted with at least one selected from deuterium, a $C_1$-$C_{60}$ alkyl group, a π electron-depleted nitrogen-free cyclic group, and —$Si(Q_{31})(Q_{32})(Q_{33})$, a11 may be selected from 0, 1, 2, and 3, $Y_{11}$ may be a group represented by Formula 1A, $Y_{12}$ may be selected from:

a $C_1$-$C_{60}$ alkyl group, a π electron-depleted nitrogen-free cyclic group, and —$Si(Q_1)(Q_2)(Q_3)$;

a π electron-depleted nitrogen-free cyclic group substituted with at least one selected from deuterium, a $C_1$-$C_{60}$ alkyl group, a π electron-depleted nitrogen-free cyclic group, and —$Si(Q_{31})(Q_{32})(Q_{33})$; and a π electron-depleted nitrogen-free cyclic group substituted with a π electron-depleted nitrogen-free cyclic group that is substituted with at least one selected from deuterium, a $C_1$-$C_{60}$ alkyl group, a π electron-depleted nitrogen-free cyclic group, and —$Si(Q_{21})(Q_{22})(Q_{23})$, c11 and c12 may each independently be selected from 1, 2, and 3, $X_{11}$ may be selected from a single bond, $C(R_{13})(R_{14})$, $N(R_{13})$, O, and S, $X_{12}$ may be selected from a single bond, $C(R_{15})(R_{16})$, $N(R_{15})$, O, and S, $X_{11}$ and $X_{12}$ may not be a single bond simultaneously (e.g., $X_{11}$ and $X_{12}$ may not both be a single bond), $A_{11}$ and $A_{12}$ may each independently be a π electron-depleted nitrogen-free cyclic group, $R_{11}$ to $R_{16}$ may each independently be selected from:

a binding site, hydrogen, deuterium, a $C_1$-$C_{60}$ alkyl group, a π electron-depleted nitrogen-free cyclic group, and —$Si(Q_1)(Q_2)(Q_3)$;

a π electron-depleted nitrogen-free cyclic group substituted with at least one selected from deuterium, a $C_1$-$C_{60}$ alkyl group, a π electron-depleted nitrogen-free cyclic group, and —$Si(Q_{31})(Q_{32})(Q_{33})$; and a π electron-depleted nitrogen-free cyclic group substituted with a π electron-depleted nitrogen-free cyclic group that is substituted with at least one selected from deuterium, a $C_1$-$C_{60}$ alkyl group, a π electron-depleted nitrogen-free cyclic group, and —$Si(Q_{21})(Q_{22})(Q_{23})$, wherein one selected from $R_{11}$ to $R_{13}$ and $R_{15}$ may be a binding site, b11 and b12 may each independently be selected from 1, 2, 3, 4, 5, and 6, $L_{21}$ may be selected from:

a π electron-depleted nitrogen-containing cyclic group and a π electron-depleted nitrogen-free cyclic group; and a π electron-depleted nitrogen-containing cyclic group and a π electron-depleted nitrogen-free cyclic group, each substituted with at least one selected from deuterium, —F, a cyano group, a $C_1$-$C_{60}$ alkyl group, a π electron-depleted nitrogen-containing cyclic group, a π electron-depleted nitrogen-free cyclic group, and —$Si(Q_{31})(Q_{32})(Q_{33})$, a21 may be selected from 0, 1, 2, and 3, $Y_{21}$ may be a group represented by Formula 2A or 2B, $Y_{22}$ may be selected from:

—F, a cyano group, a $C_1$-$C_{60}$ alkyl group, a π electron-depleted nitrogen-containing cyclic group, a π electron-depleted nitrogen-free cyclic group, and —$Si(Q_1)(Q_2)(Q_3)$;

a $C_1$-$C_{60}$ alkyl group, a π electron-depleted nitrogen-containing cyclic group, and a π electron-depleted nitrogen-free cyclic group, each substituted with at least one selected from deuterium, —F, a cyano group, a $C_1$-$C_{60}$ alkyl group, a π electron-depleted nitrogen-containing cyclic group, a π electron-depleted nitrogen-free cyclic group, and —$Si(Q_{31})(Q_{32})(Q_{33})$; and a π electron-depleted nitrogen-containing cyclic group and a π electron-depleted nitrogen-free cyclic group, each substituted with at least one selected from a π electron-depleted nitrogen-containing cyclic group and a π electron-depleted nitrogen-free cyclic group that are each substituted with at least one selected from deuterium, a $C_1$-$C_{60}$ alkyl group, a π electron-depleted nitrogen-containing cyclic group, a π electron-depleted nitrogen-free cyclic group, and —$Si(Q_{21})(Q_{22})(Q_{23})$, c21 and c22 may each independently be selected from 1, 2, 3, 4, 5, and 6, $A_{21}$ may be selected from a $C_5$-$C_{60}$ carbocyclic group and a $C_1$-$C_{60}$ heterocyclic group, $X_{21}$ may be selected from $C(R_{21})$ and N, $X_{22}$ may be selected from $C(R_{22})$ and N, $X_{23}$ may be selected from $C(R_{23})$ and N, $X_{24}$ may be selected from $C(R_{24})$ and N, $X_{25}$ may be selected from $C(R_{25})$ and N, $X_{26}$ may be selected from $C(R_{26})$ and N, $X_{27}$ may be selected from $C(R_{27})$ and N, $X_{28}$ may be selected from $C(R_{28})$ and N, and $X_{29}$ may be selected from $C(R_{29})$ and N, wherein at least one selected from $X_{21}$ to $X_{25}$ may be N, and at least one selected from $X_{26}$ to $X_{29}$ may be N, $R_{21}$ to $R_{30}$ may each independently be selected from:

hydrogen, deuterium, —F, a cyano group, a $C_1$-$C_{60}$ alkyl group, a π electron-depleted nitrogen-containing cyclic group, a π electron-depleted nitrogen-free cyclic group, and —$Si(Q_1)(Q_2)(Q_3)$;

a $C_1$-$C_{60}$ alkyl group, a π electron-depleted nitrogen-containing cyclic group, and a π electron-depleted nitrogen-free cyclic group, each substituted with at least one selected from deuterium, —F, a cyano group, a $C_1$-$C_{60}$ alkyl group, a π electron-depleted nitrogen-containing cyclic group, a π electron-depleted nitrogen-free cyclic group, and —$Si(Q_{31})(Q_{32})(Q_{33})$; and a π electron-depleted nitrogen-containing cyclic group and a π electron-depleted nitrogen-free cyclic group, each substituted with at least one selected from a π electron-depleted nitrogen-containing cyclic group and a π electron-depleted nitrogen-free cyclic group that are each substituted with at least one selected from deuterium, a $C_1$-$C_{60}$ alkyl group, a π electron-depleted nitrogen-containing cyclic group, a π electron-depleted nitrogen-free cyclic group, and —$Si(Q_{21})(Q_{22})(Q_{23})$, wherein $R_{21}$ to $R_{25}$ may optionally be linked to form a substituted or unsubstituted $C_5$-$C_{60}$ carbocyclic group or a substituted or unsubstituted $C_1$-$C_{60}$ heterocyclic group, and $R_{26}$ to $R_{30}$ may optionally be linked to form a substituted or unsubstituted $C_5$-$C_{60}$ carbocyclic group or a substituted or unsubstituted $C_1$-$C_{60}$ heterocyclic group, b30 may be selected from 1, 2, 3, 4, 5, 6, 7, 8, 9, and 10, $X_{31}$ may be selected from B and N, and $X_{32}$ and $X_{33}$ may each independently be selected from $B(R_{34})$, $N(R_{34})$, O, S, $C(R_{34})(R_{35})$, and $Si(R_{34})(R_{35})$, wherein, when $X_{31}$ is B, $X_{32}$ and $X_{33}$ are each independently selected from $N(R_{34})$, O, S, $C(R_{34})(R_{35})$, and $Si(R_{34})(R_{35})$, and when $X_{31}$ is N, $X_{32}$ and $X_{33}$ are each independently selected from $B(R_{34})$, O, S, $C(R_{34})(R_{35})$, and $Si(R_{34})(R_{35})$, $A_{31}$ to $A_{33}$ may each independently be selected from a $C_5$-$C_{60}$ carbocyclic group and a $C_1$-$C_{60}$ heterocyclic group, $L_{31}$ to $L_{33}$ may each independently be selected from a substituted or unsubstituted $C_5$-$C_{60}$ carbocyclic group, and a substituted or unsubstituted $C_1$-$C_{60}$ heterocyclic group, a31 to a33 may each independently be selected from 0, 1, 2, and 3, $R_{31}$ to $R_{35}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, and —$P(=S)(Q_1)(Q_2)$, $R_{31}$ to $R_{33}$ may optionally be linked to form a substituted or unsubstituted $C_5$-$C_{60}$ carbocyclic group or a substituted or unsubstituted $C_1$-$C_{60}$ heterocyclic group, c31 to c33 may each independently be selected from 1, 2, 3, 4, 5, and 6, $Q_1$ to $Q_3$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a biphenyl group, and a terphenyl group, and indicates a binding site to a neighboring atom.

For example, $L_{11}$ in Formula 1 may be selected from a benzene group, a naphthalene group, a phenalene group, an anthracene group, a fluoranthene group, a triphenylene group, a phenanthrene group, a pyrene group, a chrysene group, a perylene group, a fluorene group, a carbazole group, a dibenzofuran group, and a dibenzothiophene group; and a benzene group, a naphthalene group, a phenalene group, an anthracene group, a fluoranthene group, a triphenylene group, a phenanthrene group, a pyrene group, a chrysene group, a perylene group, a fluorene group, a carbazole group, a dibenzofuran group, and a dibenzothiophene group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, but embodiments of the present disclosure are not limited thereto.

For example, $L_{21}$ and $L_{31}$ to $L_{33}$ in Formulae 2 and 3 may each independently be selected from:

a benzene group, a naphthalene group, a phenalene group, an anthracene group, a fluoranthene group, a triphenylene group, a phenanthrene group, a pyrene group, a chrysene group, a perylene group, a pyridine group, a pyrimidine group, a pyrazine group, a pyridazine group, a triazine group, a quinoline group, an isoquinoline group, a benzoquinoline group, a benzoisoquinoline group, a phthalazine group, a naphthyridine group, a quinoxaline group, a benzoquinoxaline group, a quinazoline group, a benzoquinazoline group, a fluorene group, a carbazole group, a dibenzofuran group, and a dibenzothiophene group; and a benzene group, a naphthalene group, a phenalene group, an anthracene group, a fluoranthene group, a triphenylene group, a phenanthrene group, a pyrene group, a chrysene group, a perylene group, a pyridine group, a pyrimidine group, a pyrazine group, a pyridazine group, a triazine group, a quinoline group, an isoquinoline group, a benzoquinoline group, a benzoisoquinoline group, a phthalazine group, a naphthyridine group, a quinoxaline group, a benzoquinoxaline group, a quinazoline group, a benzoquinazoline group, a fluorene group, a carbazole group, a dibenzofuran group, and a dibenzothiophene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group, but embodiments of the present disclosure are not limited thereto.

For example, in Formulae 1 to 3, a11, a21, and a31 to a33 may each independently be selected from 0 and 1, but embodiments of the present disclosure are not limited thereto.

For example, in Formula 1A, $X_{11}$ may be selected from $N(R_{13})$, O, and S, and $X_{12}$ may be a single bond, but embodiments of the present disclosure are not limited thereto.

For example, in Formula 1A, $A_{11}$ and $A_{12}$ may each independently be selected from a benzene group, a naphthalene group, a fluorene group, a carbazole group, a dibenzofuran group, a dibenzothiophene group, an indolofluorene group, an indolocarbazole group, an indolodibenzofuran group, an indolodibenzothiophene group, an indenofluorene group, an indenocarbazole group, an indenodibenzofuran group, an indenodibenzothiophene group, a benzofuranofluorene group, a benzofuranocarbazole group, a benzofuranodibenzofuran group, a benzofuranodibenzothiophene group, a benzothienofluorene group, a benzothienocarbazole group, a benzothienodibenzofuran group, and a benzothienodibenzothiophene group, but embodiments of the present disclosure are not limited thereto.

In one embodiment, in Formula 1A, $A_{11}$ and $A_{12}$ may each independently be selected from a benzene group, a naphthalene group, a fluorene group, a carbazole group, a dibenzofuran group, and a dibenzothiophene group, but embodiments of the present disclosure are not limited thereto.

For example, in Formula 1A, $R_{11}$ to $R_{16}$ may each independently be selected from:

a binding site, hydrogen, deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, and —$Si(Q_1)(Q_2)(Q_3)$; and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, and —$Si(Q_{31})(Q_{32})(Q_{33})$; and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group that are each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, and —$Si(Q_{21})(Q_{22})(Q_{23})$, one selected from $R_{11}$ to $R_{13}$ and $R_{15}$ may be a binding site, and $Q_1$ to $Q_3$, $Q_{21}$ to $Q_{23}$, and $Q_{31}$ to $Q_{33}$ may each independently be selected from a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, but embodiments of the present disclosure are not limited thereto.

In one embodiment, in Formula 1A, $R_{11}$ to $R_{16}$ may each independently be selected from:

a binding site, hydrogen, deuterium, a methyl group, an ethyl group, an n-propyl group, an isopropyl group, an n-butyl group, an isobutyl group, a sec-butyl group, a tert-butyl group, a phenyl group, a biphenyl group, a terphenyl group, a naphthyl group, a phenanthrenyl group, a fluorenyl group, a carbazolyl group, a dibenzofuranyl group, a dibenzothiophenyl group, and —$Si(Q_1)(Q_2)(Q_3)$; and a phenyl group, a biphenyl group, a terphenyl group, a naphthyl group, a phenanthrenyl group, a fluorenyl group, a carbazolyl group, a dibenzofuranyl group, and a dibenzothiophenyl group, each substituted with at least one selected from deuterium, a methyl group, an ethyl group, an n-propyl group, an isopropyl group, an n-butyl group, an isobutyl group, a sec-butyl group, a tert-butyl group, a phenyl group, a biphenyl group, a terphenyl group, a naphthyl group, a phenanthrenyl group, a fluorenyl group, a carbazolyl group, a dibenzofuranyl group, a dibenzothiophenyl group, and —Si($Q_{31}$)($Q_{32}$)($Q_{33}$); and a phenyl group, a biphenyl group, a terphenyl group, a naphthyl group, a phenanthrenyl group, a fluorenyl group, a carbazolyl group, a dibenzofuranyl group, and a dibenzothiophenyl group, each substituted with at least one selected from a phenyl group, a biphenyl group, a terphenyl group, a naphthyl group, a phenanthrenyl group, a fluorenyl group, a carbazolyl group, a dibenzofuranyl group, and a dibenzothiophenyl group that are each substituted with at least one selected from deuterium, a methyl group, an ethyl group, an n-propyl group, an isopropyl group, an n-butyl group, an isobutyl group, a sec-butyl group, a tert-butyl group, a phenyl group, a biphenyl group, a terphenyl group, a naphthyl group, a phenanthrenyl group, a fluorenyl group, a carbazolyl group, a dibenzofuranyl group, a dibenzothiophenyl group, and —Si($Q_{21}$)($Q_{22}$)($Q_{23}$), one selected from $R_{11}$ to $R_{13}$ and $R_{15}$ may be a binding site, $Q_1$ to $Q_3$, $Q_{21}$ to $Q_{23}$, and $Q_{31}$ to $Q_{33}$ may each independently be selected from a $C_1$-$C_{20}$ alkyl group, a phenyl group, a biphenyl group, a terphenyl group, a naphthyl group, a phenanthrenyl group, a fluorenyl group, a carbazolyl group, a dibenzofuranyl group, and a dibenzothiophenyl group, but embodiments of the present disclosure are not limited thereto.

For example, in Formula 1, $Y_{12}$ may be selected from:

a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, a benzothienodibenzothiophenyl group, and —Si($Q_1$)($Q_2$)($Q_3$); and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, and a benzothienodibenzothiophenyl group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, a benzothienodibenzothiophenyl group, and —Si($Q_{31}$)($Q_{32}$)($Q_{33}$); and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, and a benzothienodibenzothiophenyl group, each substituted with at least one selected from a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, and a benzothienodibenzothiophenyl group that are each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, a benzothienodibenzothiophenyl group, and —Si($Q_{21}$)($Q_{22}$)($Q_{23}$), and $Q_1$ to $Q_3$, $Q_{21}$ to $Q_{23}$, and $Q_{31}$ to $Q_{33}$ may each independently be selected from a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, but embodiments of the present disclosure are not limited thereto.

In one embodiment, in Formula 1, $Y_{12}$ may be selected from:

a methyl group, an ethyl group, an n-propyl group, an isopropyl group, an n-butyl group, an isobutyl group, a sec-butyl group, a tert-butyl group, a phenyl group, a biphenyl group, a terphenyl group, a naphthyl group, a phenanthrenyl group, a fluorenyl group, a carbazolyl group, a dibenzofuranyl group, a dibenzothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, a benzothienodibenzothiophenyl group, and —Si($Q_1$)($Q_2$)($Q_3$); and a phenyl group, a biphenyl group, a terphenyl group, a naphthyl group, a phenanthrenyl group, a fluorenyl group, a carbazolyl group, a dibenzofuranyl group, a dibenzothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, and a benzothienodibenzothiophenyl group, each substituted with at least one selected from deuterium, a methyl group, an ethyl group, an n-propyl group, an isopropyl group, an n-butyl group, an isobutyl group, a sec-butyl group, a tert-butyl group, a phenyl group, a biphenyl group, a terphenyl group, a naphthyl group, a phenanthrenyl group, a fluorenyl group, a carbazolyl group, a dibenzofuranyl group, a dibenzothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, a benzothienodibenzothiophenyl group, and —Si($Q_{31}$)($Q_{32}$)($Q_{33}$); and a phenyl group, a biphenyl group, a terphenyl group, a naphthyl group, a phenanthrenyl group, a fluorenyl group, a carbazolyl group, a dibenzofuranyl group, a dibenzothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, and a benzothienodibenzothiophenyl group, each substituted with at least one selected from a phenyl group, a biphenyl group, a terphenyl group, a naphthyl group, a phenanthrenyl group, a fluorenyl group, a carbazolyl group, a dibenzofuranyl group, a dibenzothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, and a benzothienodibenzothiophenyl group that are each substituted with at least one selected from deuterium, a methyl group, an ethyl group, an n-propyl group, an isopropyl group, an n-butyl group, an isobutyl group, a sec-butyl group, a tert-butyl group, a phenyl group, a biphenyl group, a terphenyl group, a naphthyl group, a phenanthrenyl group, a fluorenyl group, a carbazolyl group, a dibenzofuranyl group, a dibenzothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, a benzothienodibenzothiophenyl group, and —Si($Q_{21}$)($Q_{22}$)($Q_{23}$), and $Q_1$ to $Q_3$, $Q_{21}$ to $Q_{23}$, and $Q_{31}$ to $Q_{33}$ may each independently be selected from a $C_1$-$C_{20}$ alkyl group, a phenyl group, a biphenyl group, a terphenyl group, a naphthyl group, a phenanthrenyl group, a fluorenyl group, a carbazolyl group, a dibenzofuranyl group, and a dibenzothiophenyl group, but embodiments of the present disclosure are not limited thereto.

For example, in Formula 1, c11 and c12 may be 1, but embodiments of the present disclosure are not limited thereto.

For example, in Formula 2, $Y_{22}$ may be selected from:

—F, a cyano group, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a spiro-bifluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, a benzothienodibenzothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, a diazadibenzothiophenyl group, and —Si($Q_1$)($Q_2$)($Q_3$);

a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a spiro-bifluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, a benzothienodibenzothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group, each substituted with at least one selected from deuterium, —F, a cyano group, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a spiro-bifluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, a benzothienodibenzothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, a diazadibenzothiophenyl group, and —Si($Q_{31}$)($Q_{32}$)($Q_{33}$); and a phenyl group, a biphenyl group, a terphenyl group, a naphthyl group, a phenanthrenyl group, a triphenylenyl group, a chrysenyl group, a fluoranthenyl group, a fluorenyl group, a spiro-bifluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, a benzothienodibenzothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group, each substituted with at least one selected from deuterium a phenyl group, a biphenyl group, a terphenyl group, a naphthyl group, a phenanthrenyl group, a triphenylenyl group, a chrysenyl group, a fluoranthenyl group, a fluorenyl group, a spiro-bifluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, a benzothienodibenzothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group that are each substituted with at least one selected from, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a spiro-bifluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, a benzothienodibenzothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, a diazadibenzothiophenyl group, and —$Si(Q_{21})(Q_{22})(Q_{23})$, and $Q_1$ to $Q_3$, $Q_{21}$ to $Q_{23}$, and $Q_{31}$ to $Q_{33}$ may each independently be selected from a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group, but embodiments of the present disclosure are not limited thereto.

In one embodiment, in Formula 2, $Y_{22}$ may be selected from:

—F, a cyano group, a methyl group, an ethyl group, an n-propyl group, an isopropyl group, an n-butyl group, an isobutyl group, a sec-butyl group, a tert-butyl group, a phenyl group, a biphenyl group, a terphenyl group, a naphthyl group, a phenanthrenyl group, a triphenylenyl group, a chrysenyl group, a fluoranthenyl group, a fluorenyl group, a spiro-bifluorenyl group, a carbazolyl group, a dibenzofuranyl group, a dibenzothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, a benzothienodibenzothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, and —$Si(Q_1)(Q_2)(Q_3)$;

a methyl group, an ethyl group, an n-propyl group, an isopropyl group, an n-butyl group, an isobutyl group, a sec-butyl group, a tert-butyl group, a phenyl group, a biphenyl group, a terphenyl group, a naphthyl group, a phenanthrenyl group, a triphenylenyl group, a chrysenyl group, a fluoranthenyl group, a fluorenyl group, a spiro-bifluorenyl group, a carbazolyl group, a dibenzofuranyl group, a dibenzothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, a benzothienodibenzothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, and a quinazolinyl group, each substituted with at least one selected from deuterium, —F, a cyano group, a methyl group, an ethyl group, an n-propyl group, an isopropyl group, an n-butyl group, an isobutyl group, a sec-butyl group, a tert-butyl group, a phenyl group, a biphenyl group, a terphenyl group, a naphthyl group, a phenanthrenyl group, a triphenylenyl group, a chrysenyl group, a fluoranthenyl group, a fluorenyl group, a spiro-bifluorenyl group, a carbazolyl group, a dibenzofuranyl group, a dibenzothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, a benzothienodibenzothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, and —$Si(Q_{31})(Q_{32})(Q_{33})$; and a phenyl group, a biphenyl group, a terphenyl group, a naphthyl group, a phenanthrenyl group, a triphenylenyl group, a chrysenyl group, a fluoranthenyl group, a fluorenyl group, a spiro-bifluorenyl group, a carbazolyl group, a dibenzofuranyl group, a dibenzothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, a benzothienodibenzothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, and a quinazolinyl group, each substituted with at least one selected from a phenyl group, a biphenyl group, a terphenyl group, a naphthyl group, a phenanthrenyl group, a triphenylenyl group, a chrysenyl group, a fluoranthenyl group, a fluorenyl group, a spiro-bifluorenyl group, a carbazolyl group, a dibenzofuranyl group, a dibenzothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, a benzothienodibenzothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, and a quinazolinyl group that are each substituted with at least one selected from deuterium, a methyl group, an ethyl group, an n-propyl group, an isopropyl group, an n-butyl group, an isobutyl group, a sec-butyl group, a tert-butyl group, a phenyl group, a biphenyl group, a terphenyl group, a naphthyl group, a phenanthrenyl group, a triphenylenyl group, a chrysenyl group, a fluoranthenyl group, a fluorenyl group, a spiro-bifluorenyl group, a carbazolyl group, a dibenzofuranyl group, a dibenzothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, and —$Si(Q_{21})(Q_{22})(Q_{23})$, and $Q_1$ to $Q_3$, $Q_{21}$ to $Q_{23}$, and $Q_{31}$ to $Q_{33}$ may each independently be selected from a methyl group, an ethyl group, an n-propyl group, an isopropyl group, an n-butyl group, an isobutyl group, a sec-butyl group, a tert-butyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, and a quinazolinyl group, but embodiments of the present disclosure are not limited thereto.

For example, in Formula 2, c21 and c22 may each independently be 1 and 2, but embodiments of the present disclosure are not limited thereto.

For example, in Formula 2B, $A_{21}$ may be selected from a benzene group, a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a perylene group, a thiophene group, a furan group, a silole group, a carbazole group, an indole group, an isoindole group, a benzofuran group, a benzothiophene group, a benzosilole group, a dibenzofuran group, a dibenzothiophene group, a benzocarbazole group, a dibenzocarbazole group, a dibenzosilole group, an imidazole group, a pyrazole group, a thiazole group, an isothiazole group, an oxazole group, an isoxazole group, a pyridine group, a pyrazine group, a pyrimidine group, a pyridazine group, a triazine group, a quinoline group, an isoquinoline group, a benzoquinoline group, a phthalazine group, a naphthyridine group, a quinoxaline group, a quinazoline group, a cinnoline group, a phenanthridine group, an acridine group, and a phenanthroline group, but embodiments of the present disclosure are not limited thereto.

In one embodiment, in Formula 2B, $A_{21}$ may be selected from a benzene group, a naphthalene group, a pyridine group, a pyrazine group, a pyrimidine group, a pyridazine group, a triazine group, a quinoline group, and an isoquinoline group, but embodiments of the present disclosure are not limited thereto.

For example, in Formula 2A, $X_{21}$ may be N, $X_{22}$ may be $C(R_{22})$, $X_{23}$ may be $C(R_{23})$, $X_{24}$ may be $C(R_{24})$, and $X_{25}$ may be $C(R_{25})$;

$X_{21}$ may be $C(R_{21})$, $X_{22}$ may be N, $X_{23}$ may be $C(R_{23})$, $X_{24}$ may be $C(R_{24})$, and $X_{25}$ may be $C(R_{25})$;

$X_{21}$ may be $C(R_{21})$, $X_{22}$ may be $C(R_{22})$, $X_{23}$ may be N, $X_{24}$ may be $C(R_{24})$, and $X_{25}$ may be $C(R_{25})$;

$X_{21}$ may be N, $X_{22}$ may be $C(R_{22})$, $X_{23}$ may be N, $X_{24}$ may be $C(R_{24})$, and $X_{25}$ may be $C(R_{25})$;

$X_{21}$ may be $C(R_{21})$, $X_{22}$ may be N, $X_{23}$ may be $C(R_{23})$, $X_{24}$ may be N, and $X_{25}$ may be $C(R_{25})$;

$X_{21}$ may be N, $X_{22}$ may be $C(R_{22})$, $X_{23}$ may be $C(R_{23})$, $X_{24}$ may be N, and $X_{25}$ may be $C(R_{25})$; or $X_{21}$ may be N, $X_{22}$ may be $C(R_{22})$, $X_{23}$ may be N, $X_{24}$ may be $C(R_{24})$, and $X_{25}$ may be N, but embodiments of the present disclosure are not limited thereto.

For example, in Formula 2B, $X_{26}$ may be N, $X_{27}$ may be $C(R_{27})$, $X_{28}$ may be $C(R_{28})$, and $X_{29}$ may be $C(R_{29})$;

$X_{26}$ may be $C(R_{26})$, $X_{27}$ may be N, $X_{28}$ may be $C(R_{28})$, and $X_{29}$ may be $C(R_{29})$;

$X_{26}$ may be N, $X_{27}$ may be $C(R_{27})$, $X_{28}$ may be N, and $X_{29}$ may be $C(R_{29})$; or $X_{26}$ may be N, $X_{27}$ may be $C(R_{27})$, $X_{28}$ may be $C(R_{28})$, and $X_{29}$ may be N, but embodiments of the present disclosure are not limited thereto.

For example, in Formulae 2A and 2B, $R_{21}$ to $R_{30}$ may each independently be selected from:

hydrogen, deuterium, —F, a cyano group, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, a diazadibenzothiophenyl group, and —$Si(Q_1)(Q_2)(Q_3)$;

a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group, each substituted with at least one selected from deuterium, —F, a cyano group, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, a diazadibenzothiophenyl group, and —$Si(Q_{31})(Q_{32})(Q_{33})$; and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, a diazadibenzothiophenyl group, and —$Si(Q_{21})(Q_{22})(Q_{23})$, and $Q_1$ to $Q_3$, $Q_{21}$ to $Q_{23}$, and $Q_{31}$ to $Q_{33}$ may each independently be selected from a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group, but embodiments of the present disclosure are not limited thereto.

For example, in Formula 3, $X_{31}$ may be B, and $X_{32}$ and $X_{33}$ may be $N(R_{34})$; or $X_{31}$ may be N, and $X_{32}$ and $X_{33}$ may be $B(R_{34})$, but embodiments of the present disclosure are not limited thereto.

For example, in Formula 3, $A_{31}$ to $A_{33}$ may each independently be selected from a benzene group, a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a perylene group, a thiophene group, a furan group, a silole group, a carbazole group, an indole group, an isoindole group, a benzofuran group, a benzothiophene group, a benzosilole group, a dibenzofuran group, a dibenzothiophene group, a benzocarbazole group, a dibenzocarbazole group, and a dibenzosilole group, but embodiments of the present disclosure are not limited thereto.

In one embodiment, in Formula 3, $A_{31}$ to $A_{33}$ may be a benzene group, but embodiments of the present disclosure are not limited thereto.

For example, in Formula 3, a31 to a33 may each independently be selected from 0 and 1, but embodiments of the present disclosure are not limited thereto.

For example, in Formula 3, $R_{31}$ to $R_{35}$ may each independently be selected from:

hydrogen, deuterium, —F, —Cl, —Br, —I, a cyano group, a $C_1$-$C_{20}$ alkyl group, and a $C_1$-$C_{20}$ alkoxy group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group, each substituted with at least one selected from deuterium, —F, —Cl, —Br, —I, a cyano group, a $C_1$-$C_{20}$ alkyl group, a $C_1$-$C_{20}$ alkoxy group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group; and —$B(Q_1)(Q_2)$, and —$N(Q_1)(Q_2)$, and $Q_1$ and $Q_2$ may each independently be selected from:

hydrogen, deuterium, and a $C_1$-$C_{20}$ alkyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group, but embodiments of the present disclosure are not limited thereto.

In one embodiment, in Formula 3, $R_{31}$ to $R_{35}$ may each independently be selected from:

hydrogen, deuterium, —F, —Cl, —Br, —I, a cyano group, a methyl group, an ethyl group, an n-propyl group, an isopropyl group, an n-butyl group, an isobutyl group, a sec-butyl group, a tert-butyl group, a methoxy group, an ethoxy group, a propoxy group, and a butoxy group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group, each substituted with at least one selected from deuterium, —F, —Cl, —Br, —I, a cyano group, a methyl group, an ethyl group, an n-propyl group, an isopropyl group, an n-butyl group, an isobutyl group, a sec-butyl group, a tert-butyl group, a methoxy group, an ethoxy group, a propoxy group, a butoxy group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group; and —$B(Q_1)(Q_2)$, and —$N(Q_1)(Q_2)$, and $Q_1$ and $Q_2$ may each independently be selected from:

hydrogen, deuterium, a methyl group, an ethyl group, an n-propyl group, an isopropyl group, an n-butyl group, an isobutyl group, a sec-butyl group, and a tert-butyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group; and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group, each substituted with at least one selected from deuterium, a methyl group, an ethyl group, an n-propyl group, an isopropyl group, an n-butyl group, an isobutyl group, a sec-butyl group, a tert-butyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group, but embodiments of the present disclosure are not limited thereto.

In one embodiment, the first compound may be selected from compounds of Group I:

Group I 1-1

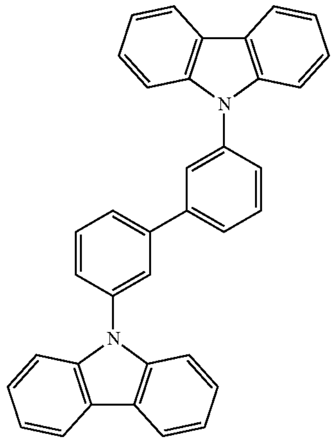

1-2

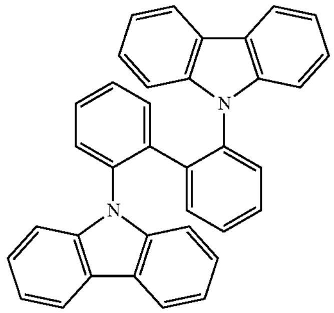

1-3

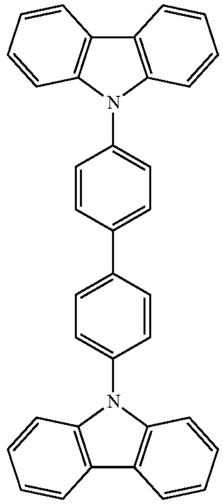

-continued
1-4
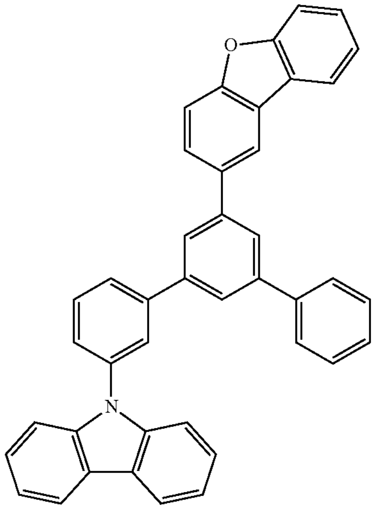
1-5
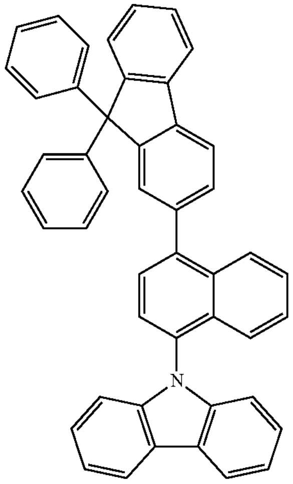
1-6
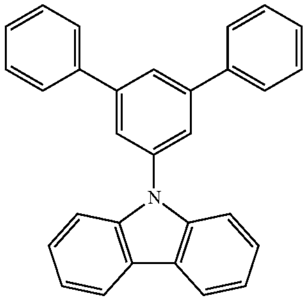
-continued
1-7
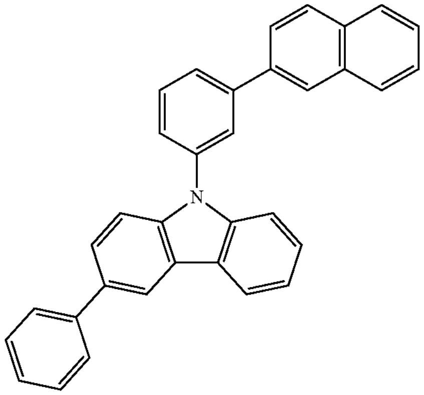
1-8
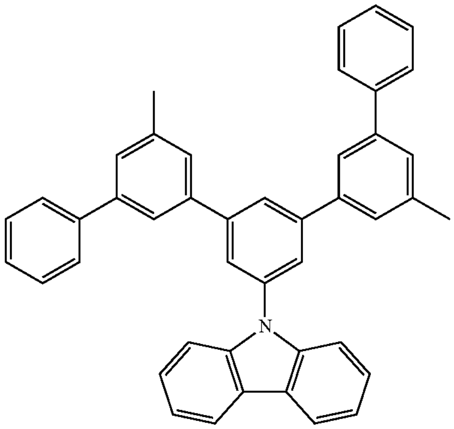
1-9
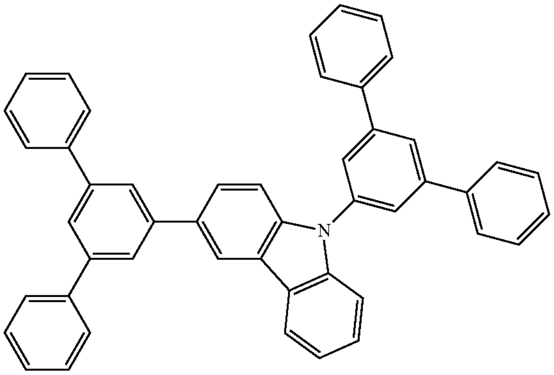
1-10
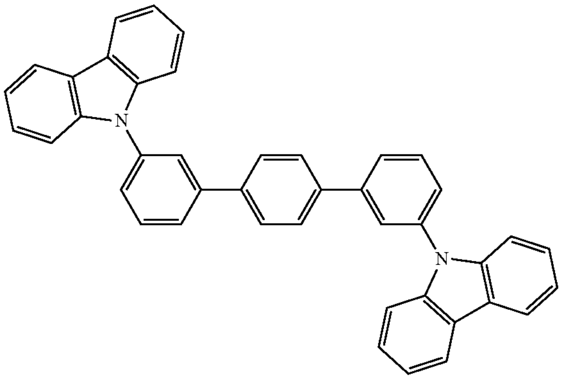

-continued
1-11
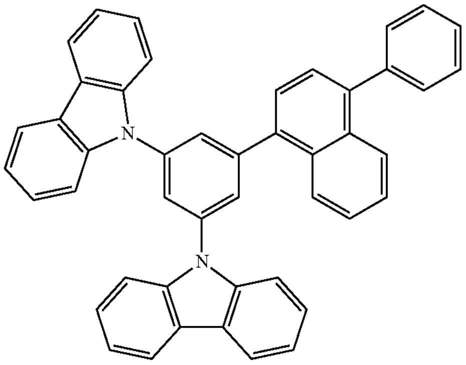
1-12
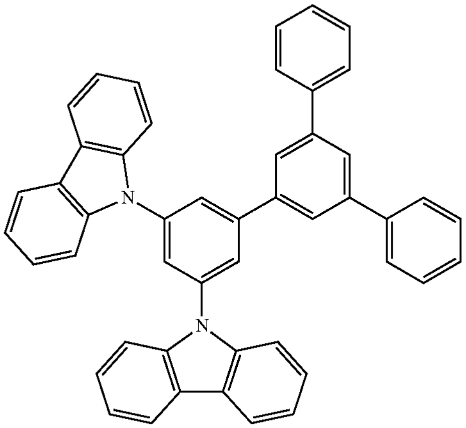
1-13
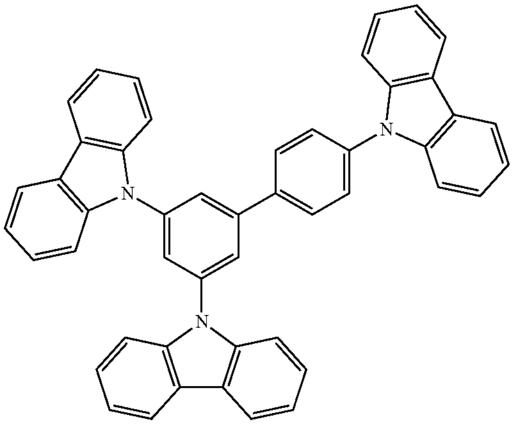
1-14
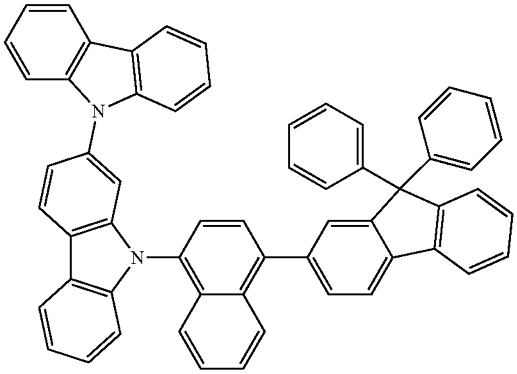
-continued
1-15
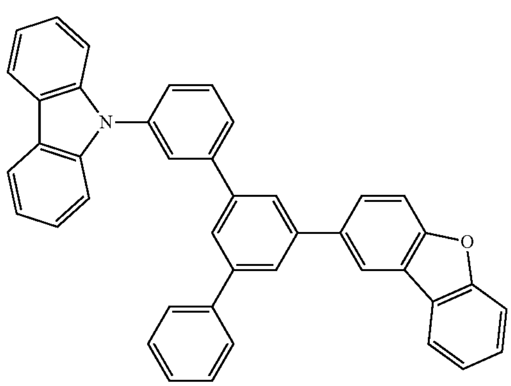
1-16
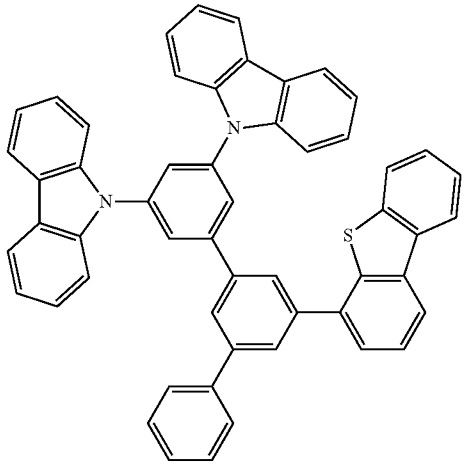
1-17
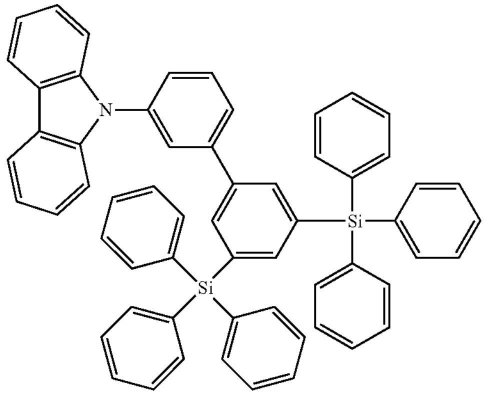

-continued
1-18
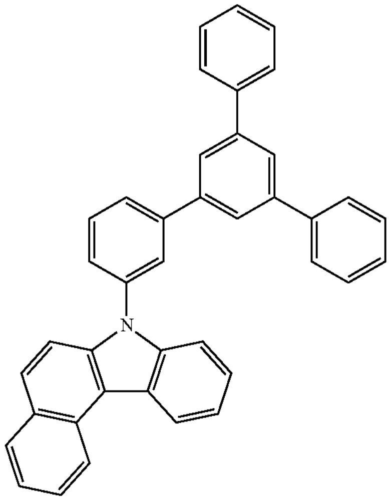
1-19
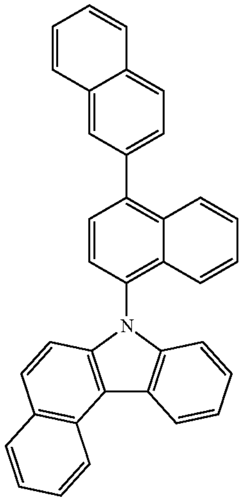
1-20
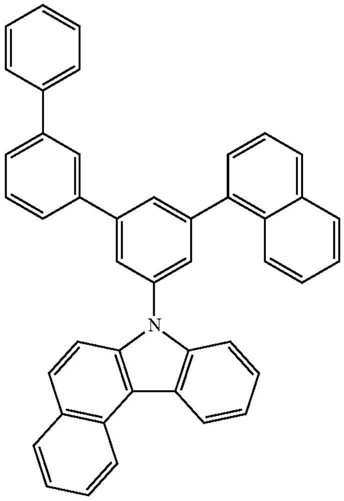
-continued
1-21
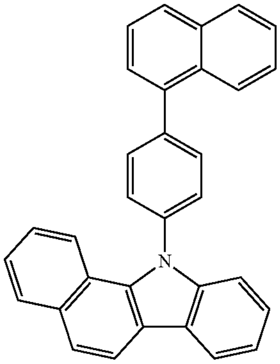
1-22
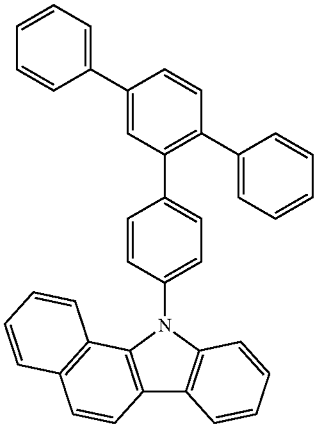
1-23
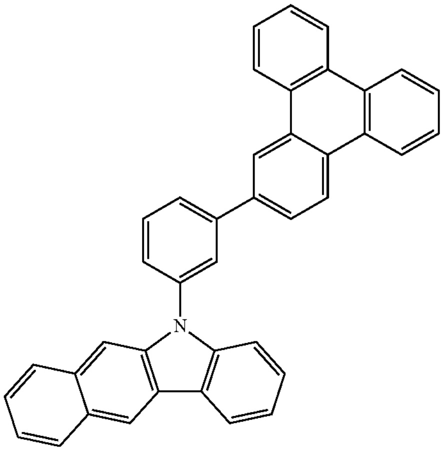
1-24
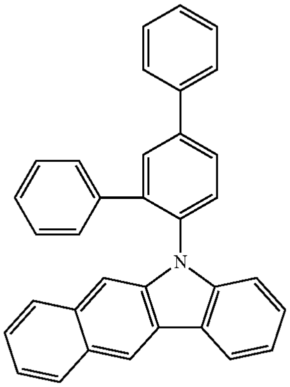

-continued
1-25
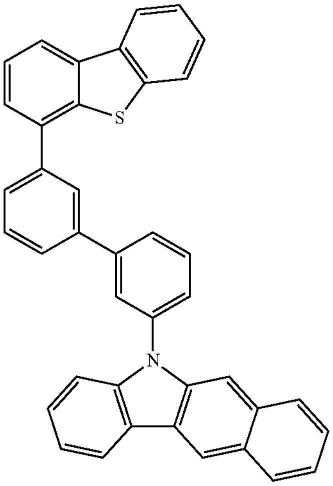
1-26
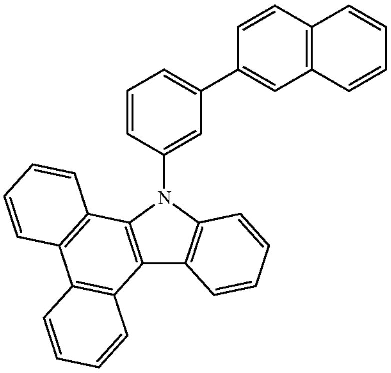
1-27
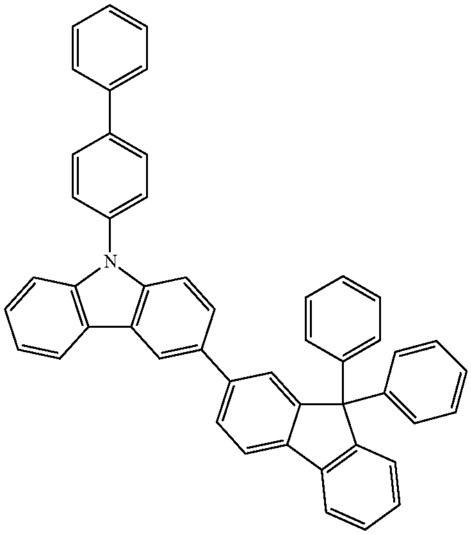
-continued
1-28
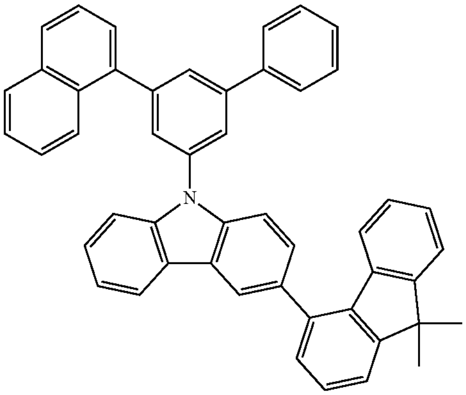
1-29
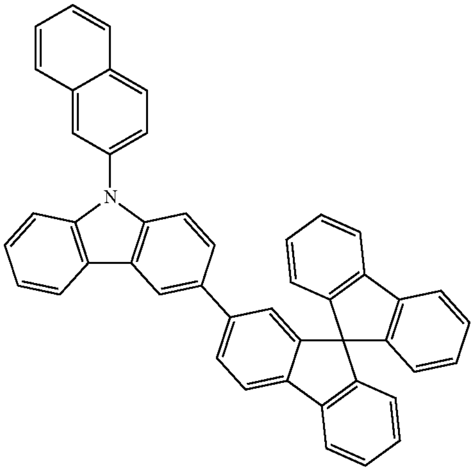
1-30
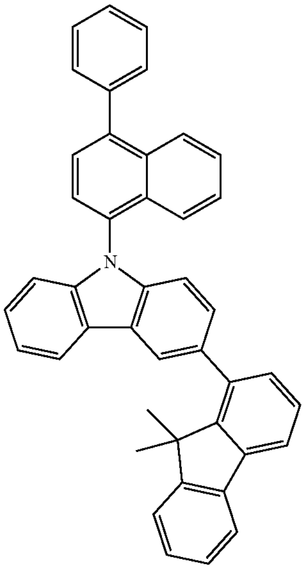

-continued
1-31
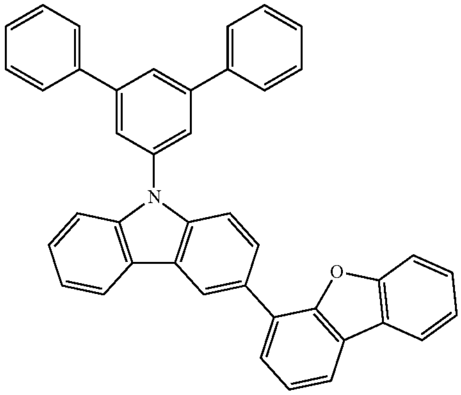
1-31
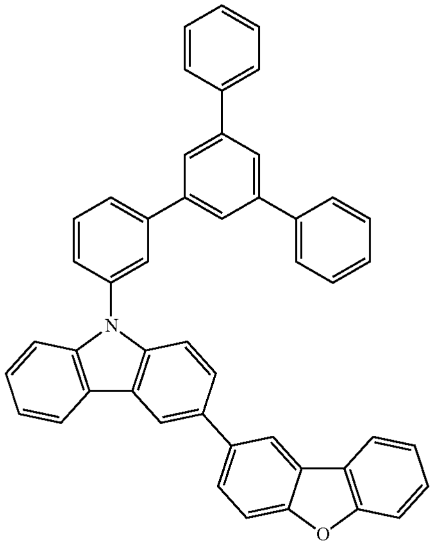
1-32
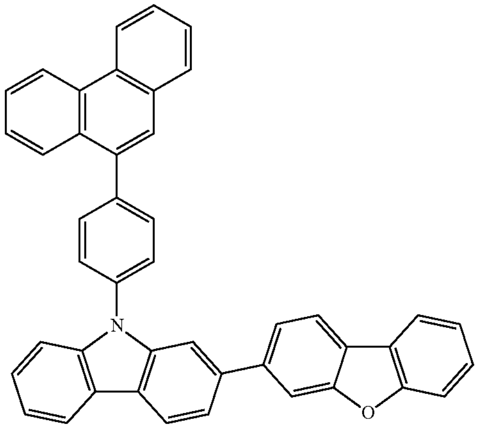
-continued
1-33
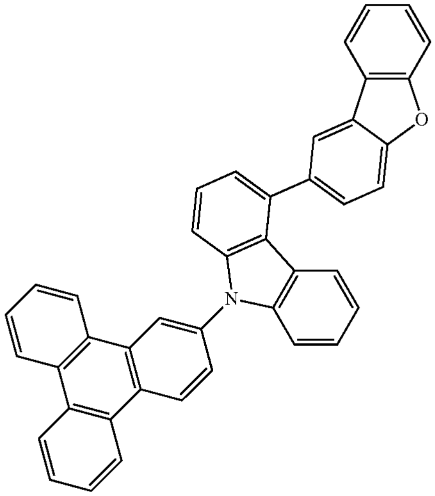
1-34
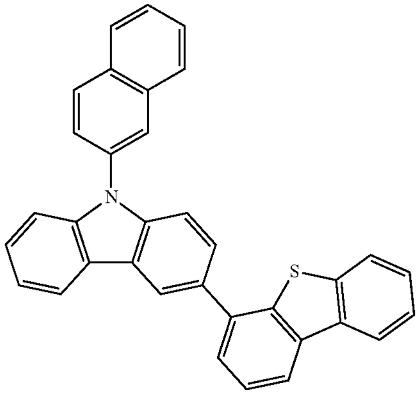
1-35
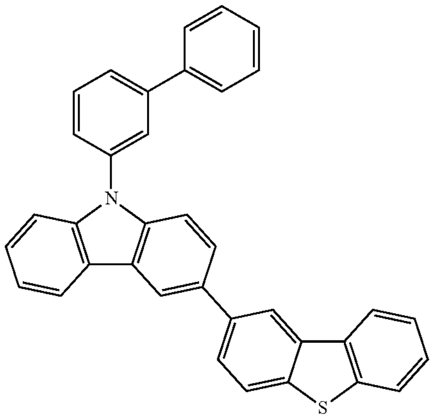

-continued
1-36
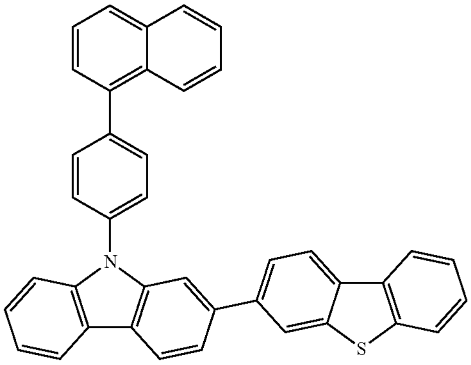
1-37
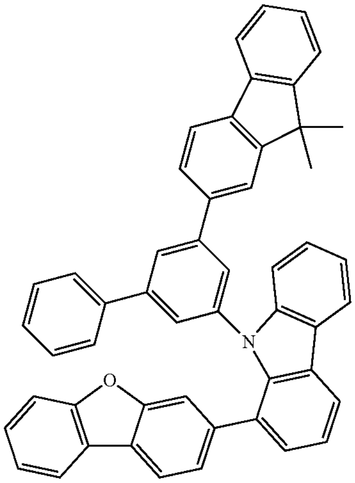
1-38
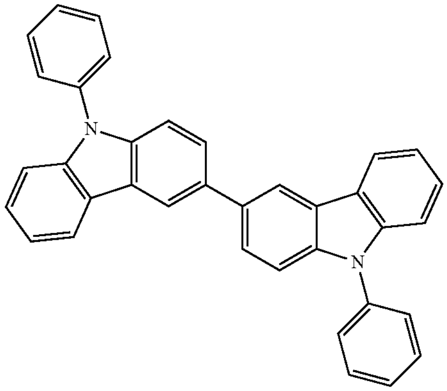
-continued
1-39
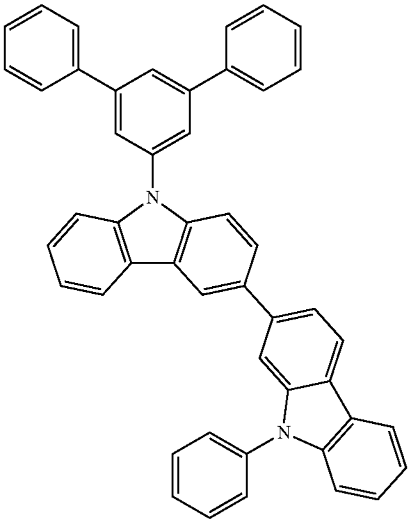
1-40
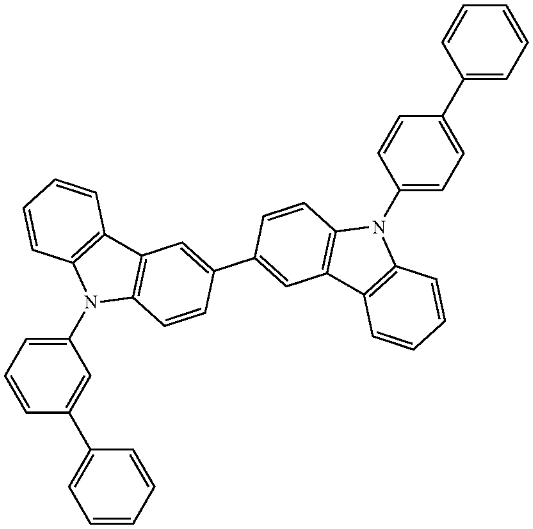
1-41
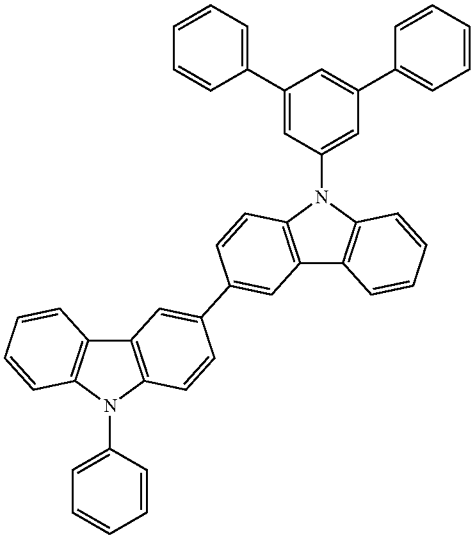

-continued
1-42
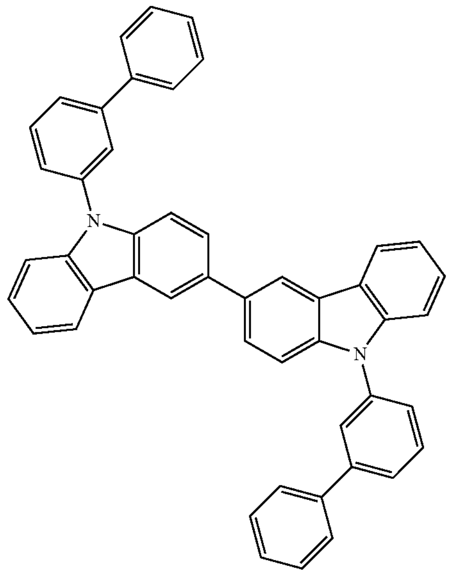
1-43
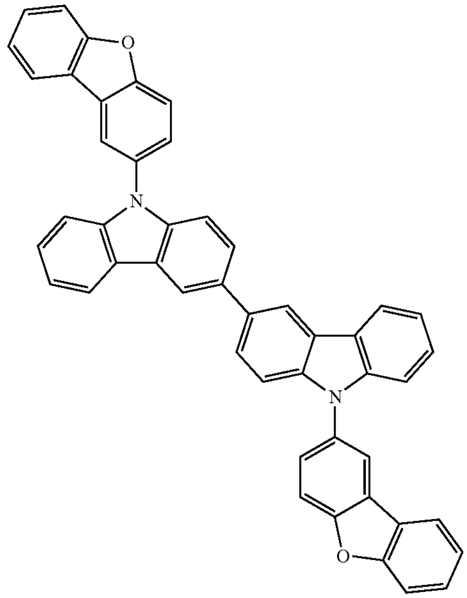
-continued
1-44
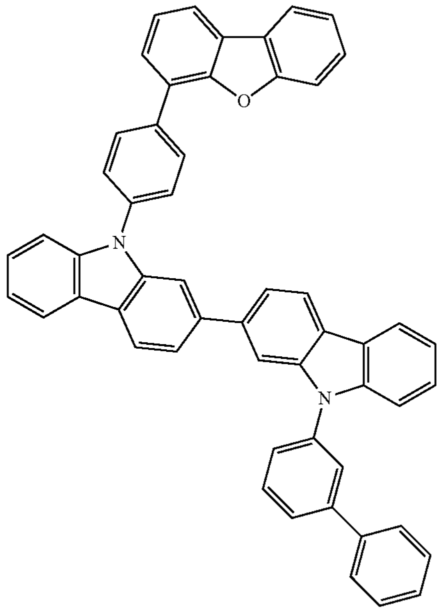
1-45
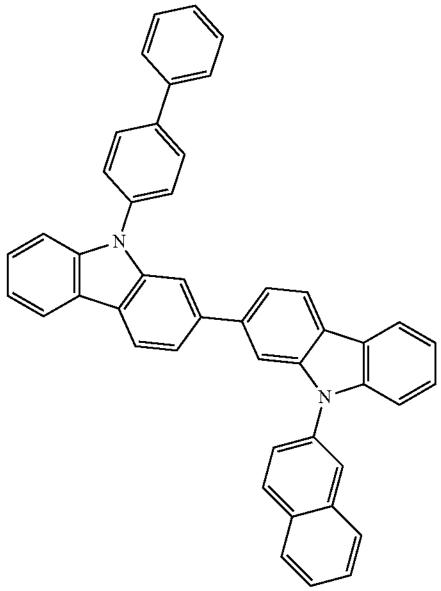

-continued
1-46
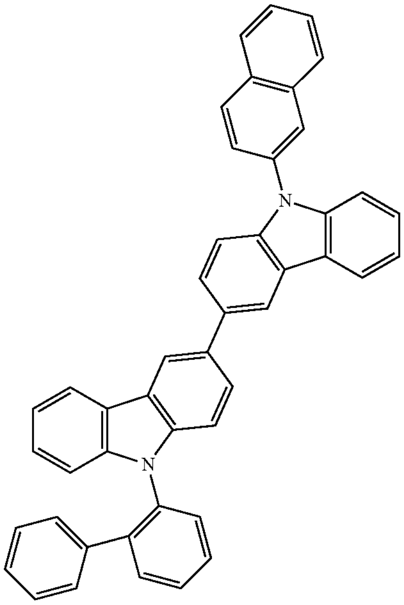
1-47
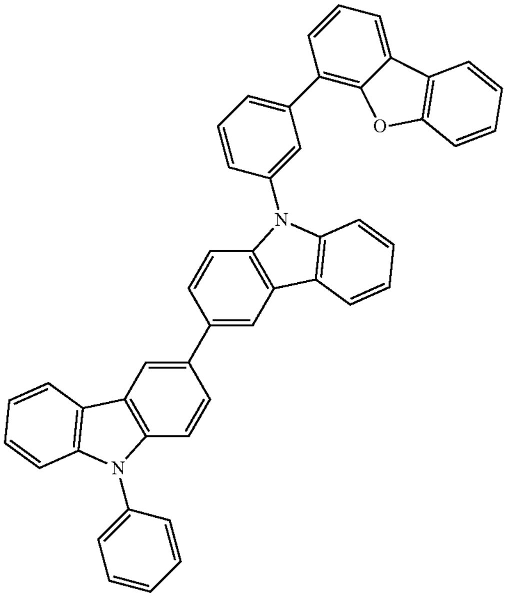
-continued
1-48
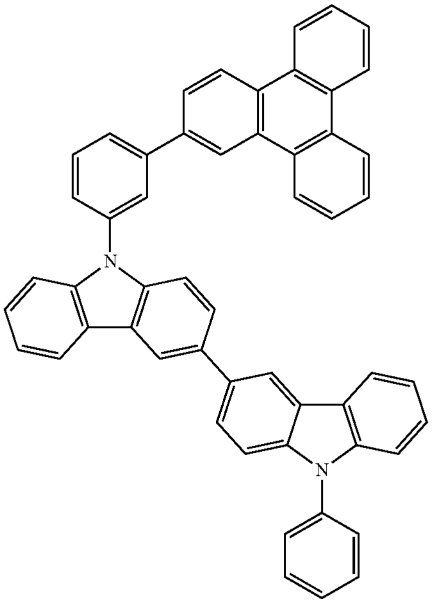
1-49
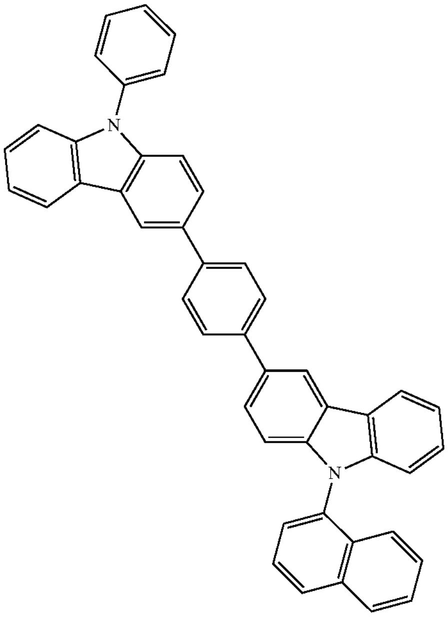

-continued
1-50
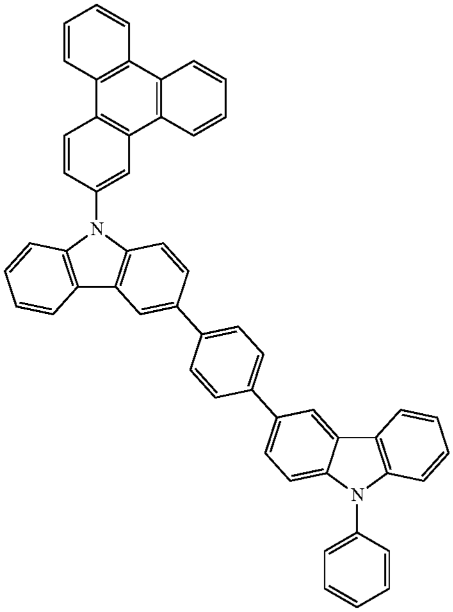
1-51
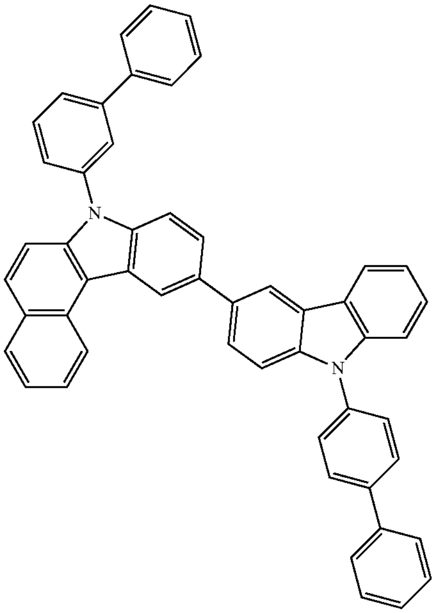
-continued
1-52
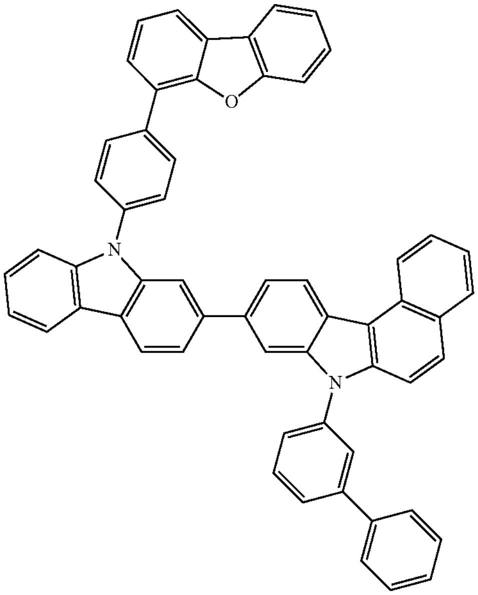
1-53
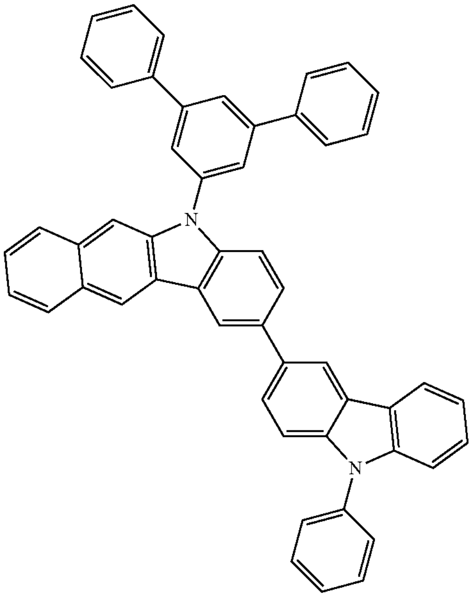

-continued
1-54
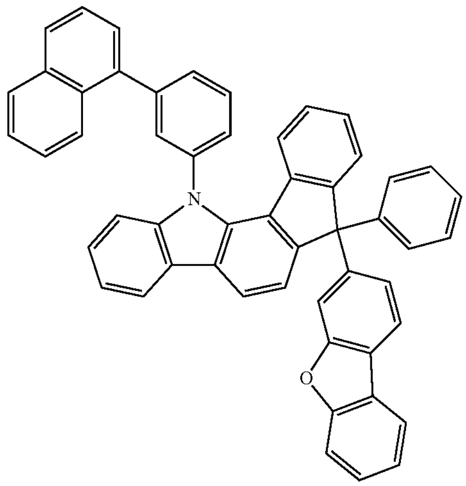
1-55
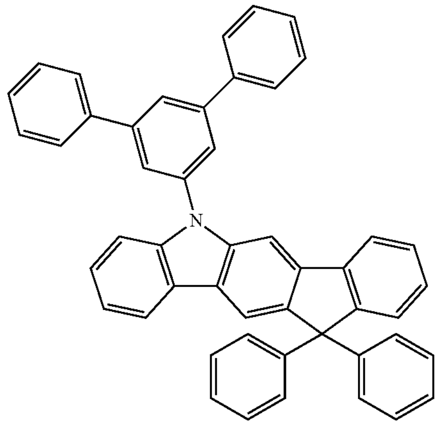
1-56
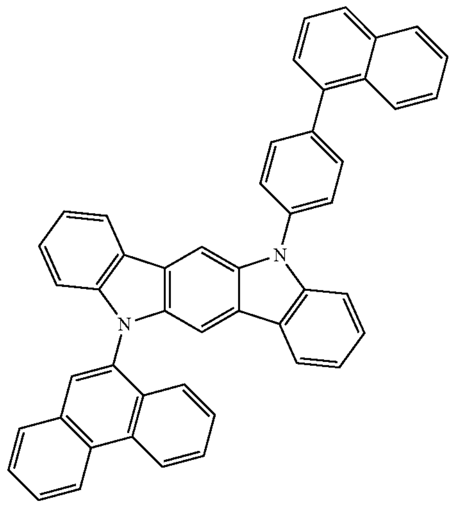
-continued
1-57
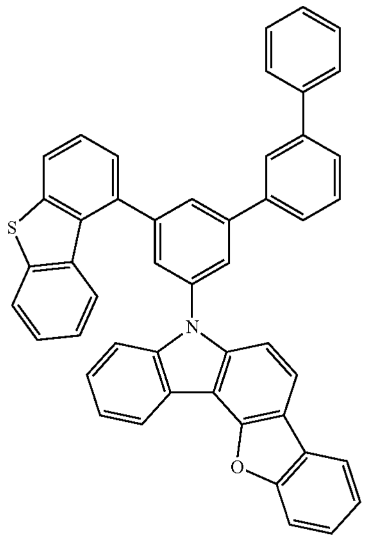
1-58
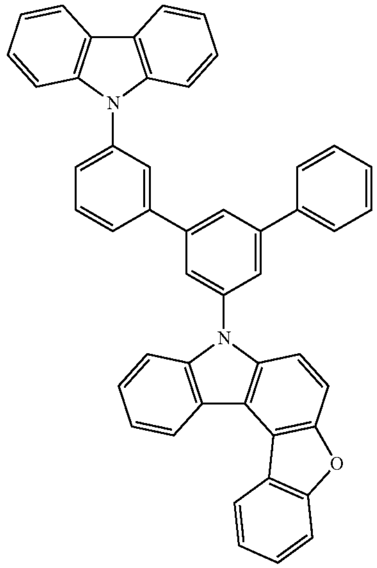
1-59
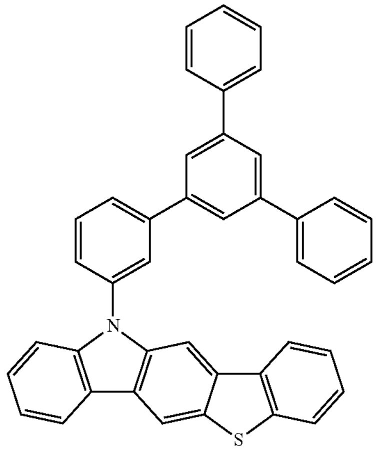

-continued
1-60
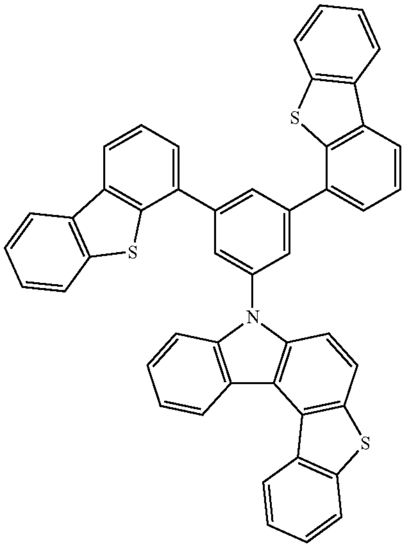
1-61
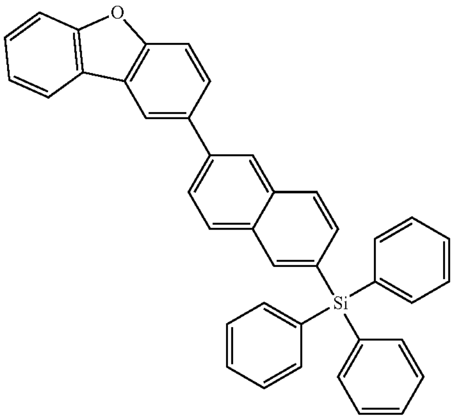
1-62
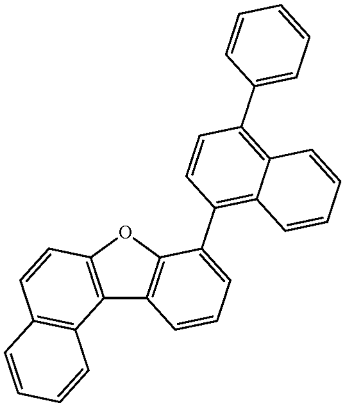
1-63
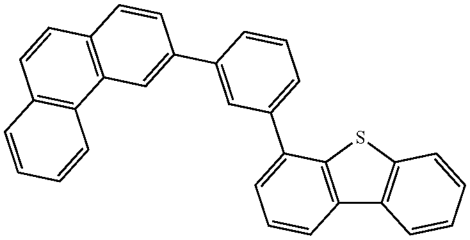
-continued
1-64
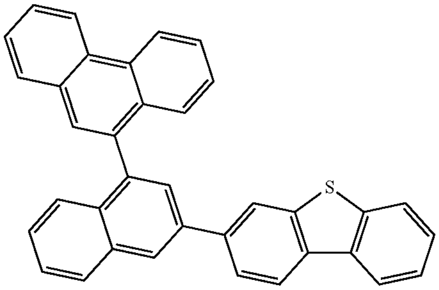
1-65
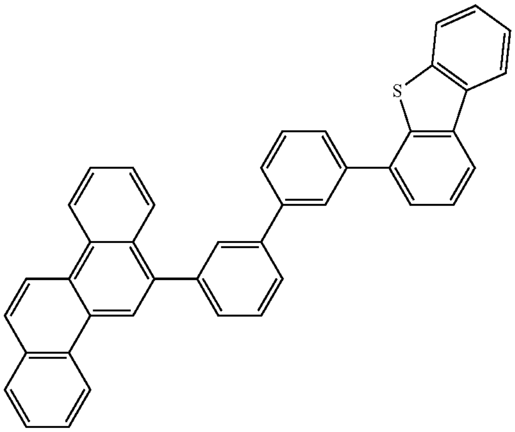
1-66
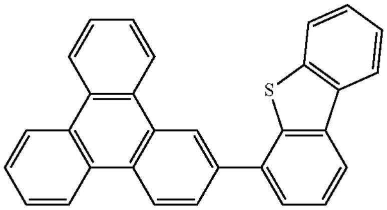
1-67
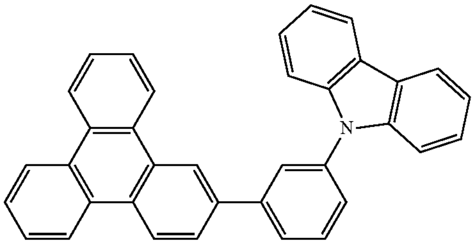
1-68
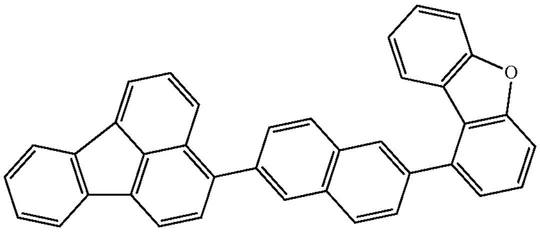

-continued
1-69
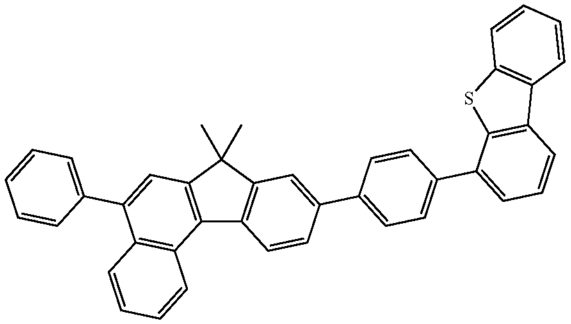
1-70
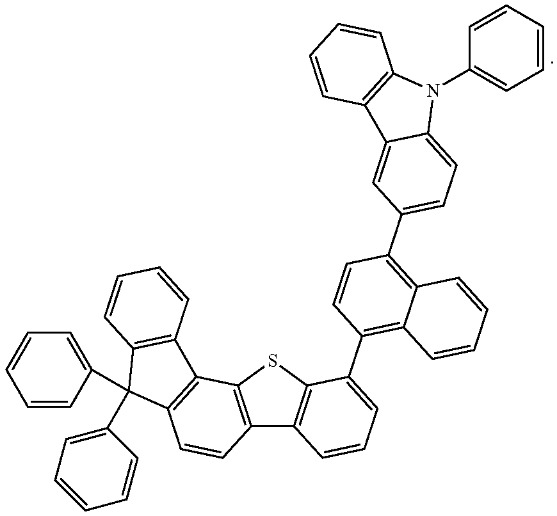
.
In one embodiment, the second compound may be selected from compounds of Group II:
Group II
2-1
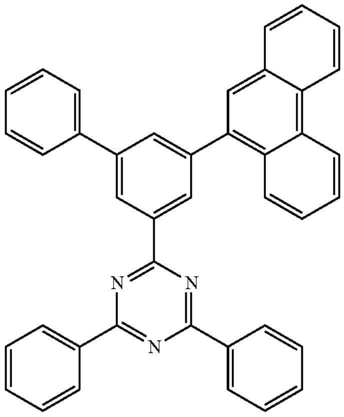
-continued
2-2
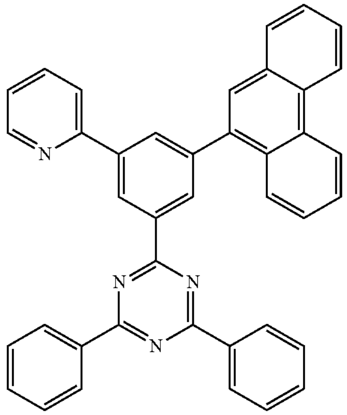
2-3
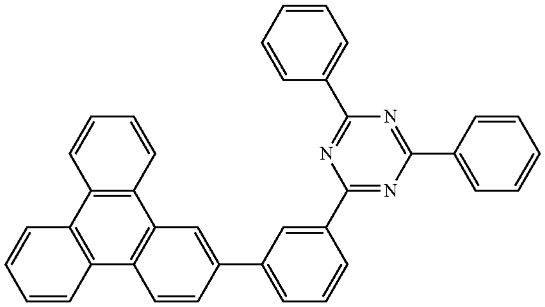
2-4
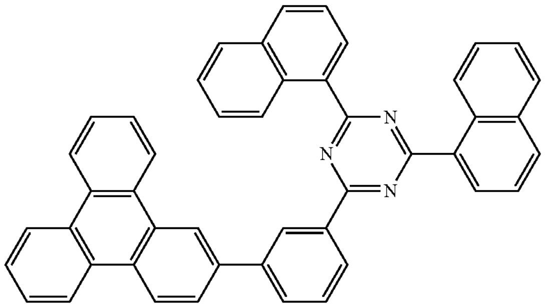
2-5
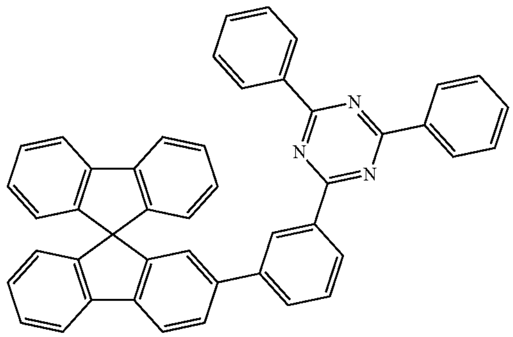

-continued
2-6
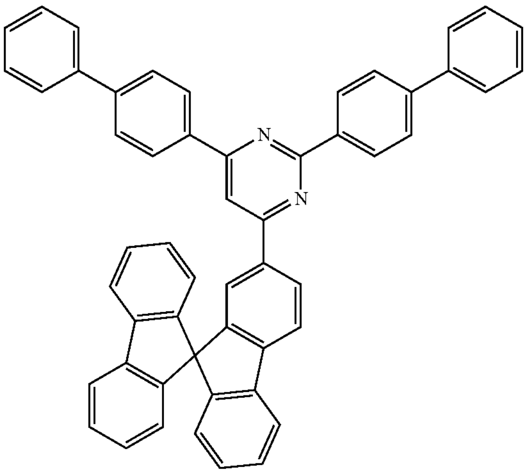
2-7
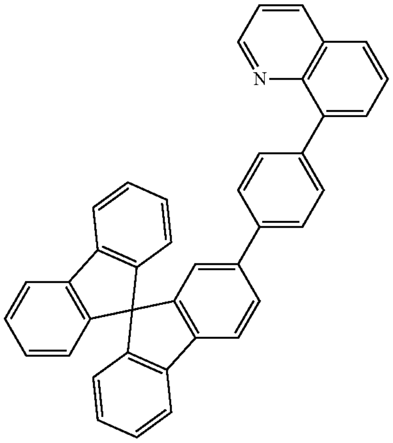
2-8
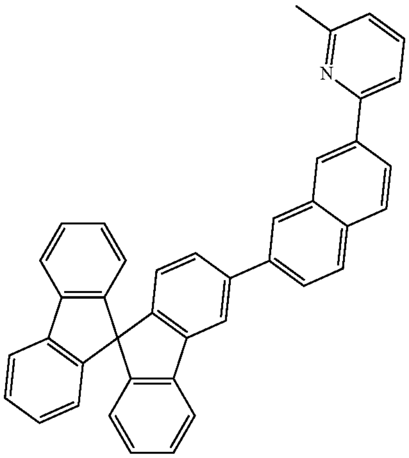
-continued
2-9
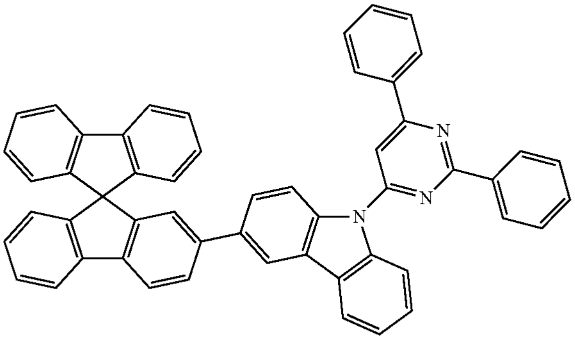
2-10
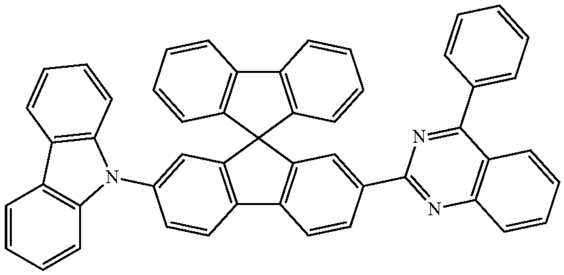
2-11
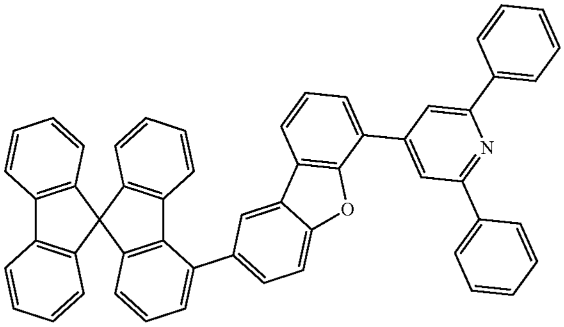
2-12
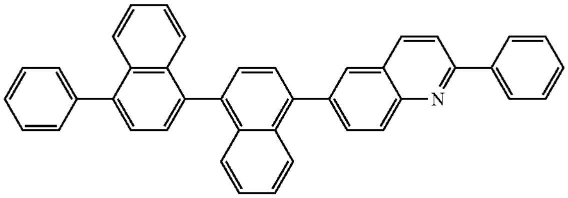
2-13
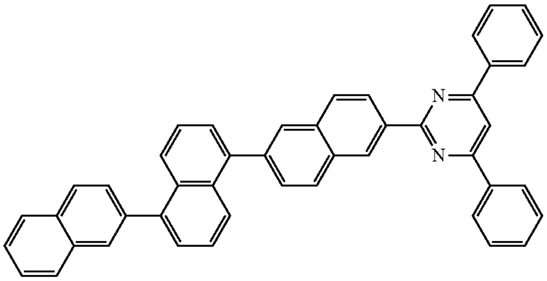

-continued
2-14
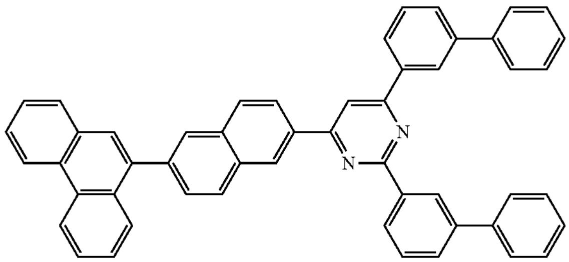
2-15
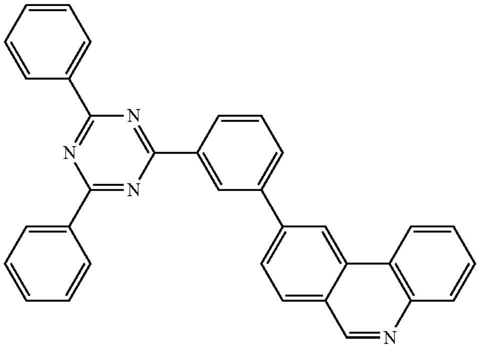
2-16
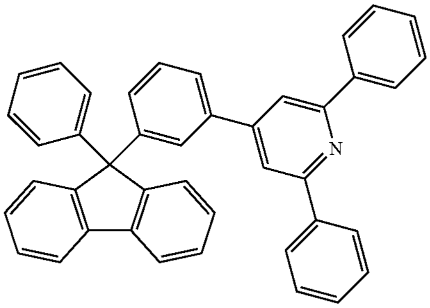
2-17
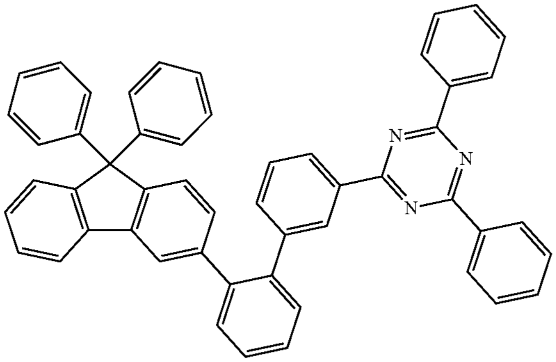
-continued
2-18
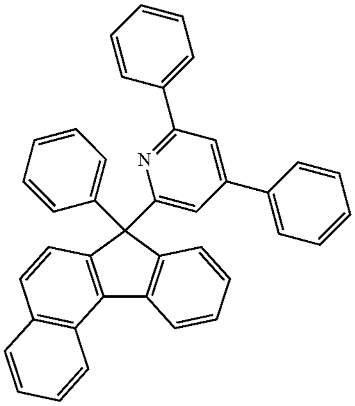
2-19
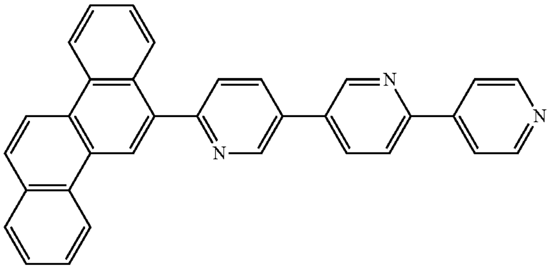
2-20
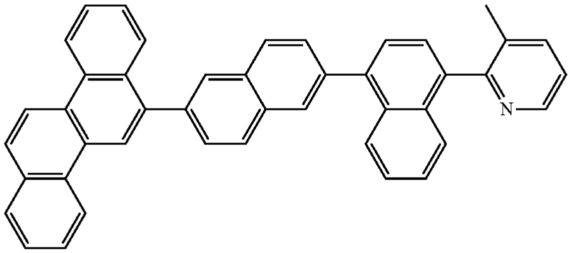
2-21
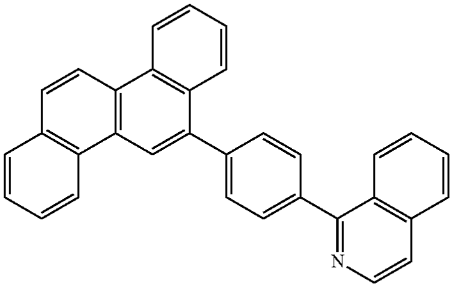
2-22
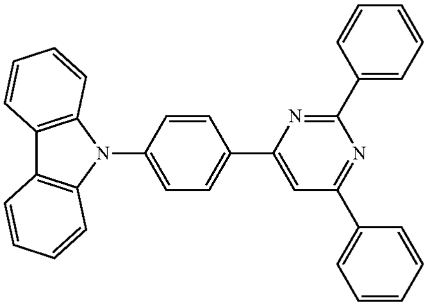

-continued
2-23
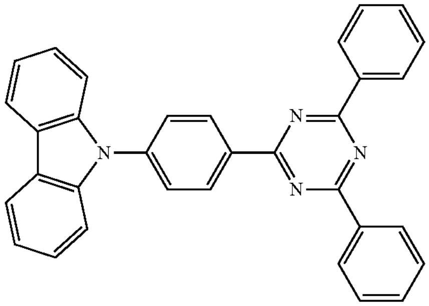
2-24
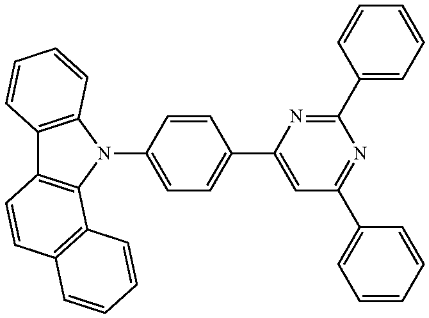
2-25
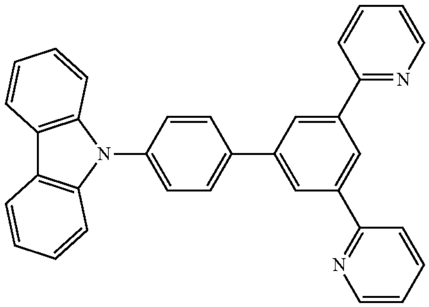
2-26
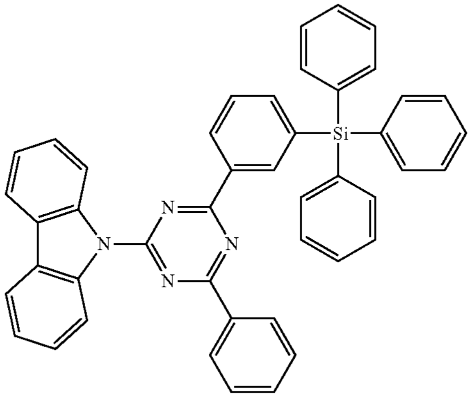
-continued
2-27
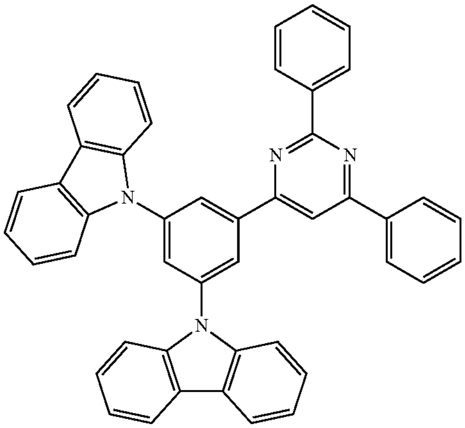
2-28
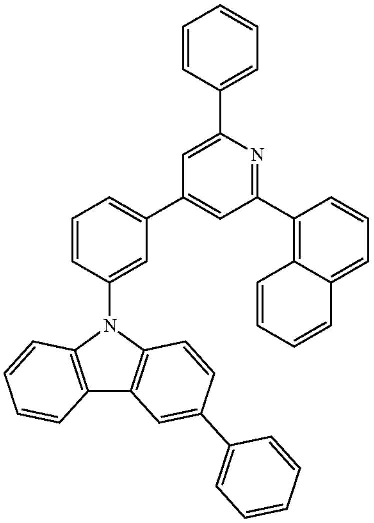
2-29
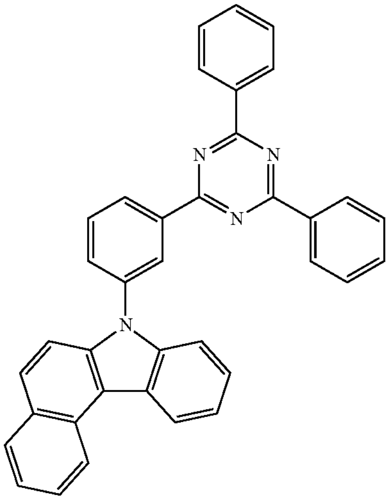

-continued
2-30
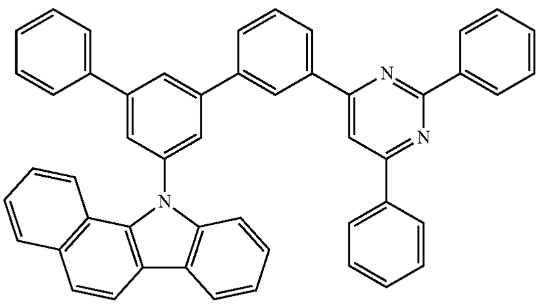
2-31
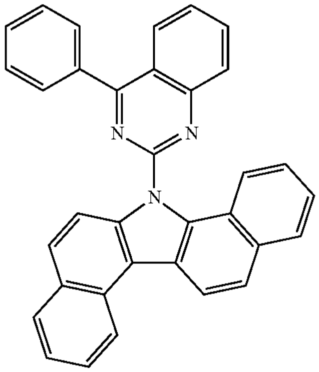
2-32
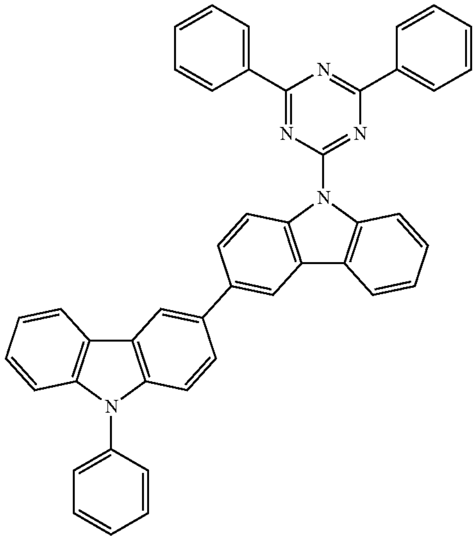
-continued
2-33
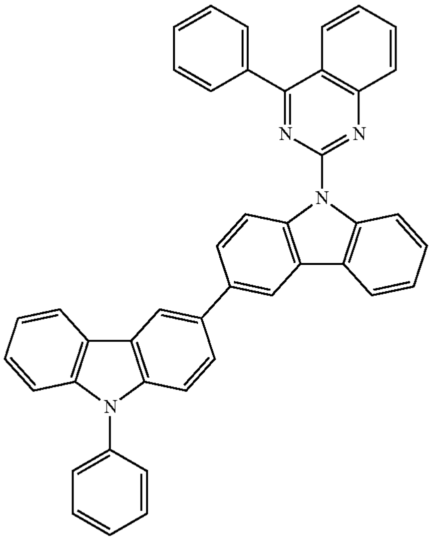
2-34
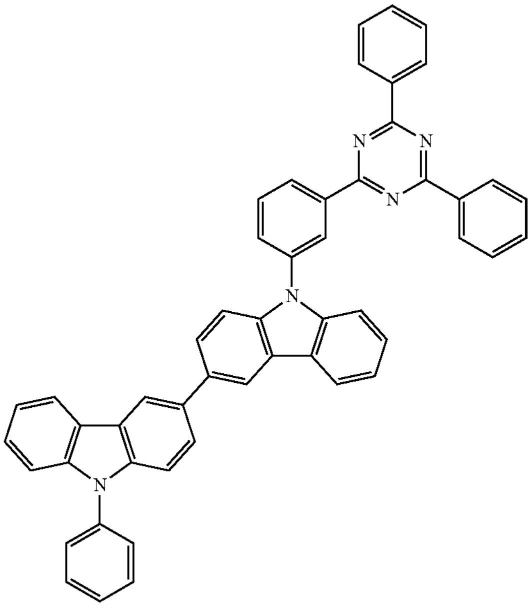

-continued
2-35
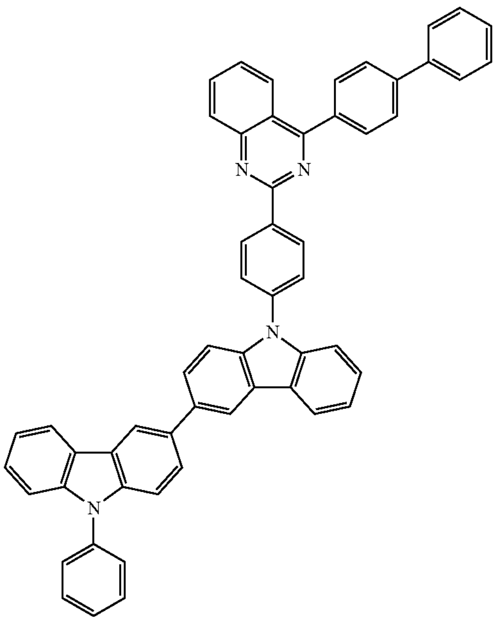
2-36
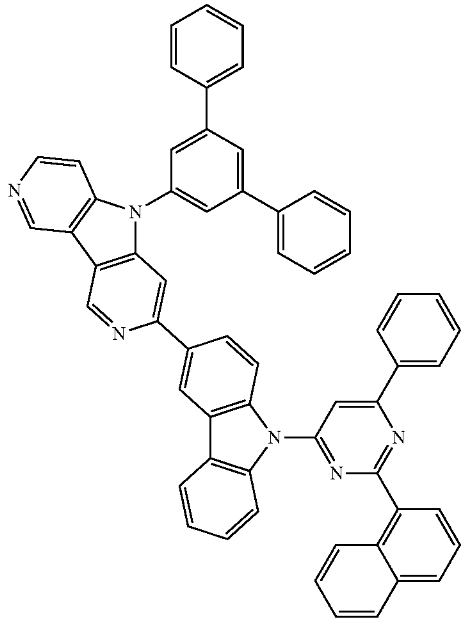
-continued
2-37
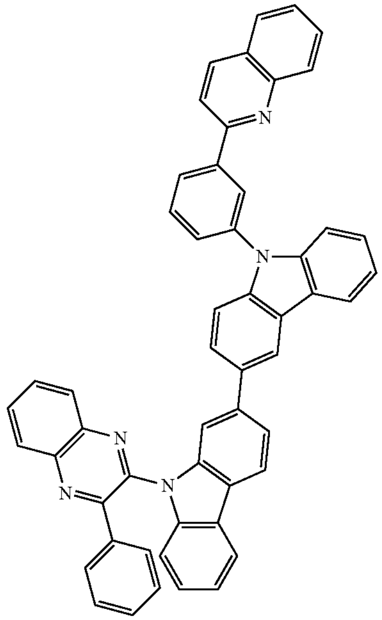
2-38
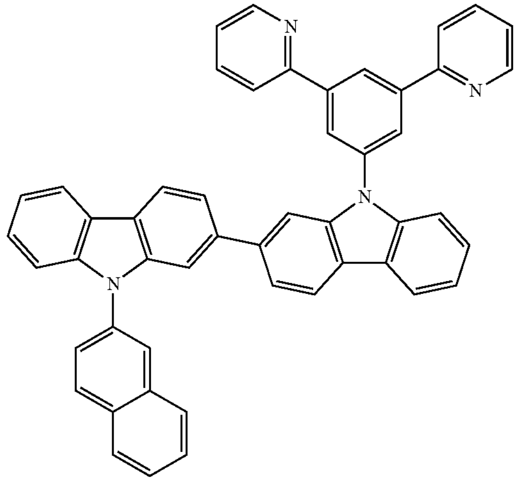
2-39
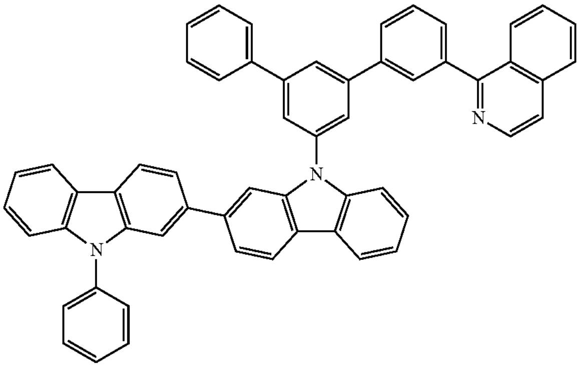

-continued
2-40
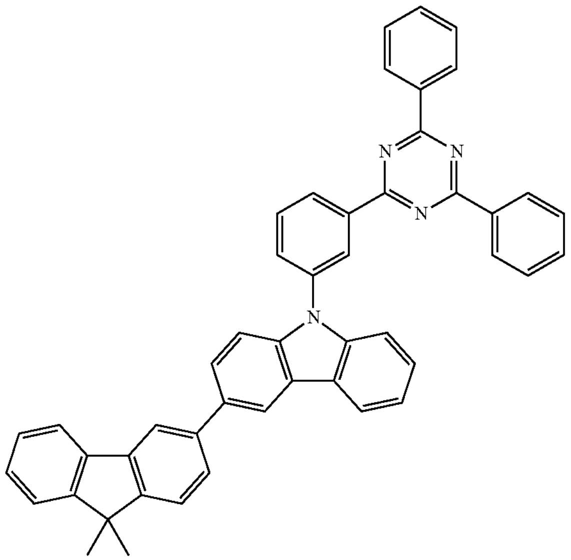
2-41
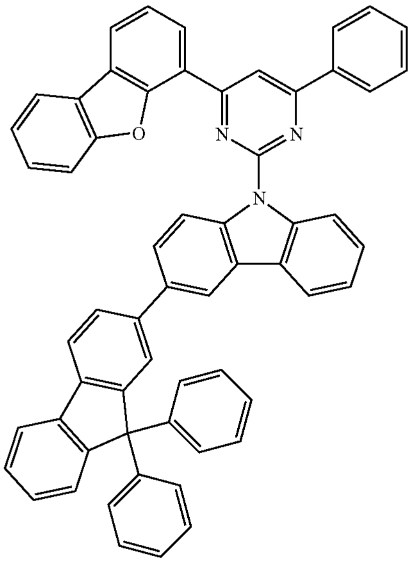
2-42
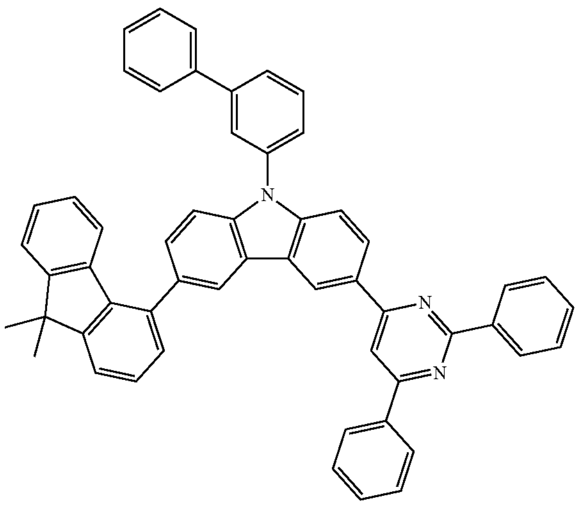
-continued
2-43
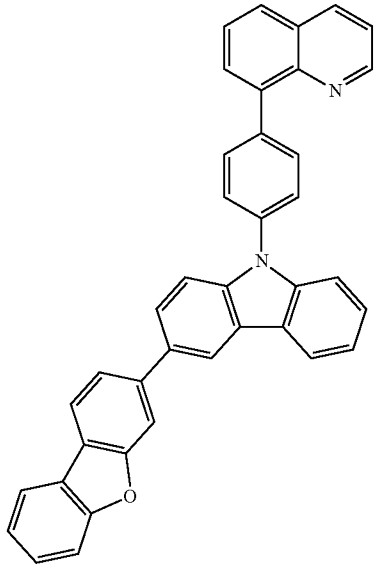
2-44
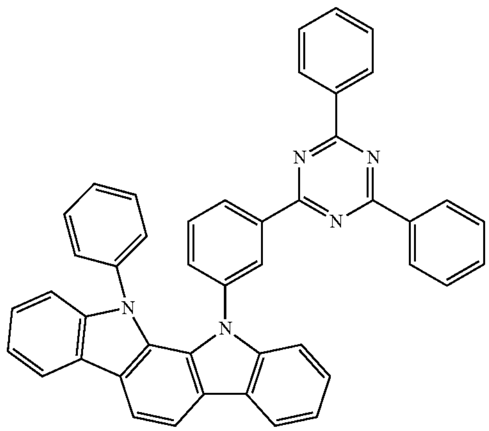
2-45
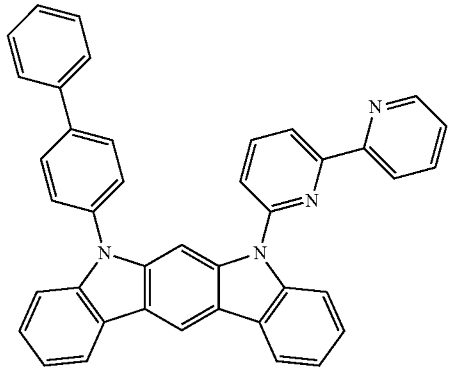

-continued
2-46
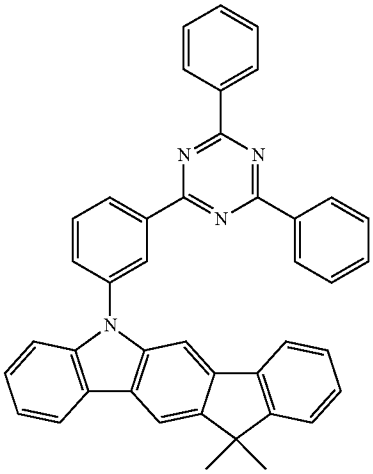
2-47
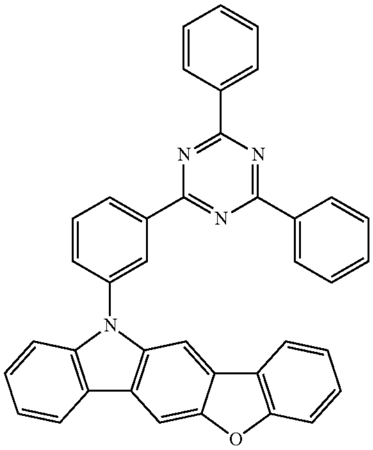
2-48
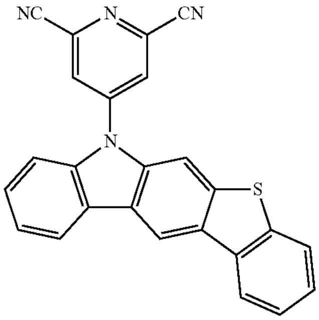
2-49
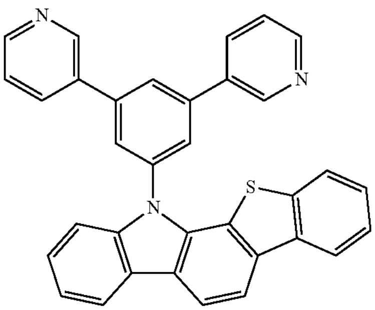
-continued
2-50
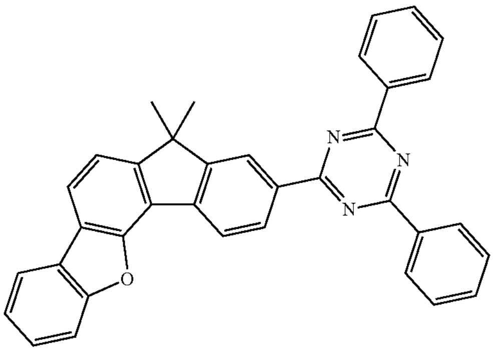
2-51
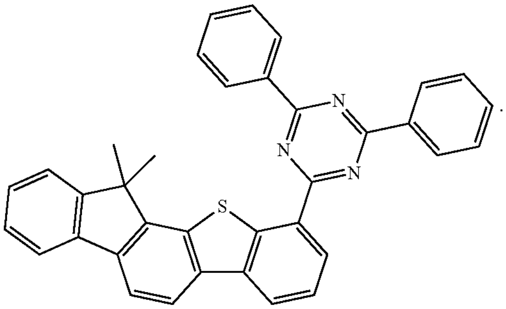
In one embodiment, the third compound may be selected from compounds of Group III:
Group III
3-1
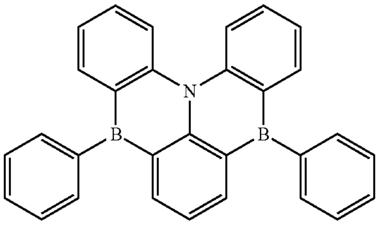
3-2
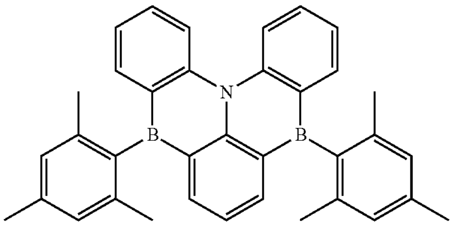
3-3
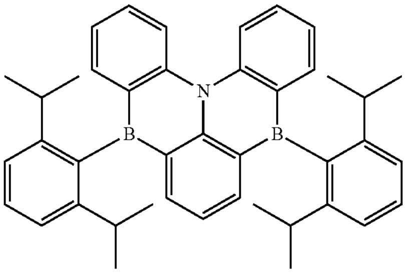

-continued
3-4
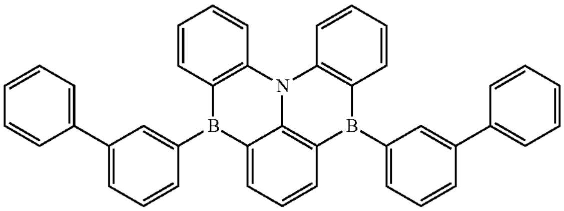
3-5
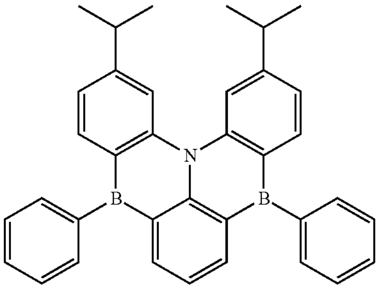
3-6
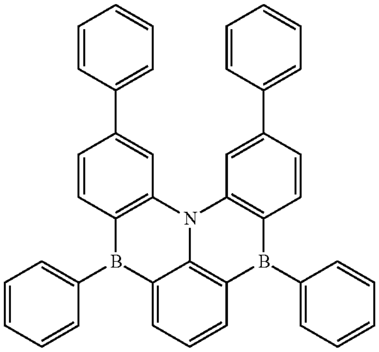
3-7
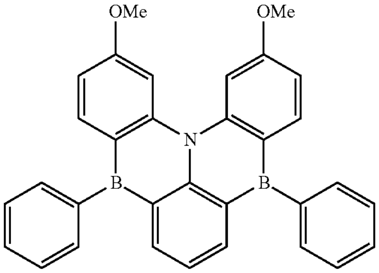
3-8
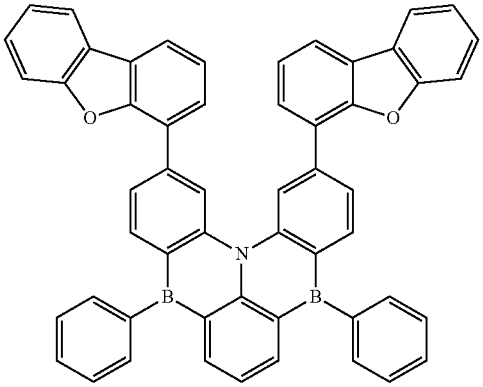
-continued
3-9
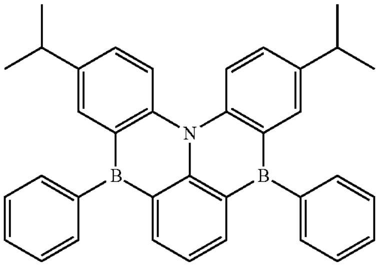
3-10
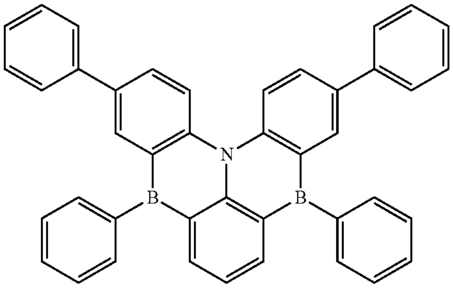
3-11
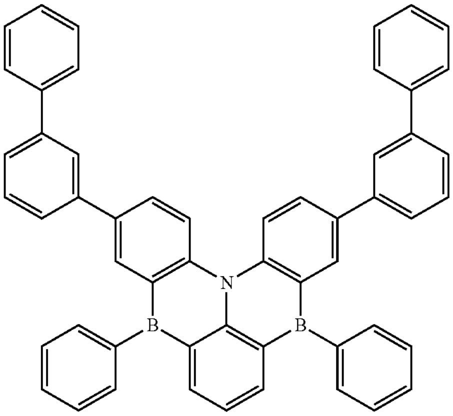
3-12
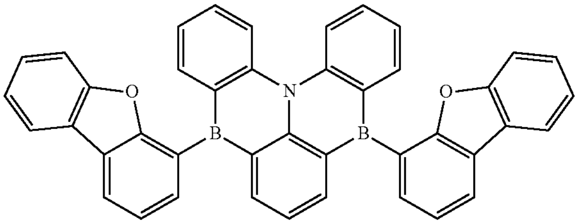
3-13
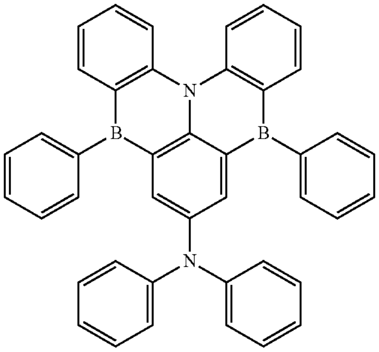

-continued
3-14
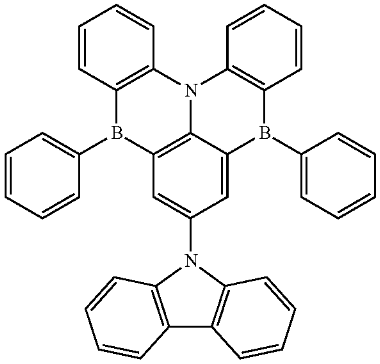
3-15
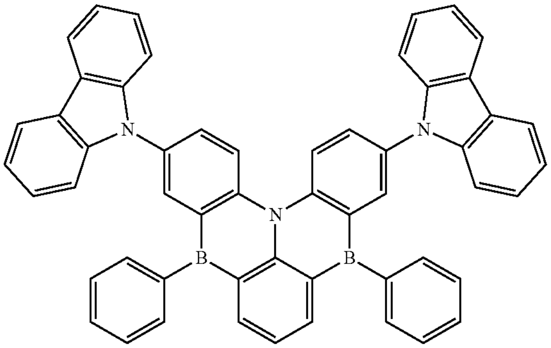
3-16
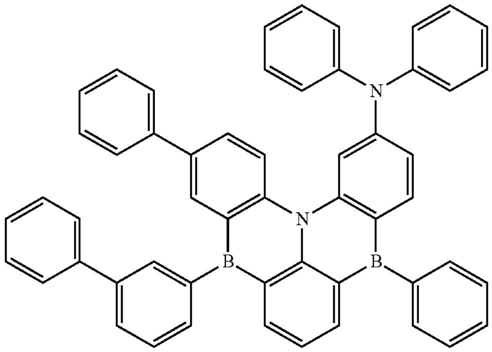
3-17
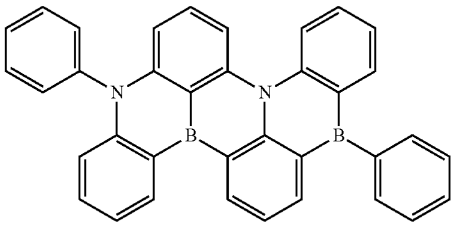
-continued
3-18
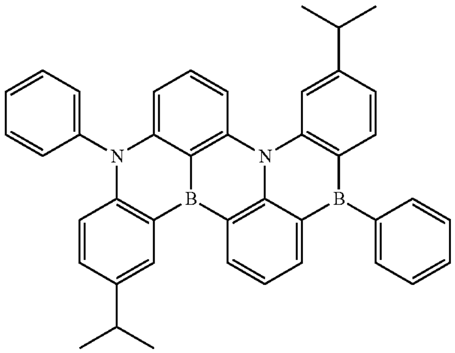
3-19
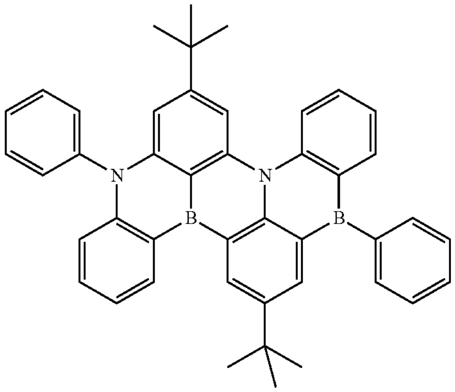
3-20
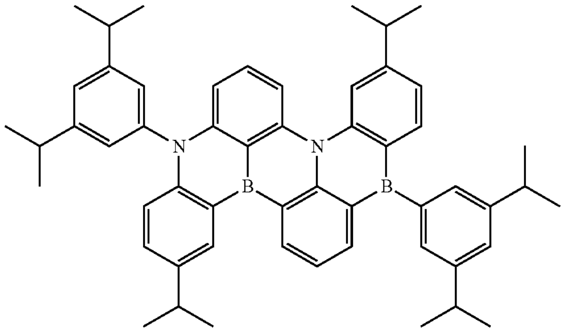
3-21
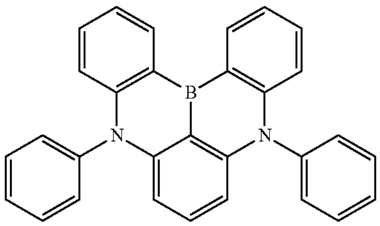
3-22
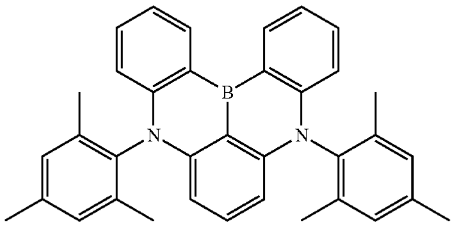

-continued
3-23
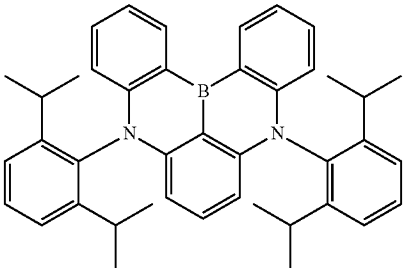
3-24
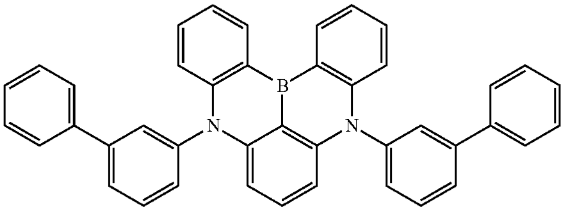
3-25
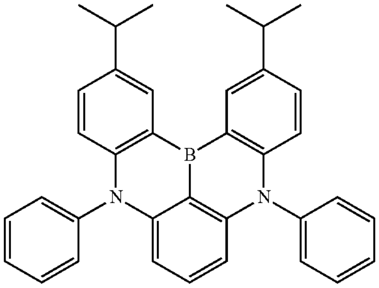
3-26
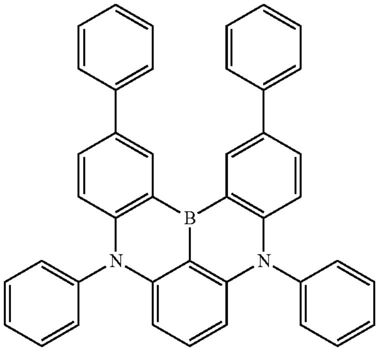
3-27
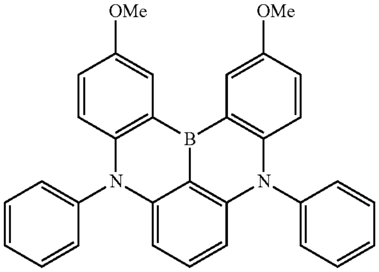
-continued
3-28
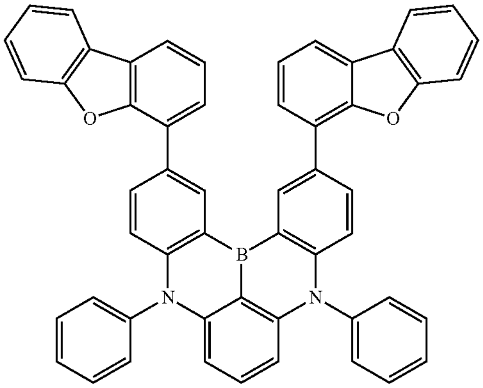
3-29
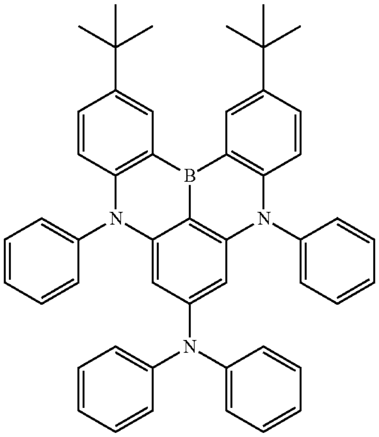
3-30
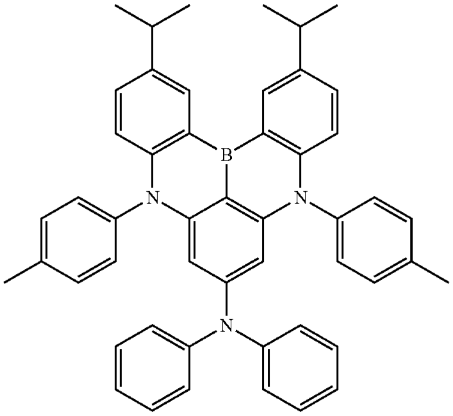

-continued
3-31
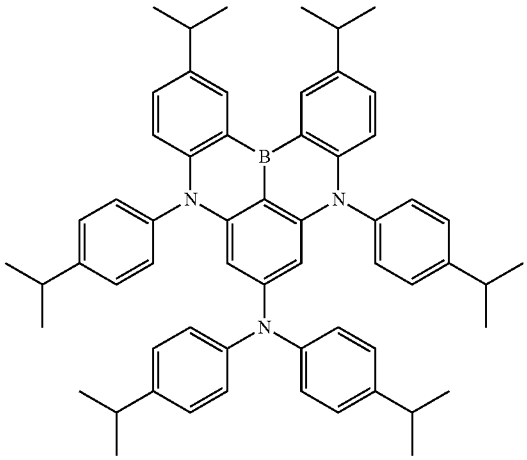
3-32
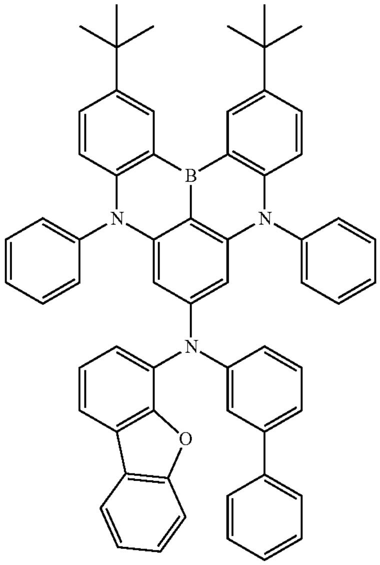
3-33
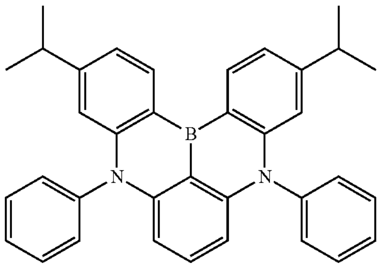
3-34
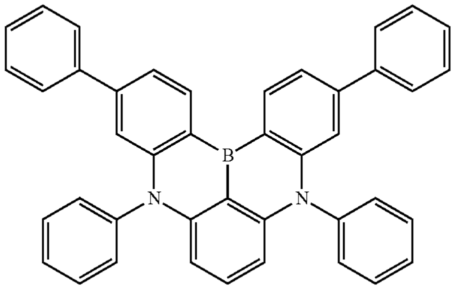
-continued
3-35
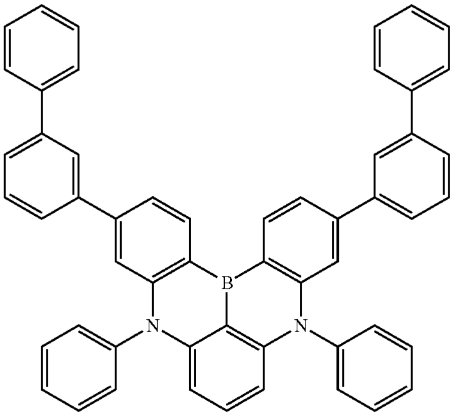
3-36
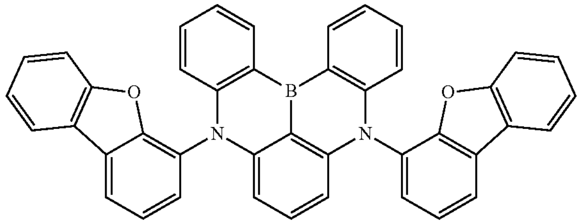
3-37
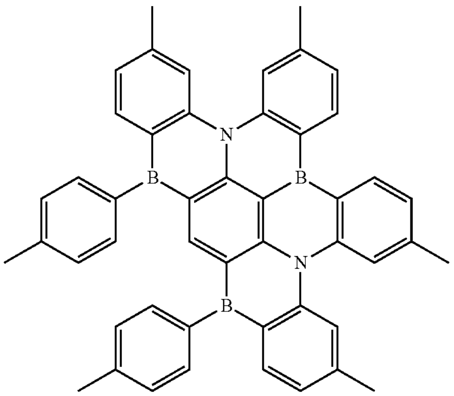
3-38
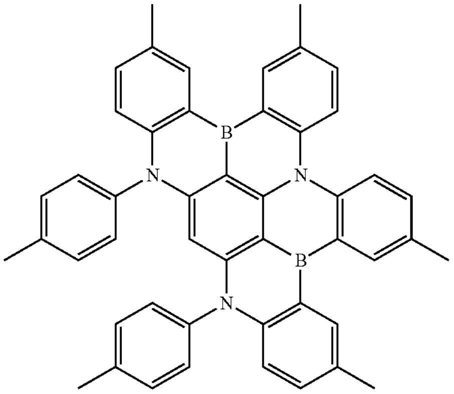

-continued 3-39

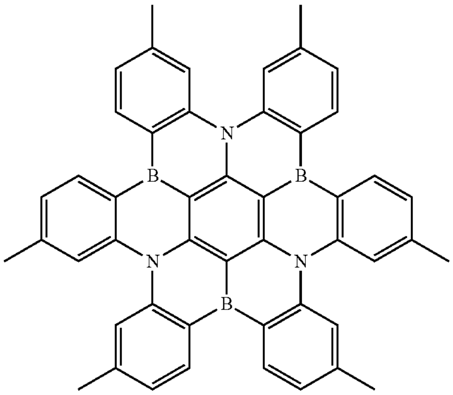

3-40

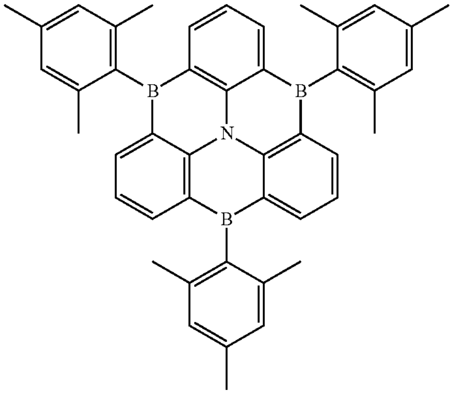

3-41

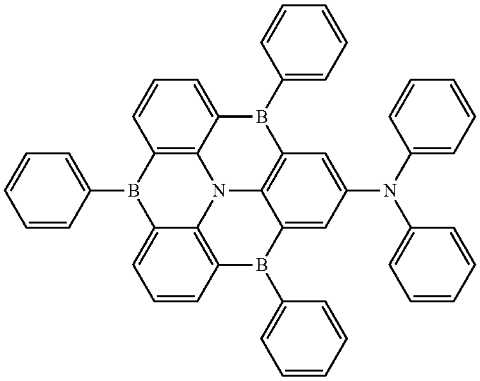

-continued 3-42

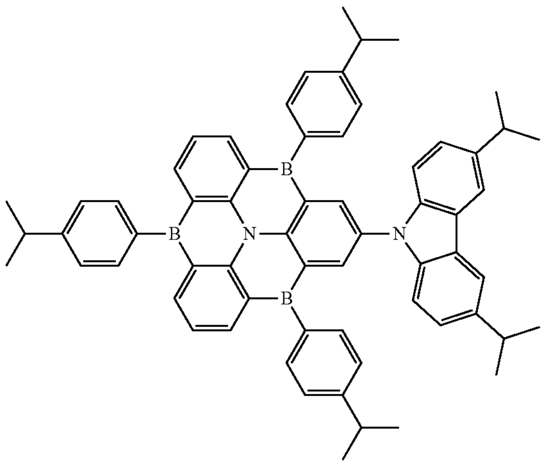

Because the first compound does not essentially include an electron transporting moiety, the first compound may be easily used for controlling hole transporting characteristics of the organic light-emitting device. For example, in some embodiments, the first compound is free of an electron transporting moiety. Because the third compound has relatively high hole trap characteristics (e.g., high hole trapping characteristics), an emission region may be biased to a set or specific region in the emission layer based on the presence of the third compound. Therefore, in order to uniformly (e.g., substantially uniformly) distribute the emission region of the organic light-emitting device including the third compound throughout the emission layer, characteristics of the hole transporting host may be important. The emission region may be widened throughout the emission layer through by way of the hole transport capability of the first compound. Therefore, the efficiency and/or lifespan of the organic light-emitting device including the first compound may be improved.

Because the second compound includes (or essentially includes) an electron transporting moiety, the second compound may improve or optimize charge balance in the emission layer. If electrons are not smoothly injected from the electron transport layer to the emission layer, charges are accumulated at an interface between the emission layer and the electron transport layer, and, as a result, the interface may be deteriorated. Therefore, the lifespan of the organic light-emitting device may be deteriorated. Because the first compound has a relatively high hole transporting characteristics, the lowest unoccupied molecular orbital (LUMO) energy level is not suitable for electron injection. Therefore, the second compound is included in the emission layer so as to adjust electrons injected into the emission layer. Consequently, an organic light-emitting device having improved lifespan may be provided.

The third compound may be a thermally activated delayed fluorescence (TADF) emitter.

The third compound may have a maximum emission wavelength in a range of about 450 nm to about 650 nm, but embodiments of the present disclosure are not limited thereto. For example, the third compound in the emission layer does not directly participate in the formation of excitons, and may receive energy from the formed excitons and emit red delayed fluorescence.

The organic light-emitting device may emit delayed fluorescence in a range of about 450 nm to about 650 nm, but embodiments of the present disclosure are not limited thereto.

The third compound may satisfy Condition 1 below:

$$\Delta E_{ST}(C_3) \leq 0.3 \text{ eV}. \qquad \text{Condition 1}$$

In Condition 1, $\Delta E_{ST}(C_3)$ is a difference between a lowest excitation singlet energy level ($E_{S1}(C_3)$) and a lowest excitation triplet energy level ($E_{T1}(C_3)$) of the third compound.

$E_{S1}(C_3)$ and $E_{T1}(C_3)$ may be evaluated by a density functional theory (DFT) method, utilizing any suitable version of the "Gaussian" software program, for example, where the compound is structurally optimized utilizing a B3LYP hybrid functional and a 6-31G(d,p) basis set.

When Condition 1 is satisfied, suitably or sufficiently high reverse intersystem crossing (RISC) efficiency may be obtained even at room temperature.

Because the organic light-emitting device has an energy level sufficient to emit fluorescence at or from the third compound, an organic light-emitting device with high color purity may be provided. In addition, because the second compound has suitably or sufficiently high RISC efficiency even at room temperature, the triplet energy of the first compound that may not participate in light emission may all (or substantially all) transfer to the third compound, and excitons that would otherwise disappear or dissociate without participating in light emission may be minimized or reduced, thereby improving the efficiency of the organic light-emitting device.

An amount of the first compound in the emission layer may be in a range of about 10 wt % to about 90 wt % based on the total weight of the emission layer, but embodiments of the present disclosure are not limited thereto.

An amount of the second compound in the emission layer may be in a range of about 10 wt % to about 90 wt % based on the total weight of the emission layer, but embodiments of the present disclosure are not limited thereto.

An amount of the third compound in the emission layer may be in a range of about 0.5 wt % to about 5 wt % based on the total weight of the emission layer, but embodiments of the present disclosure are not limited thereto.

An amount of the third compound may be in a range of about 0.01 parts by weight to about 30 parts by weight based on 100 parts by weight of the first compound and the second compound, but embodiments of the present disclosure are not limited thereto.

When the first compound, the second compound, and the third compound satisfy these ranges, an organic light-emitting device having both improved efficiency and improved lifespan may be provided.

In one embodiment, the emission layer may include (or consist of) the first compound, the second compound, and the third compound, but embodiments of the present disclosure are not limited thereto.

In one embodiment, the first electrode may be an anode, the second electrode may be a cathode, the organic layer may further include a hole transport region between the first electrode and the emission layer and/or an electron transport region between the emission layer and the second electrode, the hole transport region may include a hole injection layer, a hole transport layer, an emission auxiliary layer, an electron blocking layer, or any combination thereof, and the electron transport region may include a hole blocking layer, an electron transport layer, an electron injection layer, or any combination thereof, but embodiments of the present disclosure are not limited thereto.

Description of FIG. 1

FIG. 1 is a schematic view of an organic light-emitting device 10 according to an embodiment. The organic light-emitting device 10 includes a first electrode 110, an organic layer 150, and a second electrode 190.

Hereinafter, the structure of the organic light-emitting device 10 according to an embodiment and a method of manufacturing the organic light-emitting device 10 will be described in connection with FIG. 1.

First Electrode 110

In FIG. 1, a substrate may be additionally under the first electrode 110 or above the second electrode 190. The substrate may be a glass substrate or a plastic substrate, each having excellent mechanical strength, thermal stability, transparency, surface smoothness, ease of handling, and water resistance.

The first electrode 110 may be formed by depositing or sputtering a material for forming the first electrode 110 on the substrate. When the first electrode 110 is an anode, the material for a first electrode may be selected from materials having a high work function to facilitate hole injection.

The first electrode 110 may be a reflective electrode, a semi-transmissive electrode, or a transmissive electrode. When the first electrode 110 is a transmissive electrode, a material for forming a first electrode may be selected from indium tin oxide (ITO), indium zinc oxide (IZO), tin oxide ($SnO_2$), zinc oxide (ZnO), and any combinations thereof, but embodiments of the present disclosure are not limited thereto. In one or more embodiments, when the first electrode 110 is a semi-transmissive electrode or a reflectable electrode, a material for forming a first electrode may be selected from magnesium (Mg), silver (Ag), aluminum (Al), aluminum-lithium (Al—Li), calcium (Ca), magnesium-indium (Mg—In), magnesium-silver (Mg—Ag), and any combinations thereof, but embodiments of the present disclosure are not limited thereto.

The first electrode 110 may have a single-layered structure, or a multi-layered structure including two or more layers. For example, the first electrode 110 may have a three-layered structure of ITO/Ag/ITO, but the structure of the first electrode 110 is not limited thereto.

Organic Layer 150

The organic layer 150 is on the first electrode 110. The organic layer 150 may include an emission layer.

The organic layer 150 may further include a hole transport region between the first electrode 110 and the emission layer, and an electron transport region between the emission layer and the second electrode 190.

Hole Transport Region in Organic Layer 150

The hole transport region may have i) a single-layered structure including a single layer including a single material, ii) a single-layered structure including a single layer including a plurality of different materials, or iii) a multi-layered structure having a plurality of layers including a plurality of different materials.

The hole transport region may include at least one layer selected from a hole injection layer, a hole transport layer, an emission auxiliary layer, and an electron blocking layer.

For example, the hole transport region may have a single-layered structure including a single layer including a plurality of different materials, or a multi-layered structure having a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein for each structure, constituting layers are sequentially stacked from the first electrode 110 in this stated order, but the structure of the hole transport region is not limited thereto.

The hole transport region may include at least one selected from m-MTDATA, TDATA, 2-TNATA, NPB (NPD), p-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, and a compound represented by Formula 202:

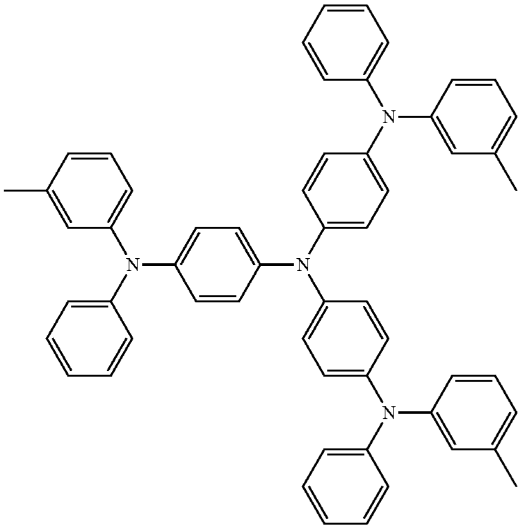

m-MTDATA

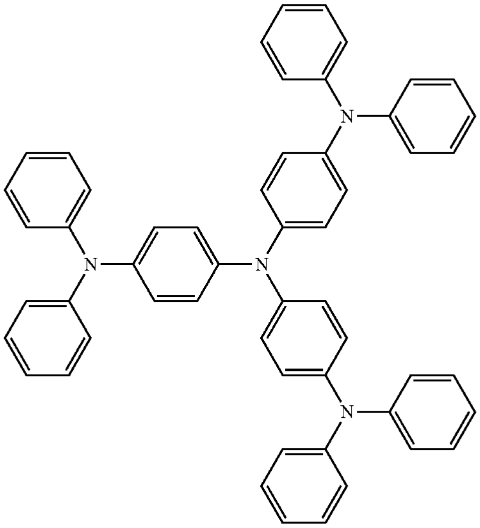

TDATA

-continued

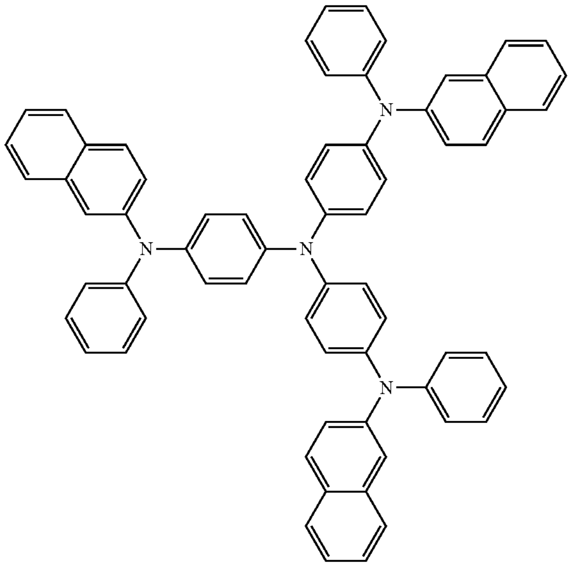

2-TNATA

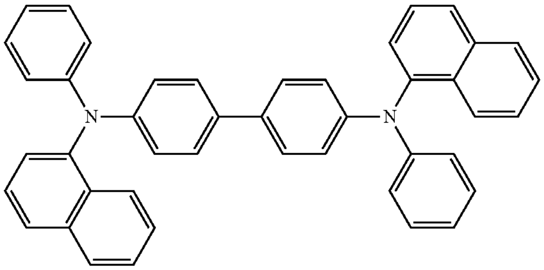

NPB

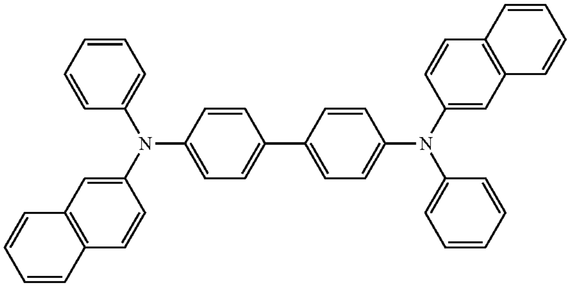

β-NPB

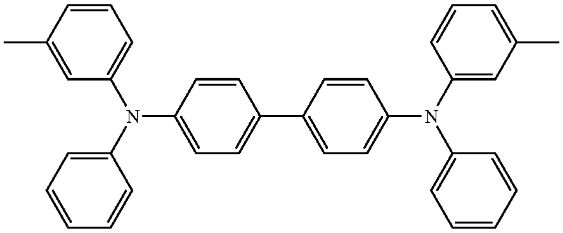

TPD

-continued

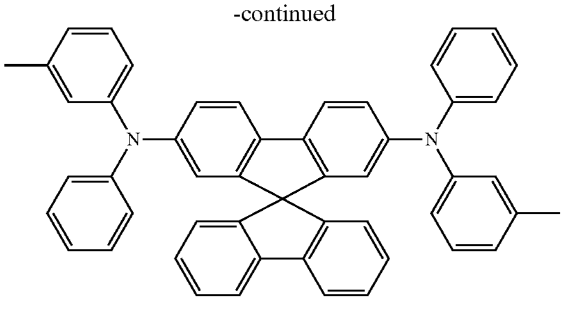

Spiro-TPD

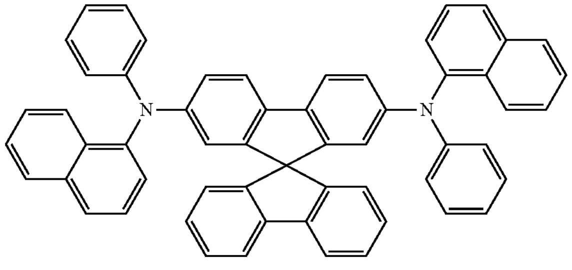

Spiro-NPB

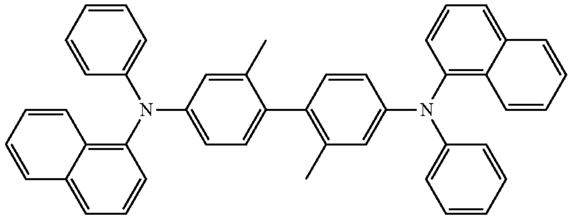

methylated NPB

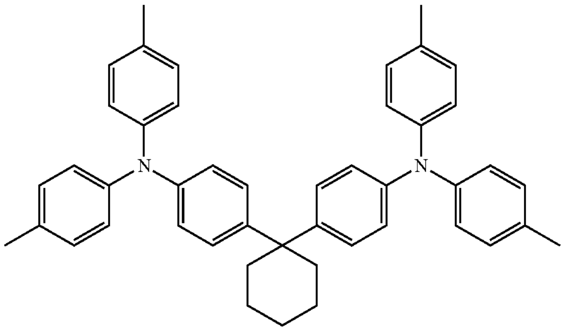

TAPC

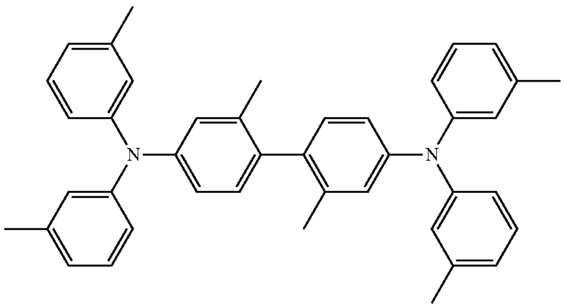

HMTPD

Formula 201

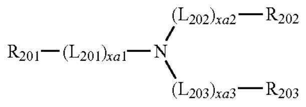

-continued

Formula 202

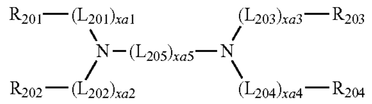

In Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N(Q201)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer from 0 to 3, xa5 may be an integer from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In one embodiment, in Formula 202, $R_{201}$ and $R_{202}$ may optionally be linked via a single bond, a dimethyl-methylene group, or a diphenyl-methylene group, and $R_{203}$ and $R_{204}$ may optionally be linked via a single bond, a dimethyl-methylene group, or a diphenyl-methylene group.

In one embodiment, in Formulae 201 and 202, $L_{201}$ to $L_{205}$ may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, and —$N(Q_{31})(Q_{32})$, and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xa1 to xa4 may each independently be 0, 1, or 2.

In one or more embodiments, xa5 may be 1, 2, 3, or 4.

In one or more embodiments, $R_{201}$ to $R_{204}$ and $Q_{201}$ may each independently be selected from:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, and —$N(Q_{31})(Q_{32})$, and $Q_{31}$ to $Q_{33}$ are the same as described above.

In one or more embodiments, in Formula 201, at least one selected from $R_{201}$ to $R_{203}$ may be selected from:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

In one or more embodiments, in Formula 202, i) $R_{201}$ and $R_{202}$ may be linked via a single bond, and/or ii) $R_{203}$ and $R_{204}$ may be linked via a single bond.

In one or more embodiments, in Formula 202, at least one selected from $R_{201}$ to $R_{204}$ may be selected from:

a carbazolyl group; and a carbazolyl group substituted at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

The compound represented by Formula 201 may be represented by Formula 201A:

Formula 201A

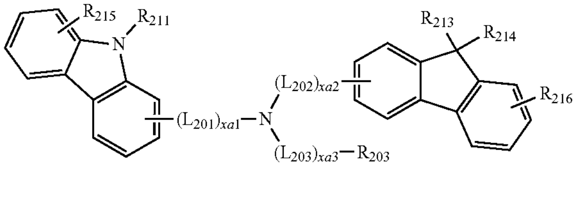

In one embodiment, the compound represented by Formula 201 may be represented by Formula 201A(1) below, but embodiments of the present disclosure are not limited thereto:

Formula 201A(1)

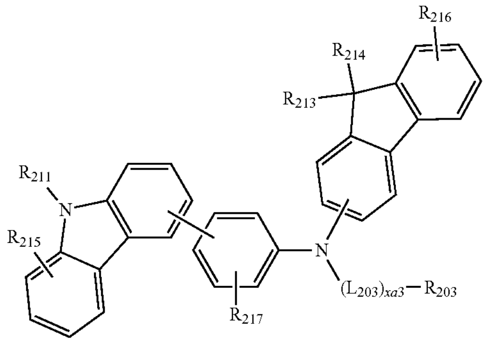

In one embodiment, the compound represented by Formula 201 may be represented by Formula 201A-1 below, but embodiments of the present disclosure are not limited thereto:

Formula 201A-1

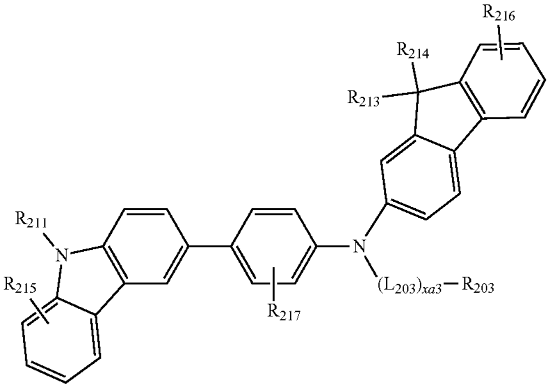

In one embodiment, the compound represented by Formula 202 may be represented by Formula 202A:

Formula 202A

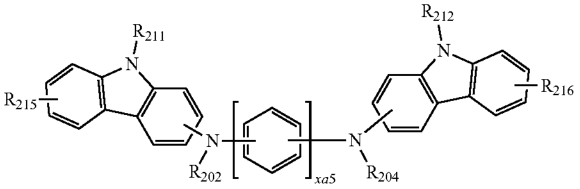

In one embodiment, the compound represented by Formula 202 may be represented by Formula 202A-1:

Formula 202A-1

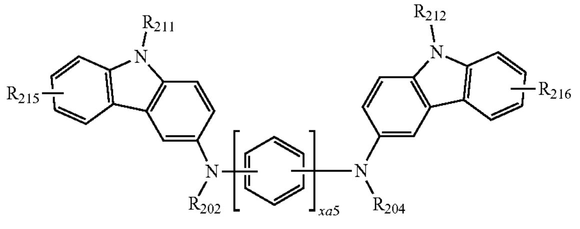

In Formulae 201A, 201A(1), 201A-1, 202A, and 202A-1, $L_{201}$ to $L_{203}$, xa1 to xa3, xa5, and $R_{202}$ to $R_{204}$ are the same as described above, $R_{211}$ and $R_{212}$ may be the same as defined in connection with $R_{203}$, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region may include at least one compound selected from Compounds HT1 to HT39, but embodiments of the present disclosure are not limited thereto:

HT1

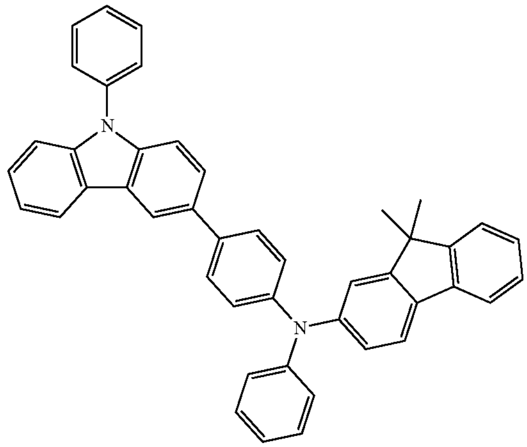

HT2

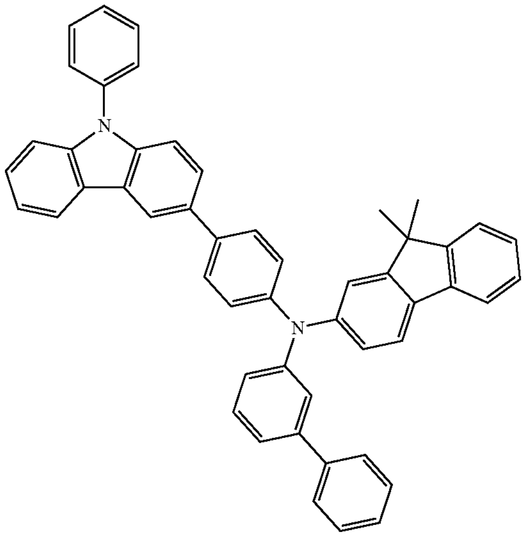

HT3

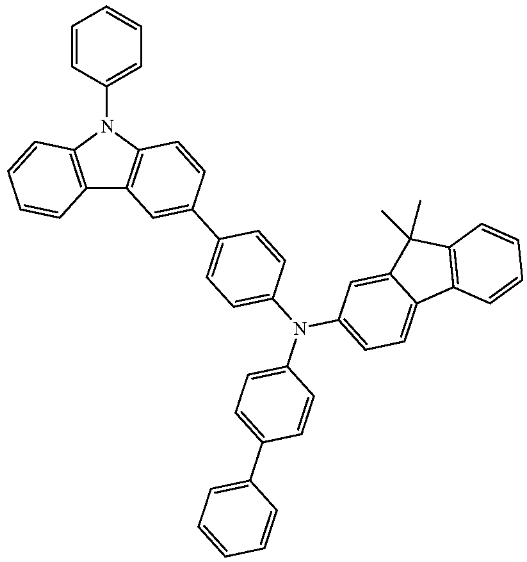

HT4

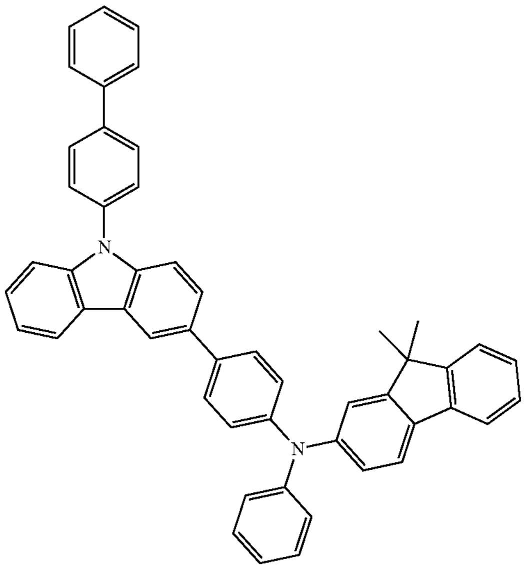

-continued
HT5
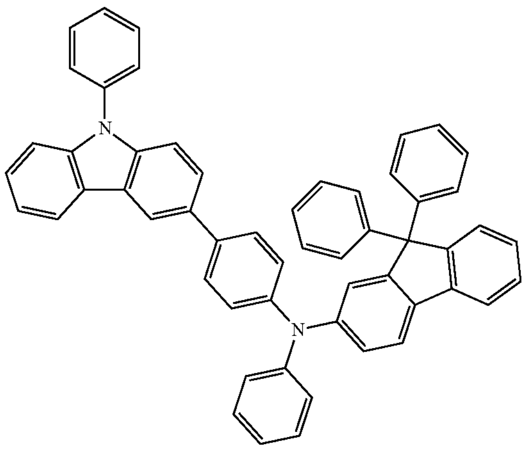
HT6
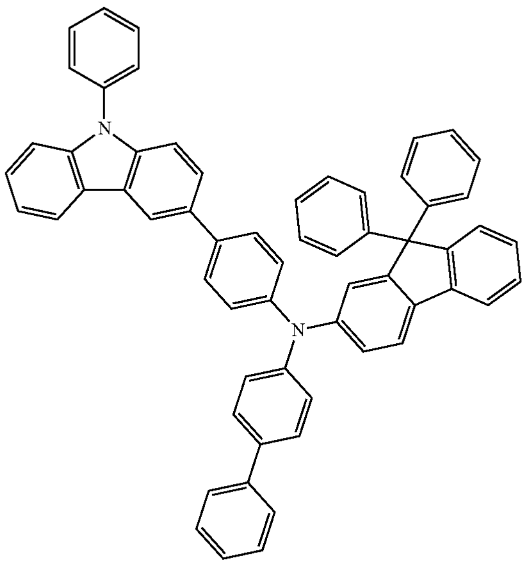
HT7
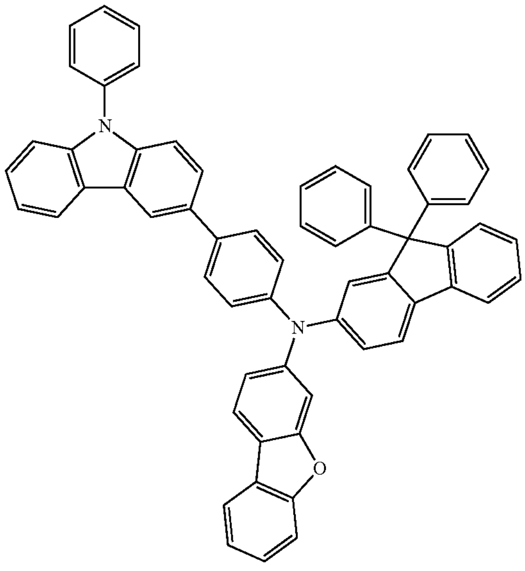
HT8
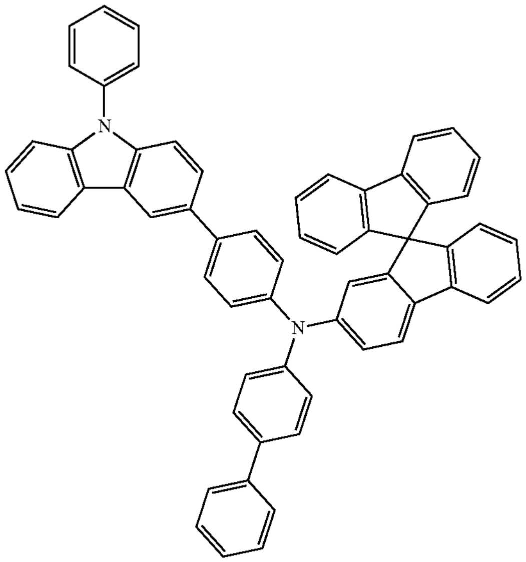

-continued
HT9
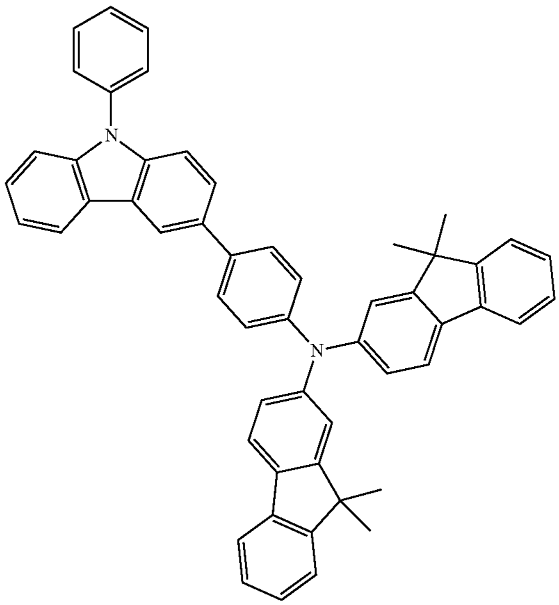
HT10
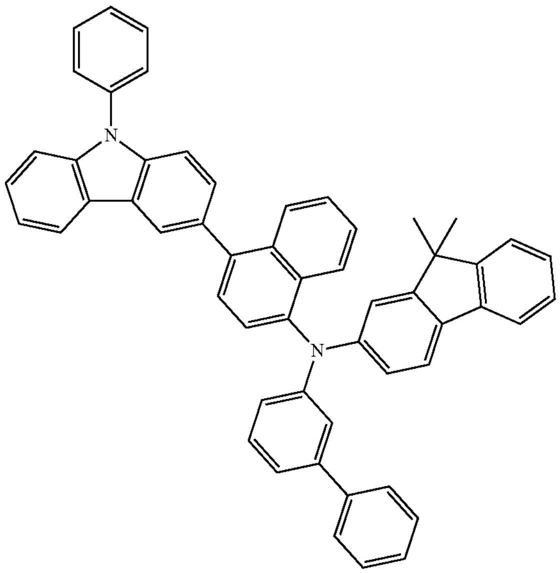
HT11
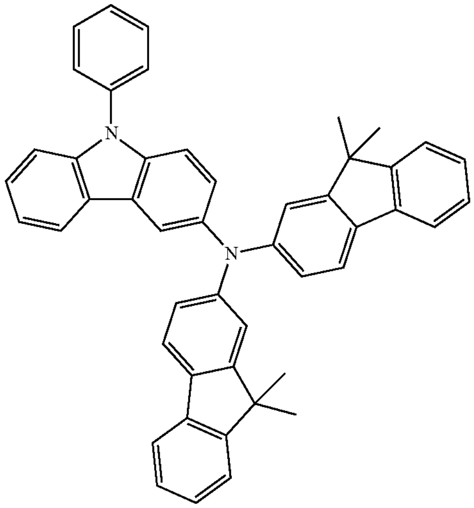
HT12
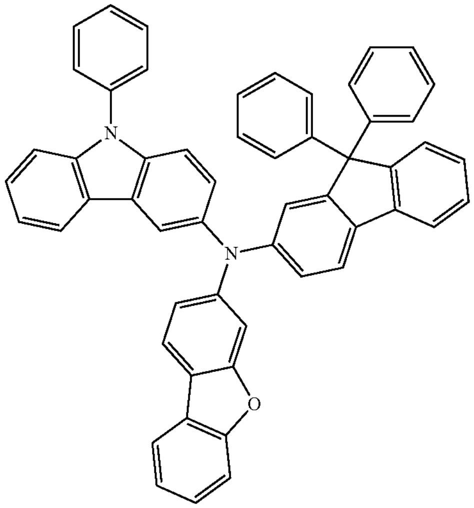

-continued
HT13
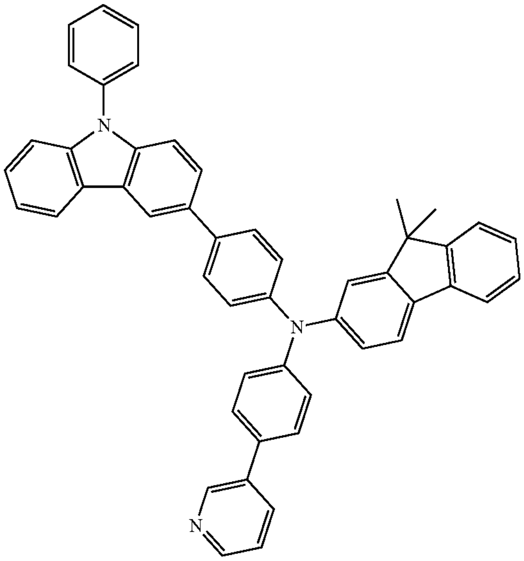
HT14
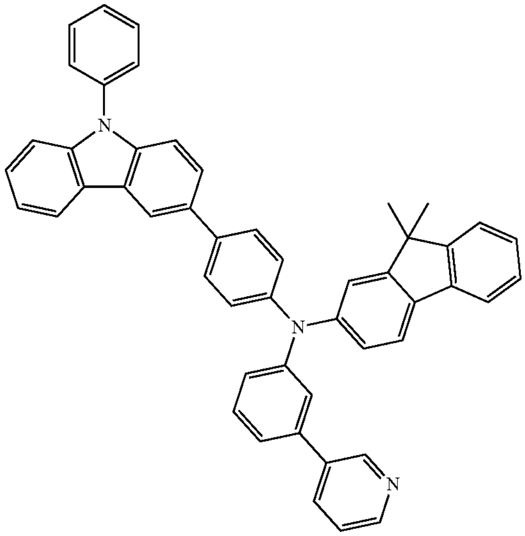
HT15
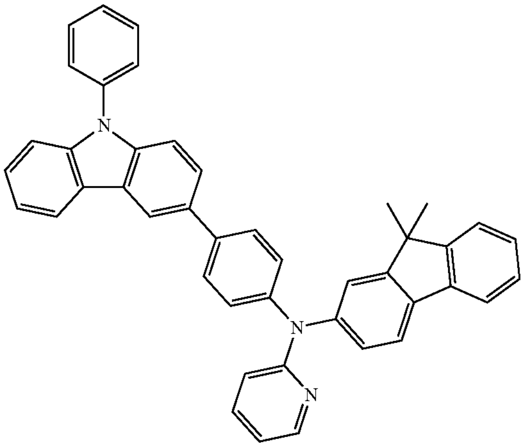
HT16
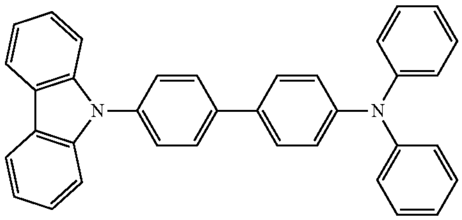
HT17
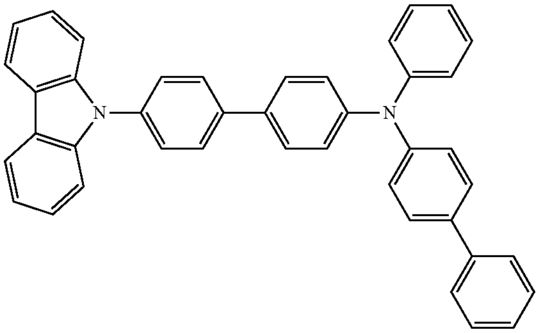
HT18
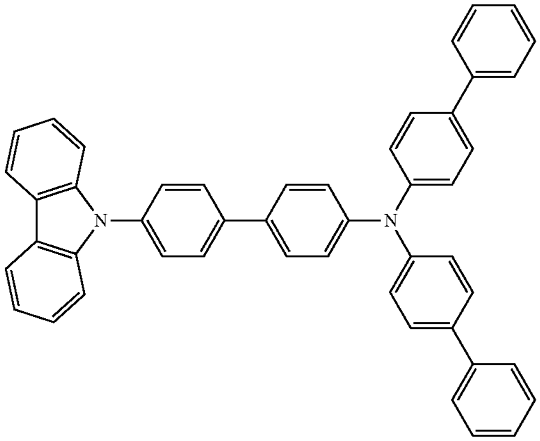

-continued
HT19
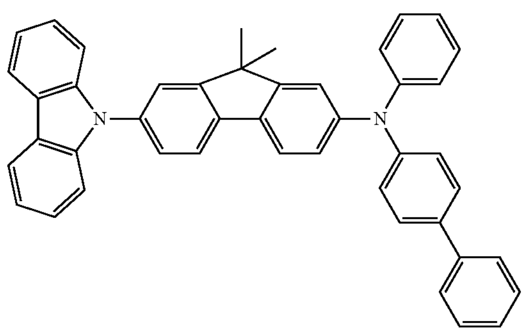
HT20
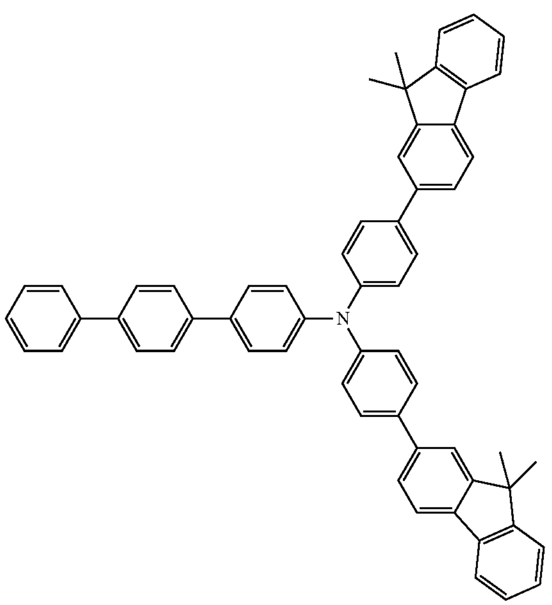
HT21
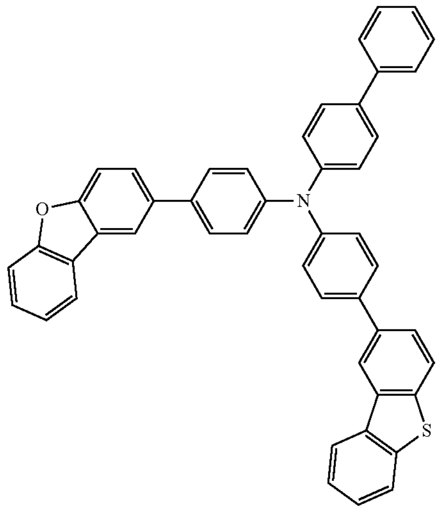
HT22
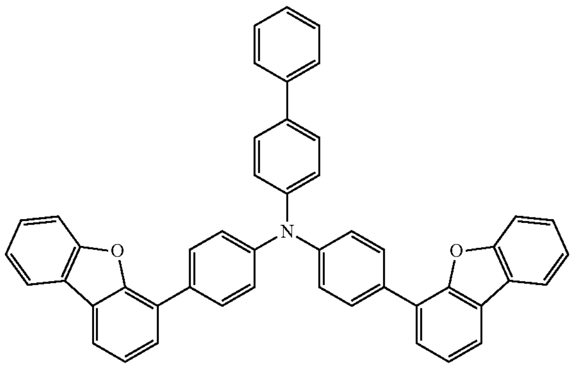
HT23
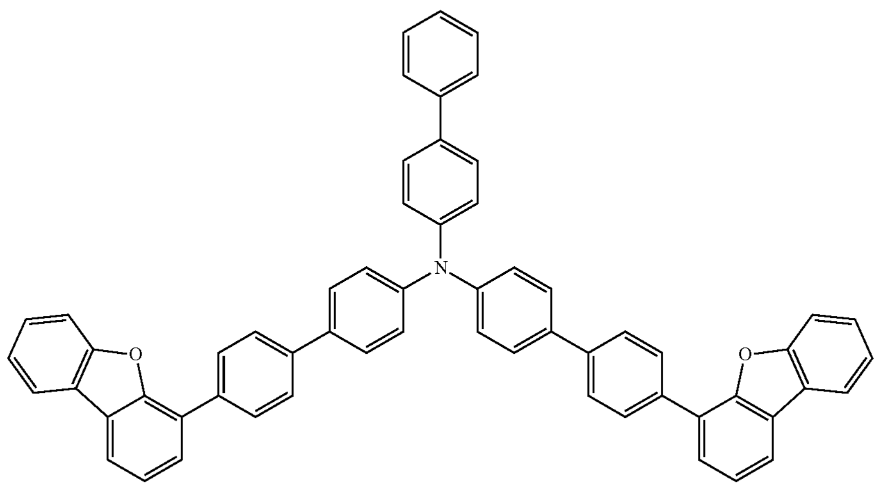

-continued
HT24
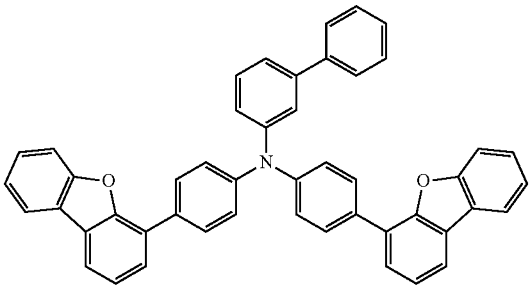
HT25
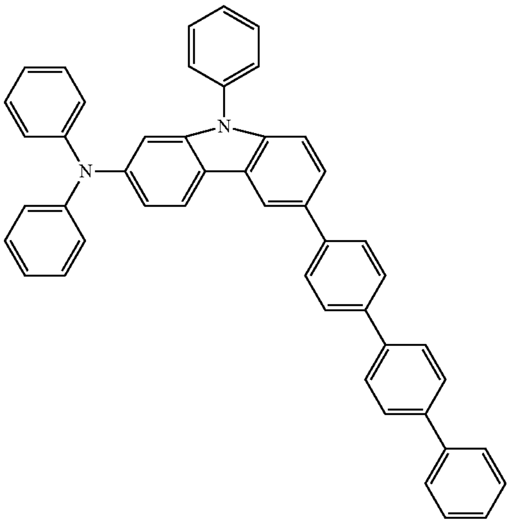
HT26
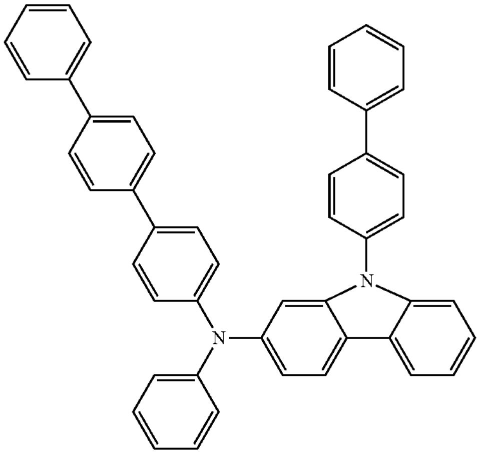
HT27
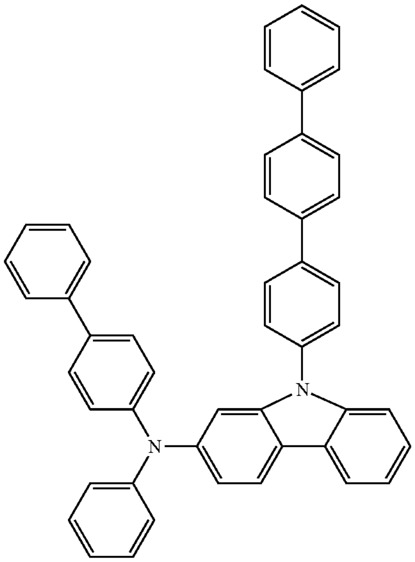
HT28
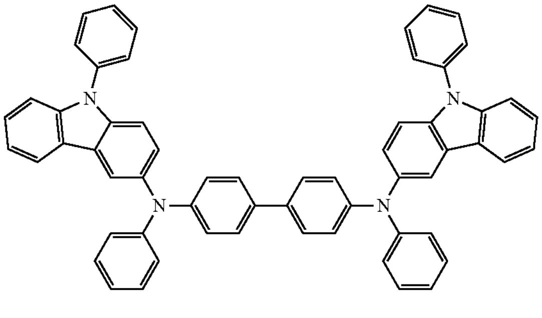
HT29
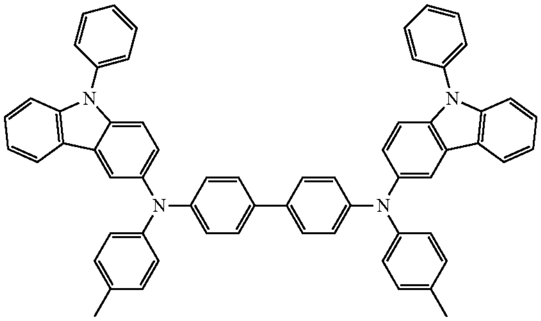

-continued
HT30
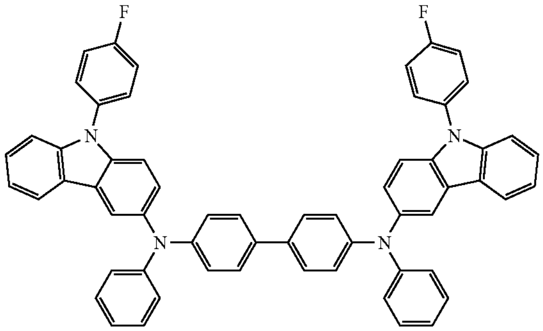
HT31
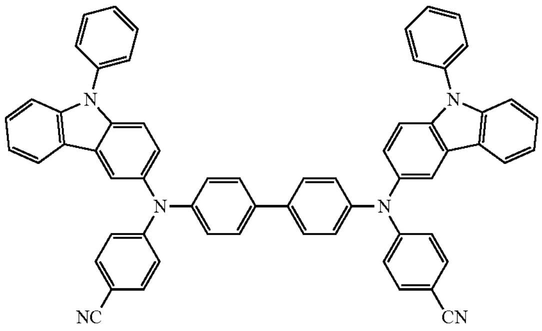
HT32
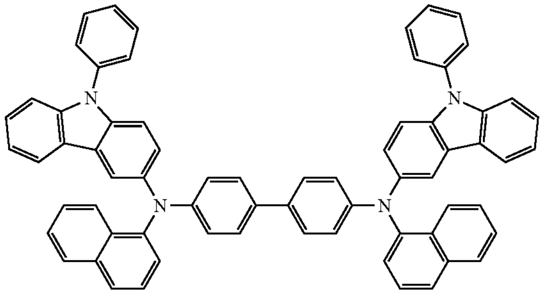
HT33
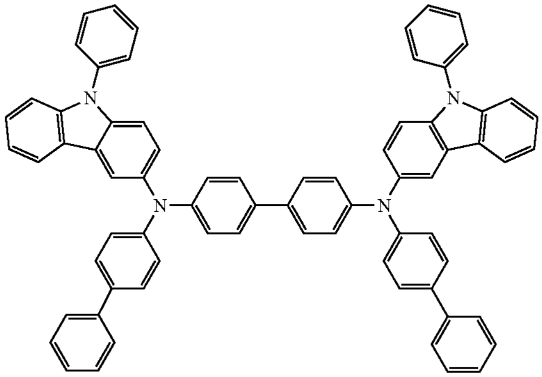
HT34
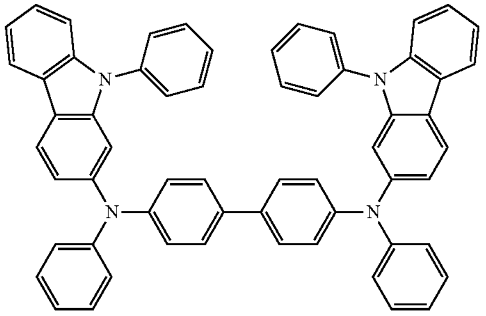
HT35
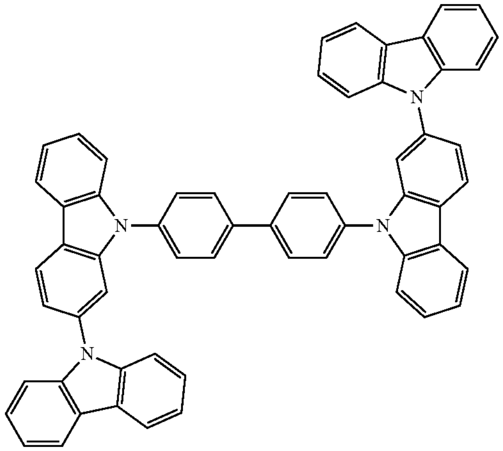
HT36
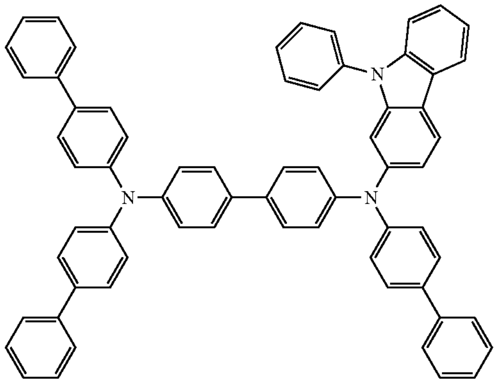
HT37
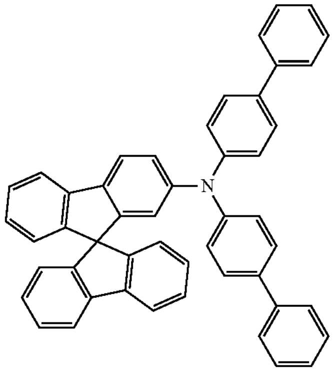

-continued

HT38

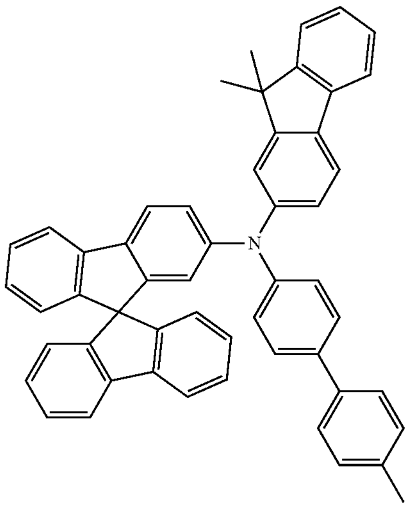

HT39

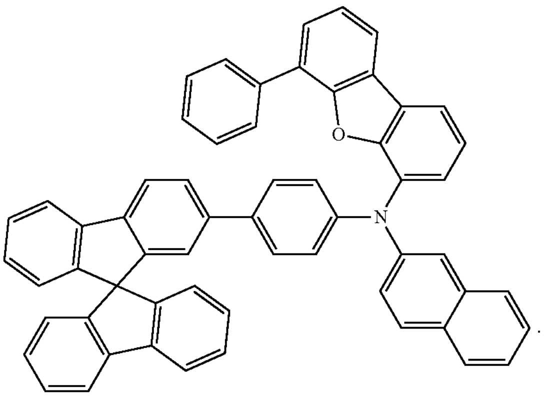

A thickness of the hole transport region may be in a range of about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example about 100 Å to about 1,500 Å. When the thicknesses of the hole transport region, the hole injection layer, and the hole transport layer are within these ranges, suitable or satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block the flow of electrons from an electron transport region. The emission auxiliary layer and the electron blocking layer may include the materials as described above.

p-Dopant

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant.

In one embodiment, the p-dopant may have a LUMO level in a range of about −3.5 eV or less.

The p-dopant may include at least one selected from a quinone derivative, a metal oxide, and a cyano group-containing compound, but embodiments of the present disclosure are not limited thereto.

For example, the p-dopant may include at least one selected from:

- a quinone derivative, such as tetracyanoquinodimethane (TCNQ) or 2,3,5,6-tetrafluoro-7,7,8,8-tetracyanoquinodimethane (F4-TCNQ);
- a metal oxide, such as tungsten oxide or molybdenum oxide;
- 1,4,5,8,9,11-hexaazatriphenylene-hexacarbonitrile (HAT-CN); and
- a compound represented by Formula 221 below, but embodiments of the present disclosure are not limited thereto:

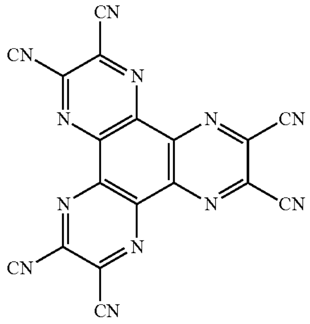

HAT—CN

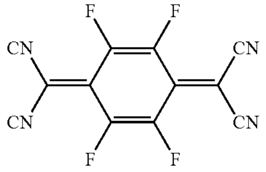

F4—TCNQ

Formula 221

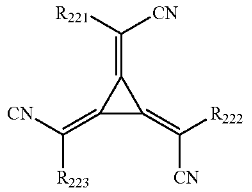

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ may have at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

Emission Layer in Organic Layer 150

When the organic light-emitting device 10 is a full-color organic light-emitting device, the emission layer may be patterned into a red emission layer, a green emission layer, or a blue emission layer, according to a sub-pixel. In one or more embodiments, the emission layer may have a stacked structure of two or more layers selected from a red emission layer, a green emission layer, and a blue emission layer, in which the two or more layers contact each other or are separated from each other. In one or more embodiments, the emission layer may include two or more materials selected from a red light-emitting material, a green light-emitting material, and a blue light-emitting material, in which the two or more materials are mixed with each other in a single layer to emit white light.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Electron Transport Region in Organic Layer 150

The electron transport region may have i) a single-layered structure including a single layer including a single material, ii) a single-layered structure including a single layer including a plurality of different materials, or iii) a multi-layered structure having a plurality of layers including a plurality of different materials.

The electron transport region may include at least one selected from a buffer layer, a hole blocking layer, an electron control layer, an electron transport layer, and an electron injection layer, but embodiments of the present disclosure are not limited thereto.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein for each structure, constituting layers are sequentially stacked from an emission layer. However, embodiments of the structure of the electron transport region are not limited thereto.

The electron transport region (for example, a buffer layer, a hole blocking layer, an electron control layer, or an electron transport layer in the electron transport region) may include a metal-free compound containing at least one π electron-depleted nitrogen-containing ring.

The term "π electron-depleted nitrogen-containing ring," as used herein, indicates a $C_1$-$C_{60}$ heterocyclic group having at least one *—N=*' moiety as a ring-forming moiety.

For example, the "π electron-depleted nitrogen-containing ring" may be i) a 5-membered to 7-membered heteromonocyclic group having at least one *—N=*' moiety, ii) a heteropolycyclic group in which two or more 5-membered to 7-membered heteromonocyclic groups each having at least one *—N=*' moiety are condensed with each other (e.g., combined together), or iii) a heteropolycyclic group in which at least one of 5-membered to 7-membered heteromonocyclic groups, each having at least one *—N=*' moiety, is condensed with (e.g., combined with) at least one $C_5$-$C_{60}$ carbocyclic group.

Examples of the π electron-depleted nitrogen-containing ring include an imidazole, a pyrazole, a thiazole, an isothiazole, an oxazole, an isoxazole, a pyridine, a pyrazine, a pyrimidine, a pyridazine, an indazole, a purine, a quinoline, an isoquinoline, a benzoquinoline, a phthalazine, a naphthyridine, a quinoxaline, a quinazoline, a cinnoline, a phenanthridine, an acridine, a phenanthroline, a phenazine, a benzimidazole, an isobenzothiazole, a benzoxazole, an isobenzoxazole, a triazole, a tetrazole, an oxadiazole, a triazine, thiadiazole, an imidazopyridine, an imidazopyrimidine, and an azacarbazole, but are not limited thereto.

For example, the electron transport region may include a compound represented by Formula 601:

$$[Ar_{601}]_{xe11}\text{-}[(L_{601})_{xe1}\text{-}R_{601}]_{xe21}. \qquad \text{Formula 601}$$

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_{601})(Q_{602})(Q_{603})$, $—C(=O)(Q_{601})$, $—S(=O)_2(Q_{601})$, and $—P(=O)(Q_{601})(Q_{602})$, $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In one embodiment, at least one of $Ar_{601}$(S) in the number of xe11 and $R_{601}$(s) in the number of xe21 may include the π electron-depleted nitrogen-containing ring.

In one embodiment, ring $Ar_{601}$ in Formula 601 may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), and —P(=O)($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is two or more, two or more $Ar_{601}$(S) may be linked via a single bond.

In one or more embodiments, $Ar_{601}$ in Formula 601 may be an anthracene group.

In one or more embodiments, a compound represented by Formula 601 may be represented by Formula 601-1:

Formula 601-1

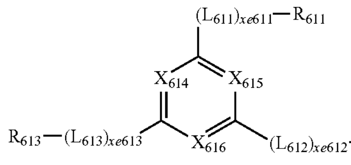

In Formula 601-1, $X_{614}$ may be N or C($R_{614}$), $X_{615}$ may be N or C($R_{615}$), $X_{616}$ may be N or C($R_{616}$), and at least one selected from $X_{614}$ to $X_{616}$ may be N, $L_{611}$ to $L_{613}$ may each independently be defined in connection with $L_{601}$, xe611 to xe613 may each independently be defined in connection with xe1, $R_{611}$ to $R_{613}$ may each independently be defined in connection with $R_{601}$, $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one embodiment, $L_{601}$ and $L_{611}$ to $L_{613}$ in Formulae 601 and 601-1 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments of the present disclosure are not limited thereto.

In one or more embodiments, xe1 and xe611 to xe613 in Formulae 601 and 601-1 may each independently be 0, 1, or 2.

In one or more embodiments, $R_{601}$ and $R_{611}$ to $R_{613}$ in Formulae 601 and 601-1 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(=O)$_2$(Q$_{601}$) and —P(=O)(Q$_{601}$)(Q$_{602}$), and Q$_{601}$ and Q$_{602}$ are the same as described above.

The electron transport region may include at least one compound selected from Compounds ET1 to ET36, but embodiments of the present disclosure are not limited thereto:

ET1

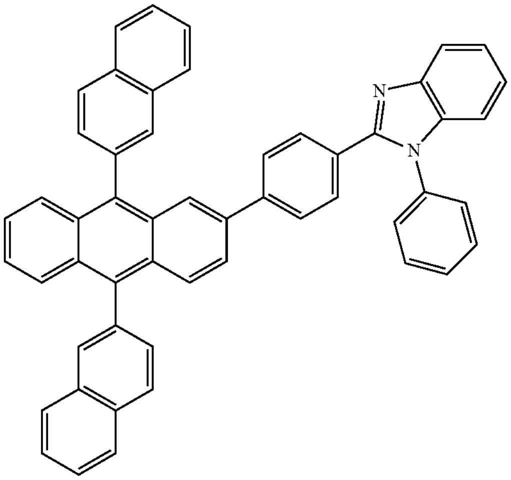

ET2

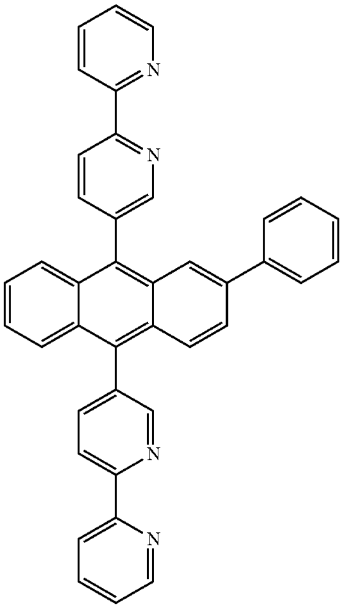

-continued

ET3

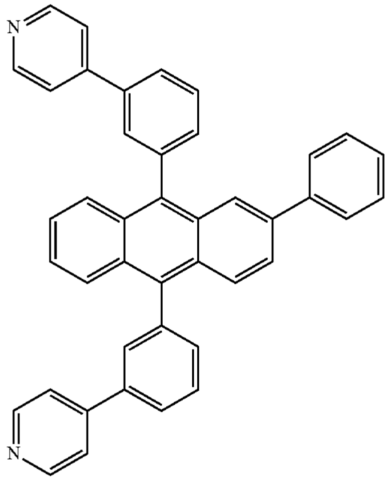

ET4

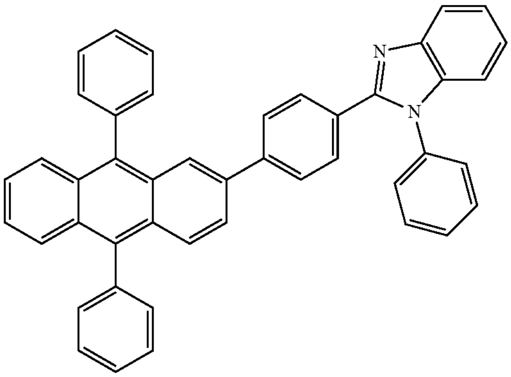

ET5

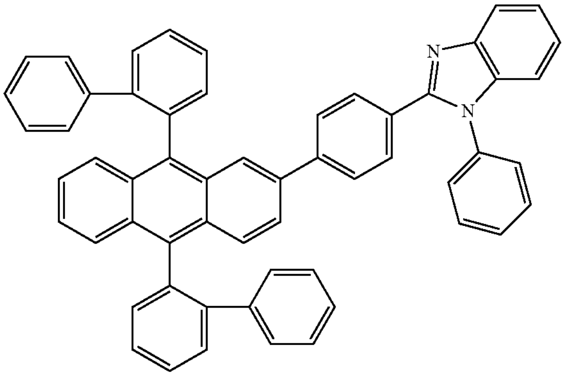

-continued
ET6
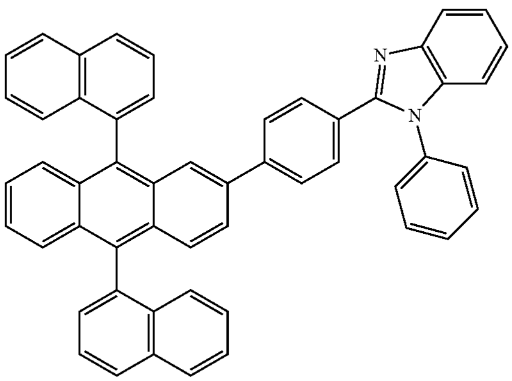
ET7
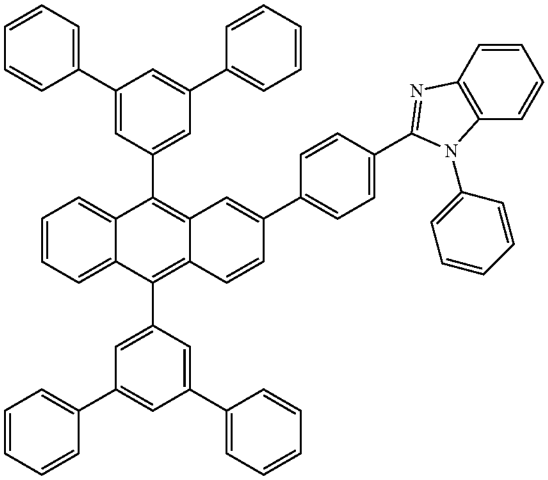
ET8
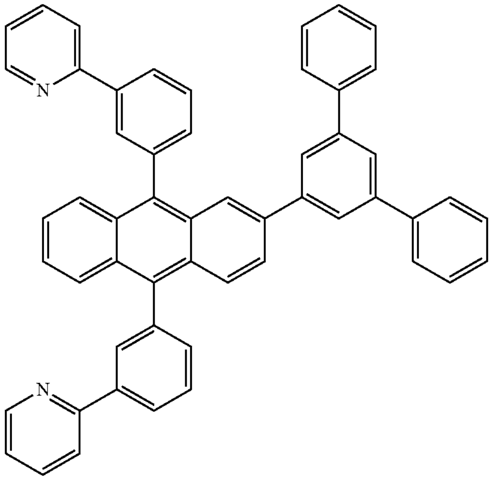
-continued
ET9
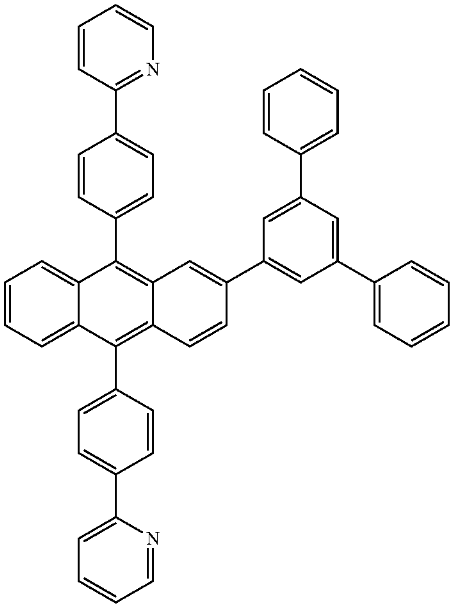
ET10
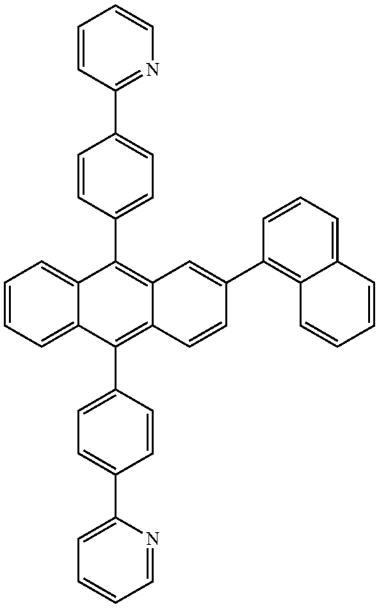

-continued
ET11
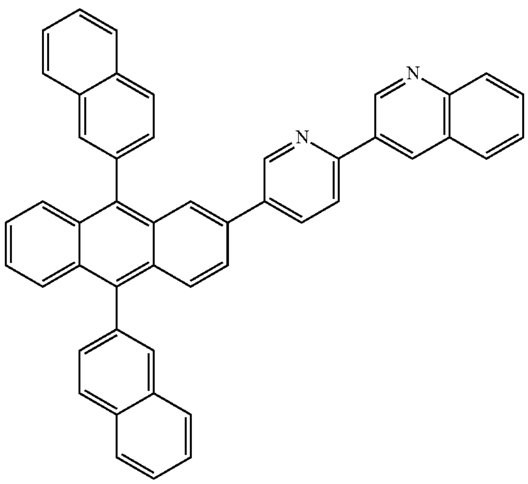
ET12
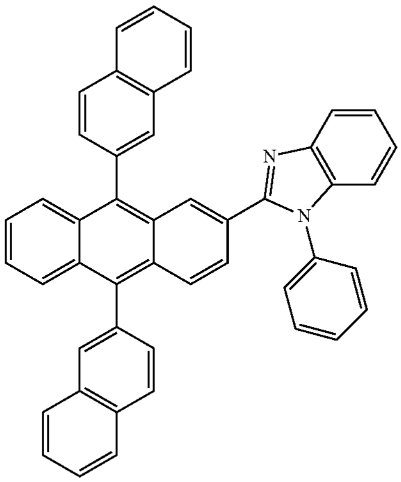
ET13
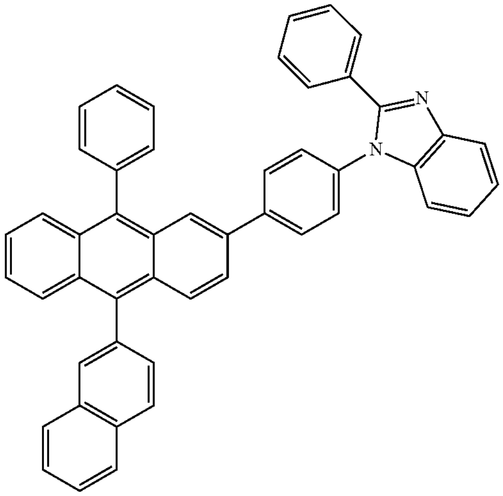
-continued
ET14
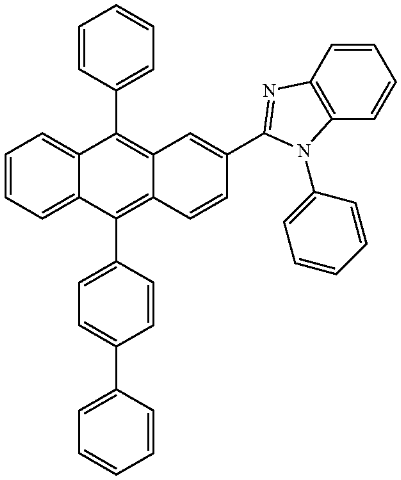
ET15
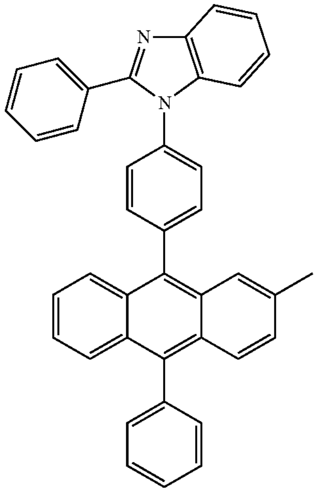
ET16
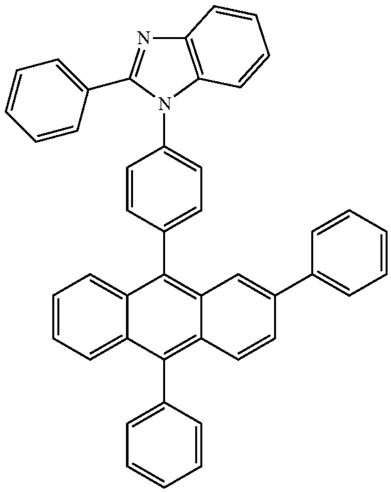

-continued
ET17
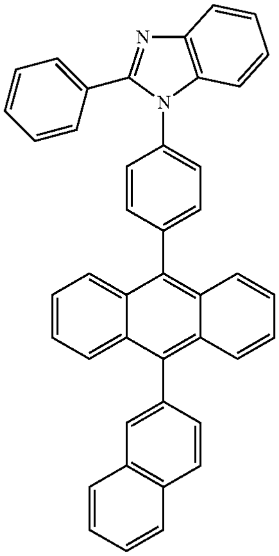
ET18
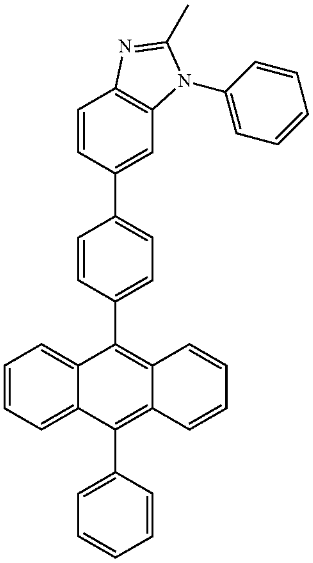
ET19
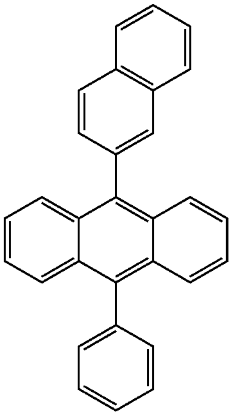
-continued
ET20
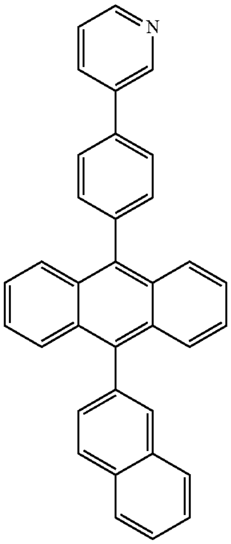
ET21
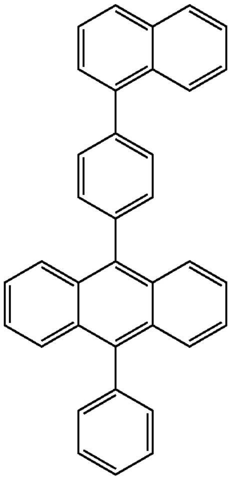
ET22
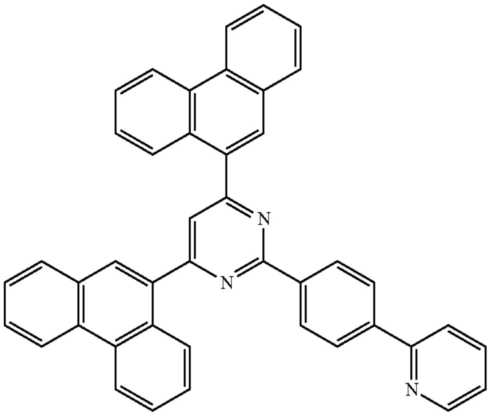

-continued
ET23
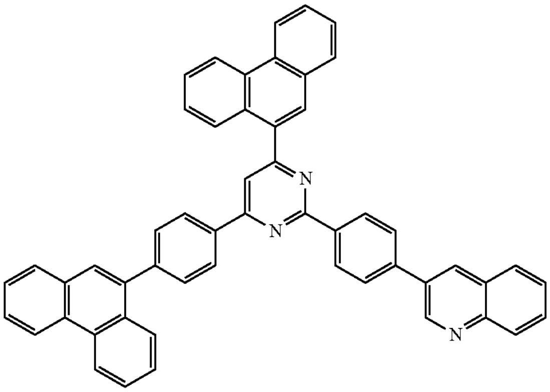
ET24
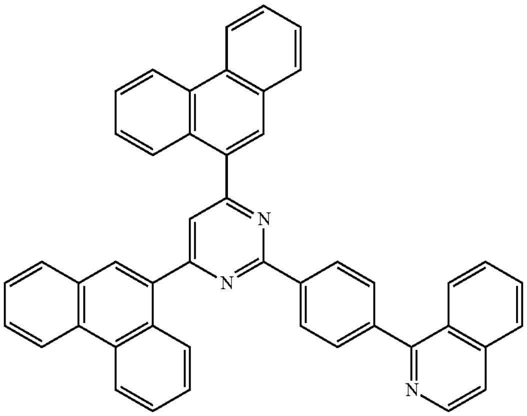
ET25
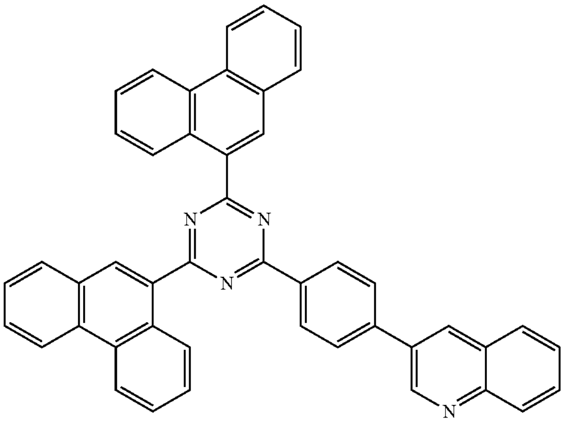
-continued
ET26
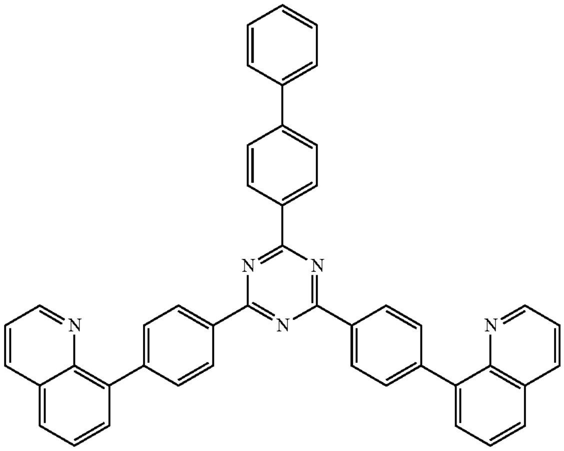
ET27
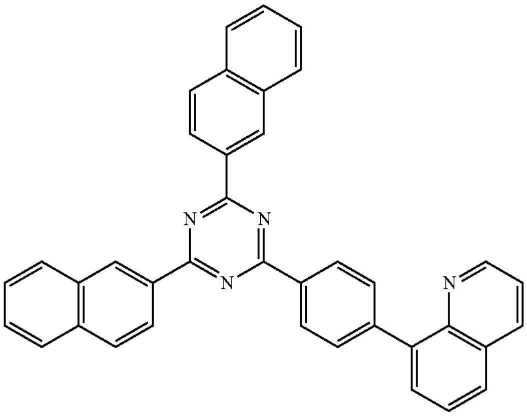
ET28
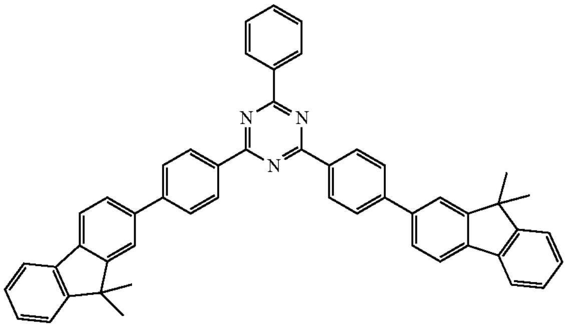

-continued
ET29
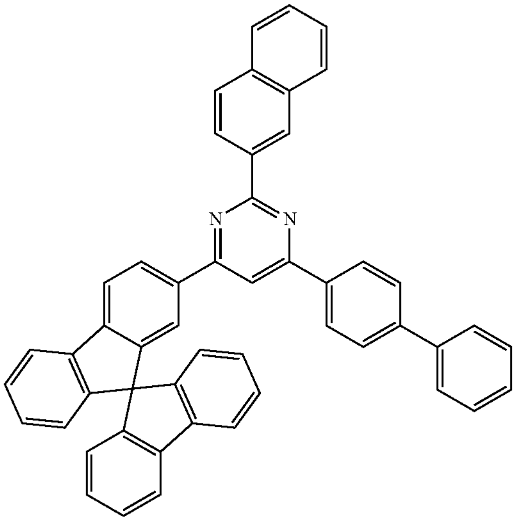
ET30
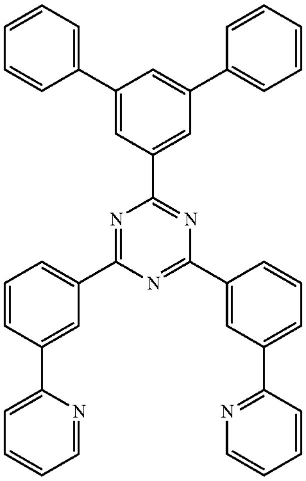
ET31
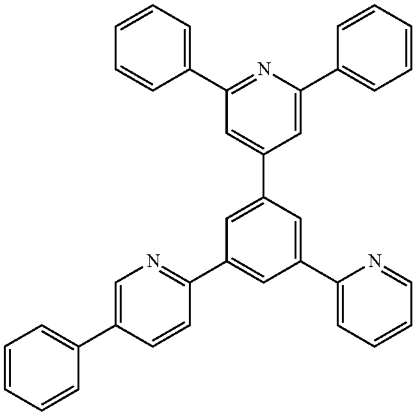
-continued
ET32
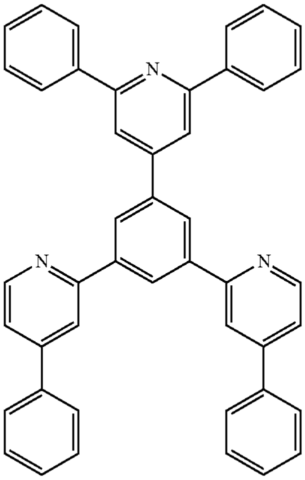
ET33
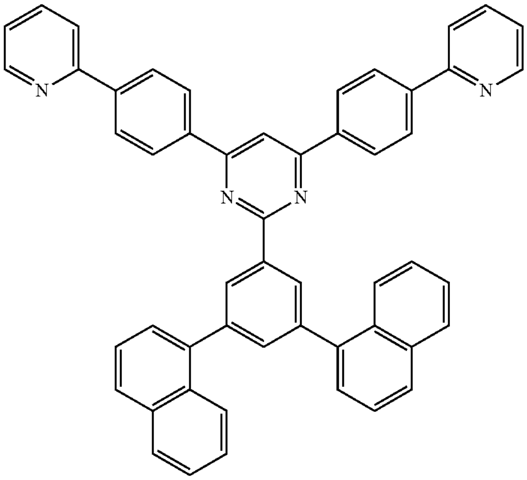
ET34
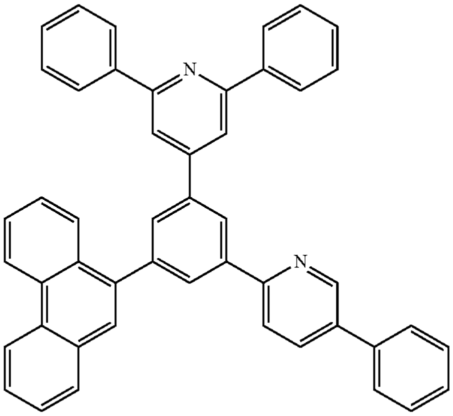

-continued

ET35

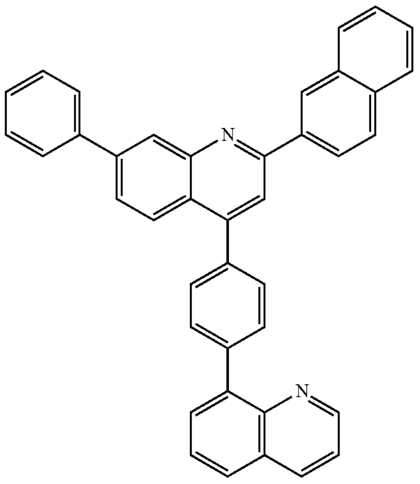

ET36

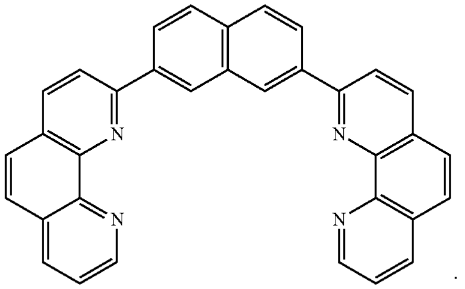

In one or more embodiments, the electron transport region may include at least one compound selected from 2,9-dimethyl-4,7-diphenyl-1,10-phenanthroline (BCP), 4,7-diphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), NTAZ, and diphenyl(4-(tprihenysilyl)phenlyl)-phosphile oxide (TSPO1)

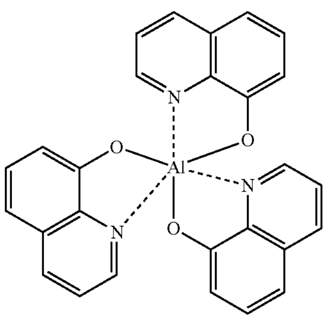

$Alq_3$

-continued

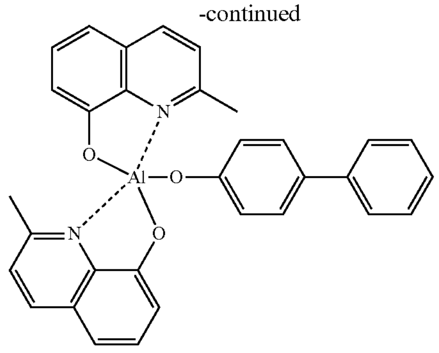

BAlq

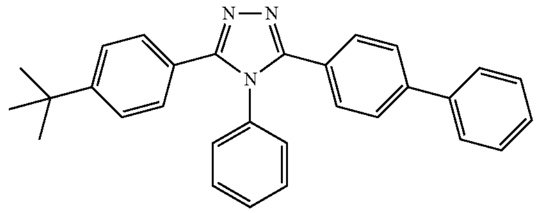

TAZ

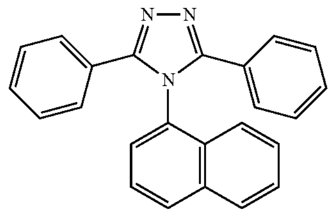

NTAZ

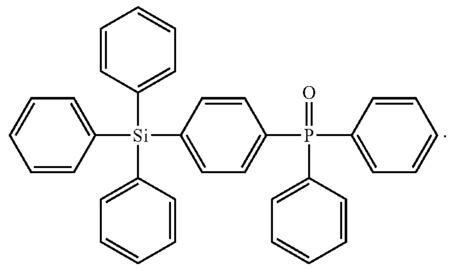

TSPO1

A thickness of the buffer layer, the hole blocking layer, or the electron control layer may be in a range of about 20 Å to about 1,000 Å, for example, about 30 Å to about 300 Å. When the thicknesses of the buffer layer, the hole blocking layer, and the electron control layer are within these ranges, the electron transport region may have excellent hole blocking characteristics or electron control characteristics without a substantial increase in driving voltage.

A thickness of the electron transport layer may be in a range of about 100 Å to about 1,000 Å, for example, about 150 Å to about 500 Å. When the thickness of the electron transport layer is within the range described above, the electron transport layer may have suitable or satisfactory electron transport characteristics without a substantial increase in driving voltage.

The electron transport region (for example, the electron transport layer in the electron transport region) may further include, in addition to the materials described above, a metal-containing material.

The metal-containing material may include at least one selected from an alkali metal complex and an alkaline earth-metal complex. The alkali metal complex may include a metal ion selected from a Li ion, a Na ion, a K ion, a Rb ion, and a Cs ion, and the alkaline earth-metal complex may include a metal ion selected from a Be ion, a Mg ion, a Ca ion, a Sr ion, and a Ba ion. A ligand coordinated with the metal ion of the alkali metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (lithium quinolate, LiQ) or ET-D2.

ET-D1

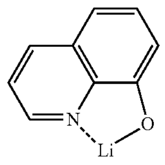

ET-D2

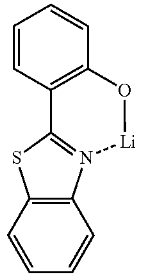

The electron transport region may include an electron injection layer that facilitates injection of electrons from the second electrode 190. The electron injection layer may directly contact the second electrode 190.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof.

The alkali metal may be selected from Li, Na, K, Rb, and Cs. In one embodiment, the alkali metal may be Li, Na, or Cs. In one or more embodiments, the alkali metal may be Li or Cs, but embodiments of the present disclosure are not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth-metal compound, and the rare earth metal compound may be selected from oxides and halides (for example, fluorides, chlorides, bromides, or iodides) of the alkali metal, the alkaline earth-metal, and the rare earth metal.

The alkali metal compound may be selected from alkali metal oxides, such as $Li_2O$, $Cs_2O$, or $K_2O$, and alkali metal halides, such as LiF, NaF, CsF, KF, LiI, NaI, CsI, or KI. In one embodiment, the alkali metal compound may be selected from LiF, $Li_2O$, NaF, LiI, NaI, CsI, and KI, but embodiments of the present disclosure are not limited thereto.

The alkaline earth-metal compound may be selected from alkaline earth-metal oxides, such as BaO, SrO, CaO, $Ba_xSr_{1-x}O$ ($0<x<1$), $Ba_xCa_{1-x}O$ ($0<x<1$). In one embodiment, the alkaline earth-metal compound may be selected from BaO, SrO, and CaO, but embodiments of the present disclosure are not limited thereto.

The rare earth metal compound may be selected from $YbF_3$, $ScF_3$, $ScO_3$, $Y_2O_3$, $Ce_2O_3$, $GdF_3$, and $TbF_3$. In one embodiment, the rare earth metal compound may be selected from $YbF_3$, $ScF_3$, $TbF_3$, $YbI_3$, $ScI_3$, and $TbI_3$, but embodiments of the present disclosure are not limited thereto.

The alkali metal complex, the alkaline earth-metal complex, and the rare earth metal complex may include an ion of alkali metal, alkaline earth-metal, and rare earth metal as described above, and a ligand coordinated with a metal ion of the alkali metal complex, the alkaline earth-metal complex, or the rare earth metal complex may be selected from hydroxy quinoline, hydroxy isoquinoline, hydroxy benzoquinoline, hydroxy acridine, hydroxy phenanthridine, hydroxy phenyloxazole, hydroxy phenylthiazole, hydroxy diphenyloxadiazole, hydroxy diphenylthiadiazole, hydroxy phenylpyridine, hydroxy phenylbenzimidazole, hydroxy phenylbenzothiazole, bipyridine, phenanthroline, and cyclopentadiene, but embodiments of the present disclosure are not limited thereto.

The electron injection layer may consist of an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof, as described above. In one or more embodiments, the electron injection layer may further include an organic material. When the electron injection layer further includes an organic material, an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within the range described above, the electron injection layer may have suitable or satisfactory electron injection characteristics without a substantial increase in driving voltage.

Second Electrode 190

The second electrode 190 may be on the organic layer 150 having such a structure. The second electrode 190 may be a cathode which is an electron injection electrode, and in this regard, a material for forming the second electrode 190 may be selected from metal, an alloy, an electrically conductive compound, and a combination thereof, which have a relatively low work function.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), indium tin oxide (ITO), and indium zinc oxide (IZO), but embodiments of the present disclosure are not limited thereto. The second electrode 190 may be a transmissive electrode, a semi-transmissive electrode, or a reflective electrode.

The second electrode 190 may have a single-layered structure, or a multi-layered structure including two or more layers.

Figure 2:
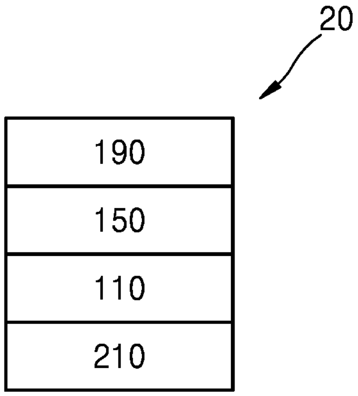
FIG. 2 is a schematic cross-sectional view of an organic light-emitting device according to an embodiment.
Figure 3:
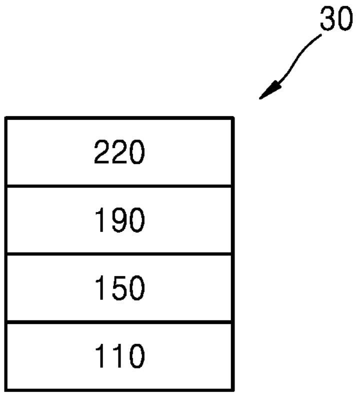
FIG. 3 is a schematic cross-sectional view of an organic light-emitting device according to an embodiment.
Figure 4:
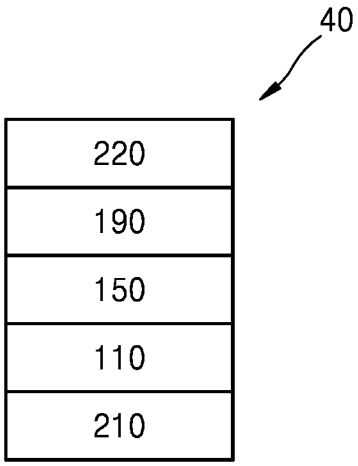
FIG. 4 is a schematic cross-sectional view of an organic light-emitting device according to an embodiment.

Description of FIGS. 2 to 4

An organic light-emitting device 20 of FIG. 2 includes a first capping layer 210, a first electrode 110, an organic layer 150, and a second electrode 190 which are sequentially stacked in this stated order, an organic light-emitting device 30 of FIG. 3 includes a first electrode 110, an organic layer 150, a second electrode 190, and a second capping layer 220 which are sequentially stacked in this stated order, and an organic light-emitting device 40 of FIG. 4 includes a first capping layer 210, a first electrode 110, an organic layer 150, a second electrode 190, and a second capping layer 220.

Regarding FIGS. 2 to 4, the first electrode 110, the organic layer 150, and the second electrode 190 may be understood by referring to the description presented in connection with FIG. 1.

In the organic layer 150 of each of the organic light-emitting devices 20 and 40, light generated in an emission layer may pass through the first electrode 110, which is a semi-transmissive electrode or a transmissive electrode, and the first capping layer 210 toward the outside, and in the organic layer 150 of each of the organic light-emitting devices 30 and 40, light generated in an emission layer may pass through the second electrode 190, which is a semi-transmissive electrode or a transmissive electrode, and the second capping layer 220 toward the outside.

The first capping layer 210 and the second capping layer 220 may increase external luminescent efficiency according to the principle of constructive interference.

The first capping layer 210 and the second capping layer 220 may each independently be an organic capping layer including an organic material, an inorganic capping layer including an inorganic material, or a composite capping layer including an organic material and an inorganic material.

At least one selected from the first capping layer 210 and the second capping layer 220 may each independently include at least one material selected from carbocyclic compounds, heterocyclic compounds, amine-based compounds, porphyrine derivatives, phthalocyanine derivatives, a naphthalocyanine derivatives, alkali metal complexes, and alkaline earth-based complexes. The carbocyclic compound, the heterocyclic compound, and the amine-based compound may be optionally substituted with a substituent containing at least one element selected from O, N, S, Se, Si, F, Cl, Br, and I.

In one embodiment, at least one selected from the first capping layer 210 and the second capping layer 220 may each independently include an amine-based compound.

In one embodiment, at least one selected from the first capping layer 210 and the second capping layer 220 may each independently include the compound represented by Formula 201 or the compound represented by Formula 202.

In one or more embodiments, at least one selected from the first capping layer 210 and the second capping layer 220 may each independently include a compound selected from Compounds HT28 to HT33 and Compounds CP1 to CP5, but embodiments of the present disclosure are not limited thereto.

CP1

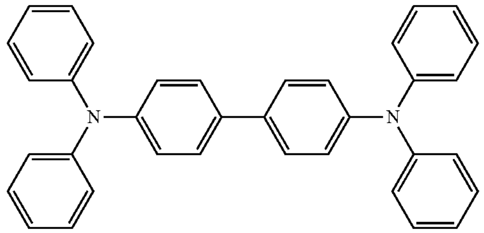

CP2

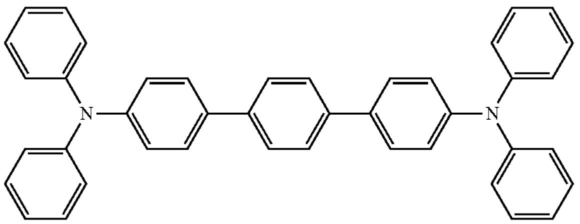

CP3

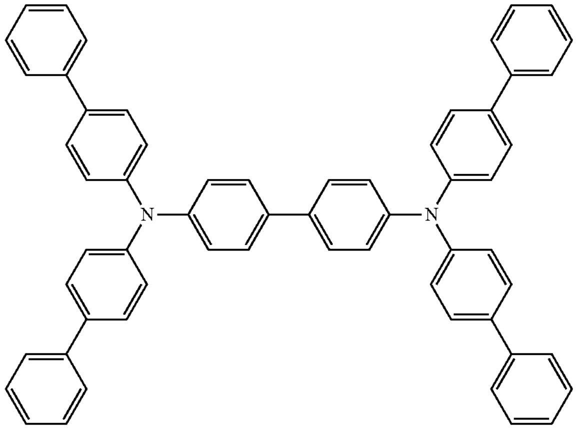

CP4

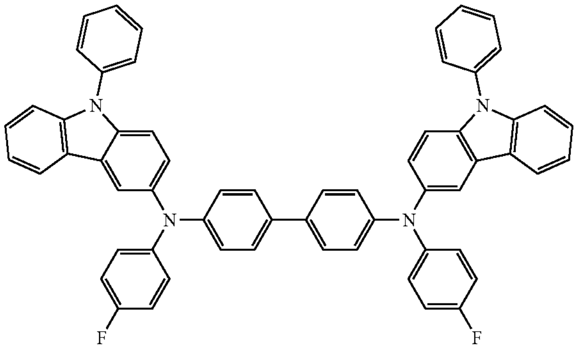

-continued

CP5

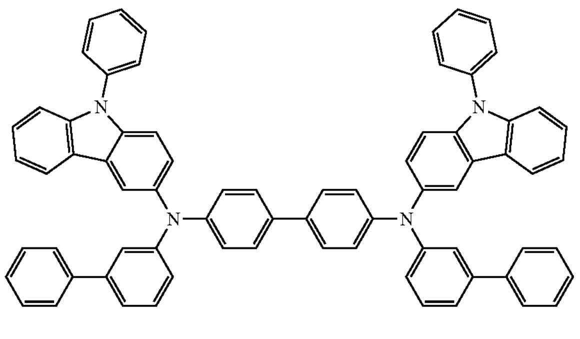

Hereinbefore, the organic light-emitting device according to an embodiment has been described in connection with FIGS. 1 to 4. However, embodiments of the present disclosure are not limited thereto.

Layers constituting the hole transport region, an emission layer, and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature in a range of about 100° C. to about 500° C., a vacuum degree in a range of about $10^{-8}$ torr to about $10^{-3}$ torr, and a deposition speed in a range of about 0.01 Å/sec to about 100 Å/sec by taking into account a material to be included in a layer to be formed, and the structure of a layer to be formed.

When layers constituting the hole transport region, an emission layer, and layers constituting the electron transport region are formed by spin coating, the spin coating may be performed at a coating speed in a range of about 2,000 rpm to about 5,000 rpm and at a heat treatment temperature in a range of about 80° C. to 200° C. by taking into account a material to be included in a layer to be formed, and the structure of a layer to be formed.

Display Device

The organic light-emitting device may be included in a display device including a thin-film transistor. The thin-film transistor may include a source electrode, a drain electrode, and an active layer, and one of the source electrode and the drain electrode may electrically contact a first electrode of the organic light-emitting device.

The thin-film transistor may further include a gate electrode, a gate insulation layer, or the like.

The active layer may include crystalline silicon, amorphous silicon, an organic semiconductor, an oxide semiconductor, or the like, but embodiments of the present disclosure are not limited thereto.

The display apparatus may further include a sealing member that seals the organic light-emitting device. The sealing member may enable to implement an image from the organic light-emitting device, and may prevent or reduce penetration of external air and moisture into the organic light-emitting device. The sealing member may be a sealing substrate made of glass or plastic. The sealing member may be a thin-film encapsulation layer including a plurality of organic layers and/or a plurality of inorganic layers. When sealing member is a thin-film encapsulation layer, the whole flat display apparatus may be made flexible.

General Definition of at Least Some of the Substituents

The term "π electron-depleted nitrogen-containing cyclic group," as used herein, refers to a cyclic group including at least one *—N=*' moiety, and examples of the π electron-depleted nitrogen-containing ring include an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazol group, an imidazopyridine group, an imidazopyrimidine group, and an azacarbazole group, but are not limited thereto.

The term "π electron-depleted nitrogen-free cyclic group," as used herein, refers to a cyclic group that does not include nitrogen, and examples of the π electron-depleted nitrogen-free cyclic group may include a benzene group, a heptalene group, an indene group, a naphthalene group, an azulene group, a heptalene group, an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a corogene group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, and a triindolobenzene group, but embodiments of the present disclosure are not limited thereto.

The term "$C_1$-$C_{60}$ alkyl group," as used herein, refers to a linear or branched saturated aliphatic hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group," as used herein, refers to a divalent group having substantially the same structure as the $C_1$-$C_{60}$ alkyl group.

The term "$C_2$-$C_{60}$ alkenyl group," as used herein, refers to a hydrocarbon group having at least one carbon-carbon double bond at a main chain (e.g., in the middle) or at a terminal end (e.g., at the terminus) of the $C_2$-$C_{60}$ alkyl group, and examples thereof include an ethenyl group, a propenyl group, and a butenyl group. The term "$C_2$-$C_{60}$ alkenylene group," as used herein, refers to a divalent group having substantially the same structure as the $C_2$-$C_{60}$ alkenyl group.

The term "$C_2$-$C_{60}$ alkynyl group," as used herein, refers to a hydrocarbon group having at least one carbon-carbon triple bond at a main chain (e.g., in the middle) or at a terminal end (e.g., at the terminus) of the $C_2$-$C_{60}$ alkyl group, and examples thereof include an ethynyl group, and a propynyl group. The term "$C_2$-$C_{60}$ alkynylene group," as used herein, refers to a divalent group having substantially the same structure as the $C_2$-$C_{60}$ alkynyl group.

The term "$C_1$-$C_{60}$ alkoxy group," as used herein, refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group," as used herein, refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group," as used herein refers to a divalent group having substantially the same structure as the $C_3$-$C_{10}$ cycloalkyl group.

The term "$C_1$-$C_{10}$ heterocycloalkyl group," as used herein, refers to a monovalent monocyclic group having at least one heteroatom selected from N, O, Si, P, and S as a ring-forming atom and 1 to 10 carbon atoms, and examples thereof include a 1,2,3,4-oxatriazolidinyl group, a tetrahydrofuranyl group, and a tetrahydrothiophenyl group. The term "$C_1$-$C_{10}$ heterocycloalkylene group," as used herein, refers to a divalent group having substantially the same structure as the $C_1$-$C_{10}$ heterocycloalkyl group.

The term "$C_3$-$C_{10}$ cycloalkenyl group," as used herein, refers to a monovalent monocyclic group that has 3 to 10 carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group," as used herein, refers to a divalent group having substantially the same structure as the $C_3$-$C_{10}$ cycloalkenyl group.

The term "$C_1$-$C_{10}$ heterocycloalkenyl group," as used herein, refers to a monovalent monocyclic group that has at least one heteroatom selected from N, O, Si, P, and S as a ring-forming atom, 1 to 10 carbon atoms, and at least one carbon-carbon double bond in its ring. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group," as used herein, refers to a divalent group having substantially the same structure as the $C_1$-$C_{10}$ heterocycloalkenyl group.

The term "$C_6$-$C_{60}$ aryl group," as used herein, refers to a monovalent group having a carbocyclic aromatic system having 6 to 60 carbon atoms, and a $C_6$-$C_{60}$ arylene group used herein refers to a divalent group having a carbocyclic aromatic system having 6 to 60 carbon atoms. Examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other (e.g., combined together).

The term "$C_1$-$C_{60}$ heteroaryl group," as used herein, refers to a monovalent group having a carbocyclic aromatic system that has at least one heteroatom selected from N, O, Si, P, and S as a ring-forming atom, in addition to 1 to 1 carbon atoms. The term "$C_1$-$C_{60}$ heteroarylene group," as used herein, refers to a divalent group having a carbocyclic aromatic system that has at least one heteroatom selected from N, O, Si, P, and S as a ring-forming atom, in addition to 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other (e.g., combined together).

The term "$C_6$-$C_{60}$ aryloxy group," as used herein, indicates —$OA_{102}$ (wherein $A_{102}$ is the $C_6$-$C_{60}$ aryl group), and a $C_6$-$C_{60}$ arylthio group indicates —$SA_{103}$ (wherein $A_{103}$ is the $C_6$-$C_{60}$ aryl group).

The term "$C_1$-$C_{60}$ heteroaryloxy group," as used herein, indicates —$OA_{104}$ (wherein $A_{104}$ is the $C_1$-$C_{60}$ heteroaryl group), and the term "$C_6$-$C_{60}$ heteroarylthio group," as used herein, indicates —SA105 (wherein $A_{105}$ is the $C_1$-$C_{60}$ heteroaryl group).

The term "monovalent non-aromatic condensed polycyclic group," as used herein, refers to a monovalent group (for example, having 8 to 60 carbon atoms) having two or more rings condensed with each other (e.g., combined together), only carbon atoms as ring-forming atoms, and no aromaticity in its entire molecular structure. An example of the monovalent non-aromatic condensed polycyclic group is a fluorenyl group. The term "divalent non-aromatic condensed polycyclic group," as used herein, refers to a divalent group having substantially the same structure as the monovalent non-aromatic condensed polycyclic group.

The term "monovalent non-aromatic condensed heteropolycyclic group," as used herein, refers to a monovalent group (for example, having 1 to 60 carbon atoms) having two or more rings condensed to each other (e.g., combined together), at least one heteroatom selected from N, O, Si, P, and S, other than carbon atoms, as a ring-forming atom, and no aromaticity in its entire molecular structure. An example of the monovalent non-aromatic condensed heteropolycyclic group is a carbazolyl group. The term "divalent non-aromatic condensed heteropolycyclic group," as used herein, refers to a divalent group having substantially the same structure as the monovalent non-aromatic condensed heteropolycyclic group.

The term "$C_5$-$C_{60}$ carbocyclic group," as used herein, refers to a monocyclic or polycyclic group having 5 to 60 carbon atoms in which a ring-forming atom is a carbon atom only. The $C_5$-$C_{60}$ carbocyclic group may be an aromatic carbocyclic group or a non-aromatic carbocyclic group. The $C_5$-$C_{60}$ carbocyclic group may be a ring, such as benzene, a monovalent group, such as a phenyl group, or a divalent group, such as a phenylene group. In one or more embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group," as used herein, refers to a group having substantially the same structure as the $C_5$-$C_{60}$ carbocyclic group, except that as a ring-forming atom, at least one heteroatom selected from N, O, Si, P, and S is used in addition to carbon (the number of carbon atoms may be in a range of 1 to 60).

In the present specification, at least one substituent of the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, and $—P(=O)(Q_{11})(Q_{12})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, and $—P(=O)(Q_{21})(Q_{22})$; and $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$, and $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group.

The term "Ph," as used herein, refers to a phenyl group, the term "Me," as used herein, refers to a methyl group, the term "Et," as used herein, refers to an ethyl group, the term "ter-Bu" or "$Bu^t$," as used herein, refers to a tert-butyl group, and the term "OMe," as used herein, refers to a methoxy group.

The term "biphenyl group," as used herein, refers to "a phenyl group substituted with a phenyl group." In other words, the "biphenyl group" is a substituted phenyl group having a $C_6$-$C_{60}$ aryl group as a substituent.

The term "terphenyl group," as used herein, refers to "a phenyl group substituted with a biphenyl group." In other words, the "terphenyl group" is a phenyl group having, as a substituent, a $C_6$-$C_{60}$ aryl group substituted with a $C_6$-$C_{60}$ aryl group.

* and *', as used herein, unless defined otherwise, each refer to a binding site to a neighboring atom in a corresponding formula.

Hereinafter, a compound according to embodiments and an organic light-emitting device according to embodiments will be described in more detail with reference to Synthesis Examples and Examples. The wording "B was used instead of A" used in describing Synthesis Examples refers to that an identical molar equivalent of B was used in place of A.

EXAMPLES

Example 1

As an anode, an ITO substrate, on which ITO/Ag/ITO were deposited, was cut to a size of 50 mm×50 mm×0.7 mm, sonicated with isopropyl alcohol and pure water each for 5 minutes, and then cleaned by exposure to ultraviolet rays and ozone for 30 minutes. Then, the ITO substrate was provided to a vacuum deposition apparatus.

Compound HT3 and F4-TCNQ were vacuum-deposited on the ITO substrate to a weight ratio of 98:2 to form a hole injection layer having a thickness of 100 Å, Compound HT3 was vacuum-deposited on the hole injection layer to form a hole transport layer having a thickness of 1,200 Å, and Compounds 1-1, 2-27, and 3-29 were co-deposited on the hole transport layer to a weight ratio of 50:50:3 to form an emission layer having a thickness of 200 Å. Compound ET-1 and LiQ were co-deposited on the emission layer to a weight ratio of 50:50 to form an electron transport layer having a thickness of 310 Å. LiQ was deposited on the electron transport layer to form an electron injection layer having a thickness of 10 Å, and Mg and Ag were co-deposited on the electron injection layer to a weight ratio of 130:10 to form a cathode having a thickness of 130 Å, thereby completing the manufacture of an organic light-emitting device.

Examples 2 to 14 and Comparative Examples 1 and 2

Organic light-emitting devices were manufactured in substantially the same manner as in Example 1, except that Compounds shown in Table 1 were each used in forming an emission layer.

Example 15

As an anode, an ITO substrate, on which ITO/Ag/ITO were deposited, was cut to a size of 50 mm×50 mm×0.7 mm, sonicated with isopropyl alcohol and pure water each for 5 minutes, and then cleaned by exposure to ultraviolet rays and ozone for 30 minutes. Then, the ITO substrate was provided to a vacuum deposition apparatus.

Compound HT3 and F4-TCNQ were vacuum-deposited on the ITO substrate to a weight ratio of 98:2 to form a hole injection layer having a thickness of 100 Å, Compound HT3 was vacuum-deposited on the hole injection layer to form a hole transport layer having a thickness of 1,400 Å, and Compounds 1-1, 2-30, and 3-20 were co-deposited on the hole transport layer to a weight ratio of 50:50:3 to form an emission layer having a thickness of 400 Å. Compound ET-1 and LiQ were co-deposited on the emission layer to a weight ratio of 50:50 to form an electron transport layer having a thickness of 310 Å. LiQ was deposited on the electron transport layer to form an electron injection layer having a thickness of 10 Å, Mg and Ag were co-deposited on the electron injection layer to a weight ratio of 130:10 to form a cathode having a thickness of 130 Å, thereby completing the manufacture of an organic light-emitting device.

Examples 16 to 18 and Comparative Example 3

Organic light-emitting devices were manufactured in substantially the same manner as in Example 15, except that Compounds shown in Table 2 were each used in forming an emission layer.

Evaluation Example

Current efficiencies of the organic light-emitting devices manufactured according to Examples 1 to 14 and Comparative Examples 1 and 2 were measured at a current density of 10 mA/cm$^2$ by using Keithley SMU 236 and a luminance meter PR650, and results thereof are shown in Table 1. Current efficiencies of the organic light-emitting devices manufactured according to Examples 15 to 18 and Comparative Example 3 were measured at a current density of 10 mA/cm$^2$ by using Keithley SMU 236 and a luminance meter PR650, and results thereof are shown in Table 2. In addition, the lifespan is expressed by a relative value with respect to Comparative Example 1 or Comparative Example 4.

TABLE 1

| | Emission layer | | | | | | |
|---|---|---|---|---|---|---|---|
| | First compoumd | Second compound | Third compound | Weight ratio (first compound: second compound: third compound) | Emission color | Efficiency (cd/A) | Lifespan (%) |
| Example 1 | 1-1 | 2-27 | 3-29 | 50:50:3 | Blue | 8.2 | 180 |
| Example 2 | 1-1 | 2-27 | 3-29 | 70:30:3 | Blue | 7.9 | 205 |
| Example 3 | 1-1 | 2-27 | 3-29 | 30:70:3 | Blue | 8.3 | 165 |
| Example 4 | 1-1 | 2-27 | 3-29 | 50:50:1 | Blue | 8.5 | 200 |
| Example 5 | 1-2 | 2-27 | 3-29 | 50:50:3 | Blue | 8.3 | 195 |
| Example 6 | 1-5 | 2-27 | 3-29 | 50:50:3 | Blue | 8.1 | 205 |
| Example 7 | 1-17 | 2-27 | 3-29 | 50:50:3 | Blue | 8.5 | 210 |
| Example 8 | 1-61 | 2-27 | 3-29 | 50:50:3 | Blue | 8.2 | 175 |
| Example 9 | 1-1 | 2-3 | 3-29 | 50:50:3 | Blue | 8.2 | 190 |
| Example 10 | 1-1 | 2-23 | 3-29 | 50:50:3 | Blue | 8.4 | 200 |
| Example 11 | 1-1 | 2-32 | 3-29 | 50:50:3 | Blue | 8.1 | 185 |
| Example 12 | 1-1 | 2-44 | 3-29 | 50:50:3 | Blue | 8.6 | 220 |
| Example 13 | 1-1 | 2-50 | 3-29 | 50:50:3 | Blue | 8.3 | 180 |
| Example 14 | 1-1 | 2-28 | 3-29 | 50:50:3 | Blue | 8.4 | 180 |
| Comparative Example 1 | 1-1 | — | 3-29 | 97:3 | Blue | 6.1 | 100 |
| Comparative Example 2 | — | 2-27 | 3-29 | 97:3 | Blue | 6.7 | 140 |

TABLE 2
| | Emission layer | | | | | | |
|---|---|---|---|---|---|---|---|
| | First compound | Second compound | Third compound | Weight ratio (first compound: second compound: third compound | Emission color | Efficiency (cd/A) | Lifespan (%) |
| Example 15 | 1-1 | 2-30 | 3-20 | 50:50:3 | Green | 48 | 250 |
| Example 16 | 1-1 | 2-32 | 3-20 | 50:50:3 | Green | 52 | 260 |
| Example 17 | 1-1 | 2-44 | 3-20 | 50:50:3 | Green | 55 | 305 |
| Example 18 | 1-1 | 2-50 | 3-20 | 50:50:3 | Green | 50 | 300 |
| Comparative Example 3 | 1-1 | X1 | X2 | 40:40:20 | Bluish green | 6.9 | 100 |
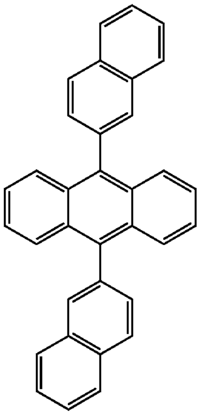
ADN
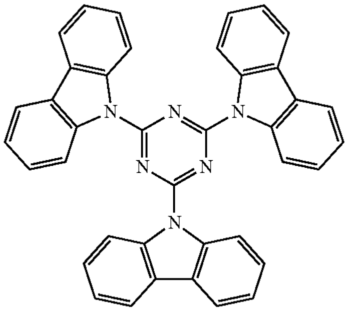
X1
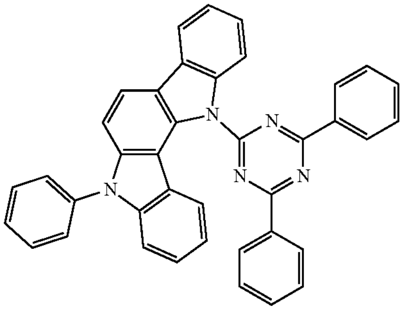
X2

From Tables 1 and 2, it is confirmed that the organic light-emitting devices of Examples 1 to 18 have excellent current efficiency and lifespan as compared with those of the organic light-emitting devices of Comparative Examples 1 to 3.

The organic light-emitting device may have high efficiency and a long lifespan.

It should be understood that embodiments described herein should be considered in a descriptive sense only and not for purposes of limitation. Descriptions of features or aspects within each embodiment should typically be considered as available for other similar features or aspects in other embodiments.

It will be understood that, although the terms “first,” “second,” “third,” etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as “beneath,” “below,” “lower,” “under,” “above,” “upper,” and the like, may be used herein for ease of explanation to describe one element or feature’s relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as “below” or “beneath” or “under” other elements or features would then be oriented “above” the other elements or features. Thus, the example terms “below” and “under” can encompass both an orientation of above and below.

The device may be otherwise oriented (e.g., rotated 90 degrees or at other orientations) and the spatially relative descriptors used herein should be interpreted accordingly.

As used herein, the terms “substantially,” “about,” and similar terms are used as terms of approximation and not as terms of degree, and are intended to account for the inherent deviations in measured or calculated values that would be recognized by those of ordinary skill in the art. Further, the use of “may” when describing embodiments of the present disclosure refers to “one or more embodiments of the present disclosure.” As used herein, the terms “use,” “using,” and “used” may be considered synonymous with the terms “utilize,” “utilizing,” and “utilized,” respectively. Also, the term “exemplary” is intended to refer to an example or illustration.

Also, any numerical range recited herein is intended to include all sub-ranges of the same numerical precision subsumed within the recited range. For example, a range of “1.0 to 10.0” is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While one or more embodiments have been described with reference to the figures, it will be understood by those of ordinary skill in the art that various changes in form and details may be made therein without departing from the spirit and scope of the present disclosure as defined by the following claims, and equivalents thereof.

What is claimed is:

1. An organic light-emitting device comprising:

a first electrode;

a second electrode; and an organic layer between the first electrode and the second electrode, wherein the organic layer comprises an emission layer, the emission layer comprises a first compound, a second compound, and a third compound, the first compound is represented by Formula 1, the second compound is selected from compounds of Group II, Group II 2-1

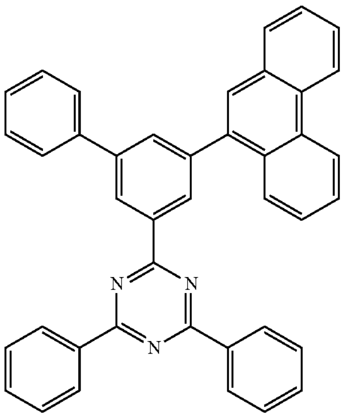

2-2

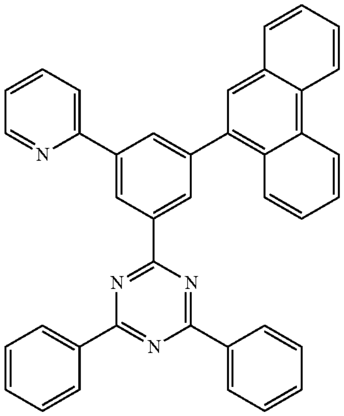

-continued
2-6
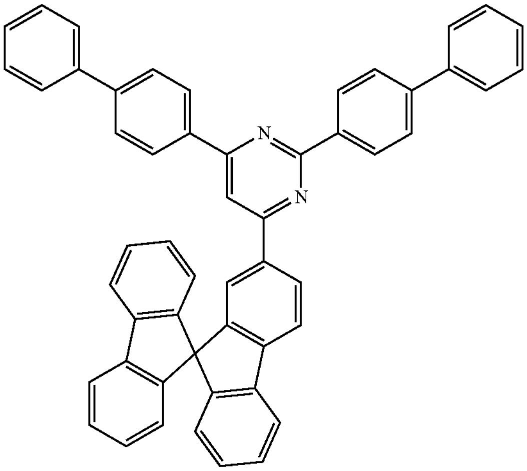
2-7
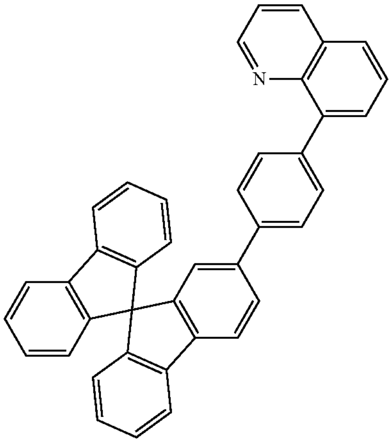
2-8
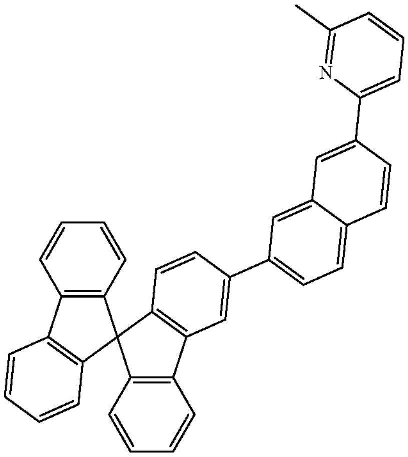
-continued
2-9
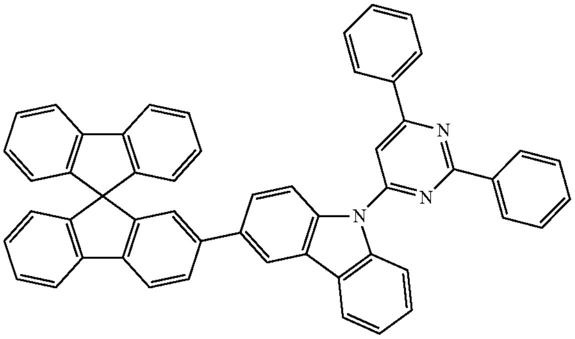
2-10
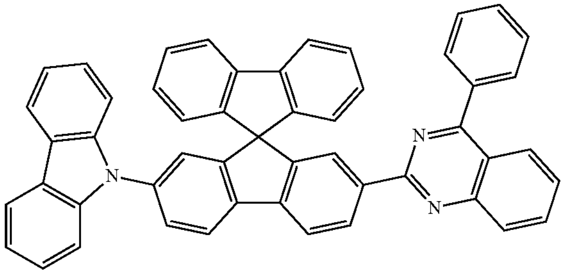
2-11
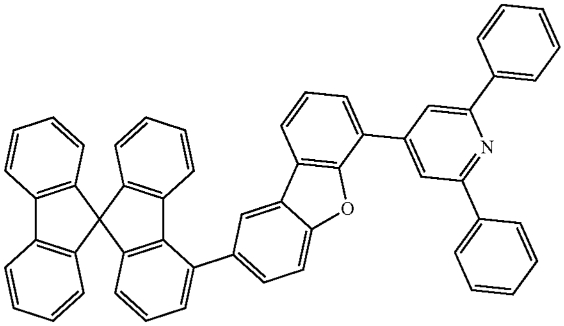
2-18
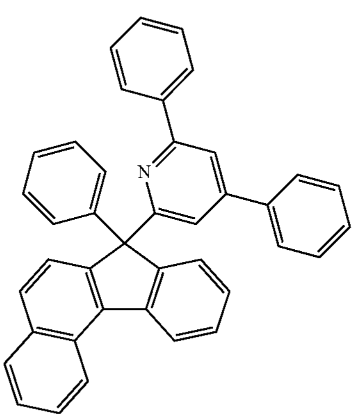

-continued
2-26
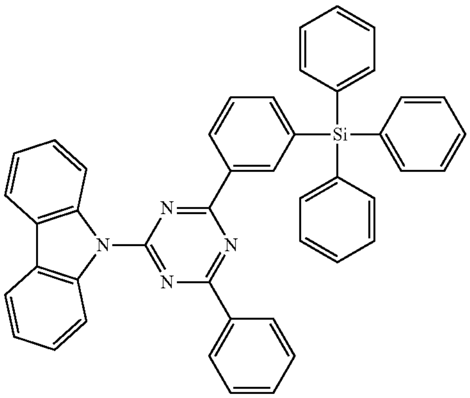
2-36
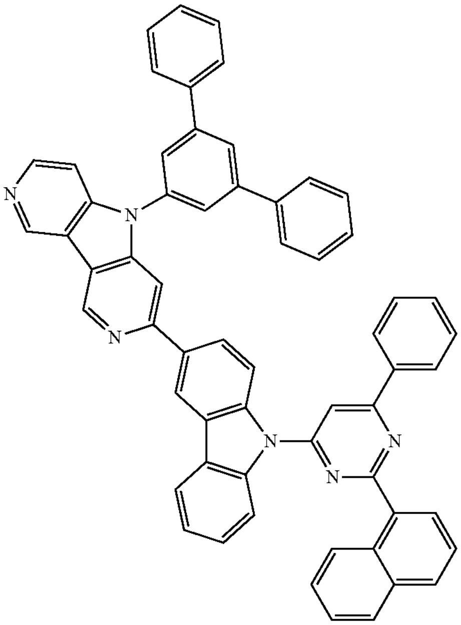
2-37
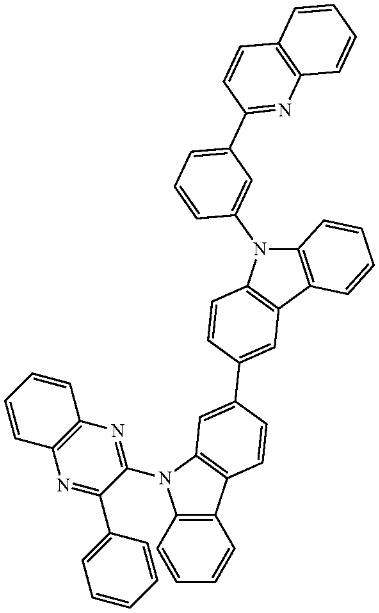
-continued
2-38
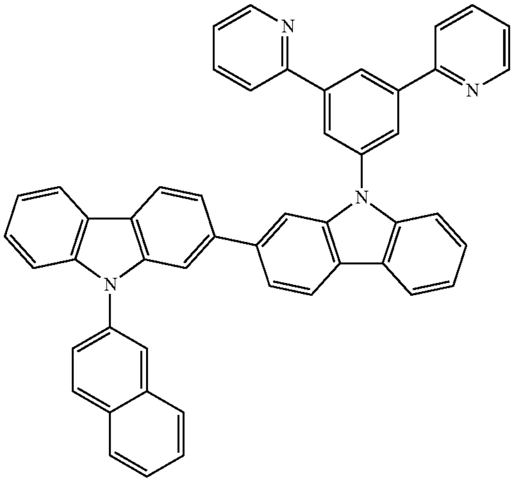
2-39
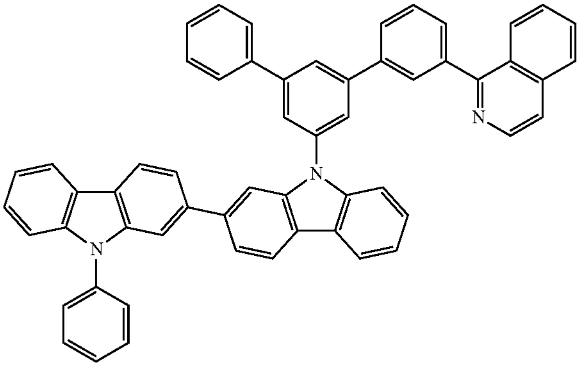
2-40
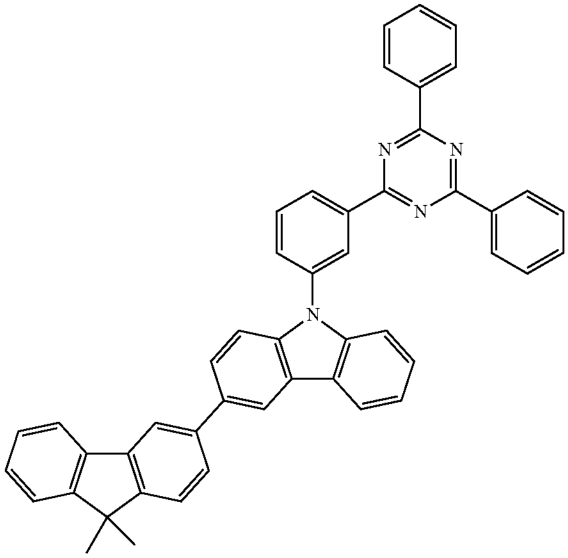

-continued
2-41
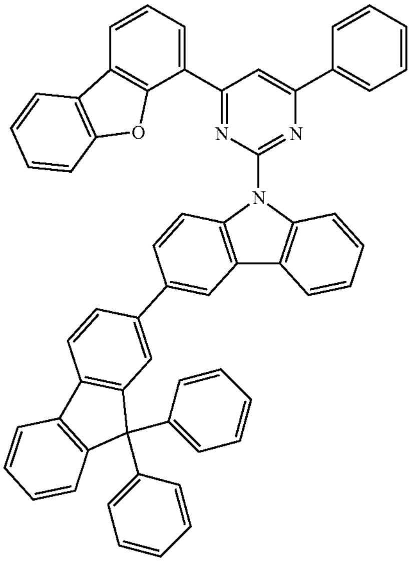
2-42
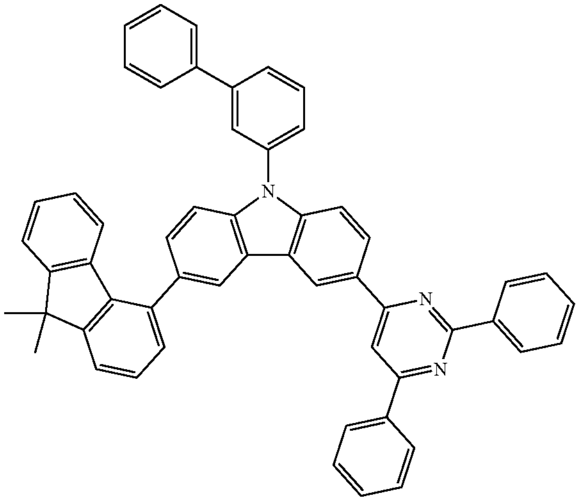
2-43
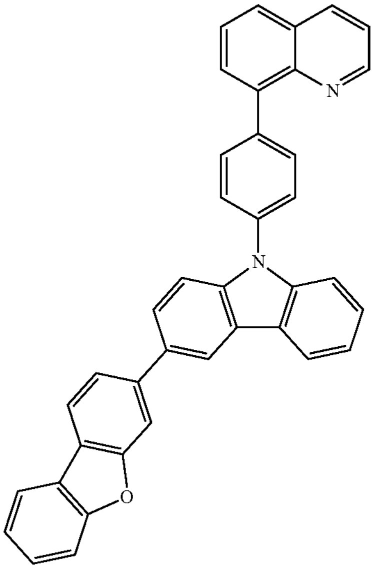
-continued
2-45
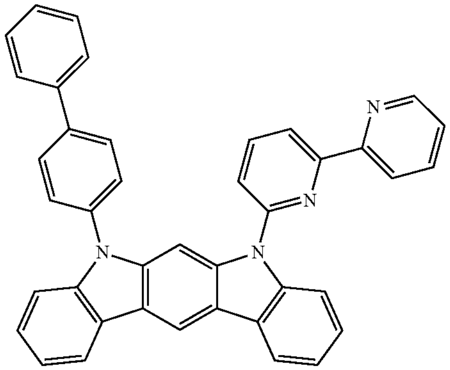
2-46
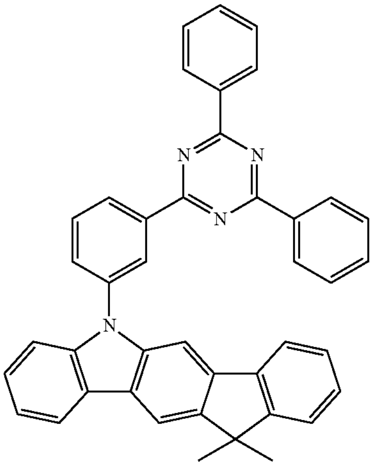
2-47
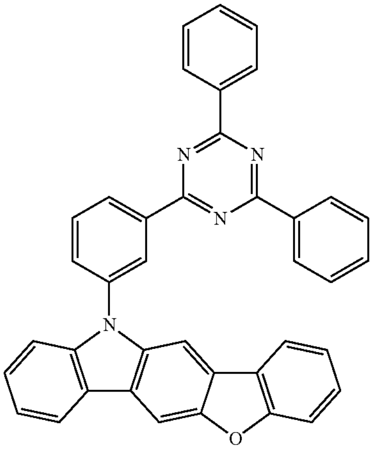
2-48
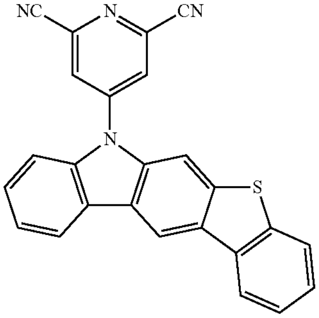

-continued 2-49

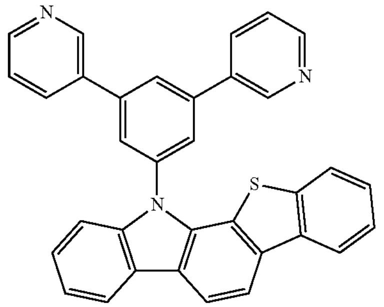

the third compound is represented by Formula 3, and the first compound and the second compound are different from each other:

<Formula 1>

$(Y_{11})_{c11}$—$(L_{11})_{a11}$—$(Y_{12})_{c12}$

<Formula 3>

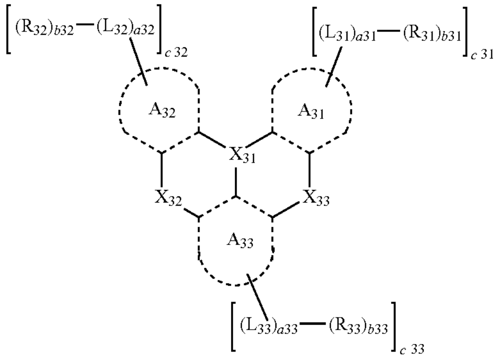

<Formula 1A>

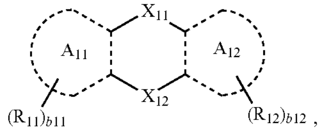

wherein, in Formulae 1 to 3, and 1A, $L_{11}$ is selected from:

a π electron-depleted nitrogen-free cyclic group; and a π electron-depleted nitrogen-free cyclic group substituted with at least one selected from deuterium, a $C_1$-$C_{60}$ alkyl group, a π electron-depleted nitrogen-free cyclic group, and —$Si(Q_{31})(Q_{32})(Q_{33})$, a11 is selected from 0, 1, 2, and 3, $Y_{11}$ is a group represented by Formula 1A, $Y_{12}$ is selected from:

a $C_1$-$C_{60}$ alkyl group, a π electron-depleted nitrogen-free cyclic group, and —$Si(Q_1)(Q_2)(Q_3)$;

a π electron-depleted nitrogen-free cyclic group substituted with at least one selected from deuterium, a $C_1$-$C_{60}$ alkyl group, a π electron-depleted nitrogen-free cyclic group, and —$Si(Q_{31})(Q_{32})(Q_{33})$; and a π electron-depleted nitrogen-free cyclic group substituted with a π electron-depleted nitrogen-free cyclic group that is substituted with at least one selected from deuterium, a $C_1$-$C_{60}$ alkyl group, a π electron-depleted nitrogen-free cyclic group, and —$Si(Q_{21})(Q_{22})(Q_{23})$, c11 and c12 are each independently selected from 1, 2, and 3, $X_{11}$ is selected from a single bond, $C(R_{13})(R_{14})$, $N(R_{13})$, O, and S, $X_{12}$ is selected from a single bond, $C(R_{15})(R_{16})$, $N(R_{15})$, O, and S, $X_{11}$ and $X_{12}$ are not both a single bond, $A_{11}$ and $A_{12}$ are each independently a π electron-depleted nitrogen-free cyclic group, $R_{11}$ to $R_{16}$ are each independently selected from:

a binding site, hydrogen, deuterium, a $C_1$-$C_{60}$ alkyl group, a π electron-depleted nitrogen-free cyclic group, and —$Si(Q_1)(Q_2)(Q_3)$;

a π electron-depleted nitrogen-free cyclic group substituted with at least one selected from deuterium, a $C_1$-$C_{60}$ alkyl group, a π electron-depleted nitrogen-free cyclic group, and —$Si(Q_{31})(Q_{32})(Q_{33})$; and a π electron-depleted nitrogen-free cyclic group substituted with a π electron-depleted nitrogen-free cyclic group that is substituted with at least one selected from deuterium, a $C_1$-$C_{60}$ alkyl group, a π electron-depleted nitrogen-free cyclic group, and —$Si(Q_{21})(Q_{22})(Q_{23})$, wherein one selected from $R_{11}$ to $R_{13}$ and $R_{15}$ is a binding site, b11 and b12 are each independently selected from 1, 2, 3, 4, 5, and 6, $X_{31}$ is selected from B and N, and $X_{32}$ and $X_{33}$ are each independently selected from $B(R_{34})$, $N(R_{34})$, O, S, $C(R_{34})(R_{35})$, and $Si(R_{34})(R_{35})$, wherein, when $X_{31}$ is B, $X_{32}$ and $X_{33}$ are each independently selected from $N(R_{34})$, O, S, $C(R_{34})(R_{35})$, and $Si(R_{34})(R_{35})$, and when $X_{31}$ is N, $X_{32}$ and $X_{33}$ are each independently selected from $B(R_{34})$, O, S, $C(R_{34})(R_{35})$, and $Si(R_{34})(R_{35})$, $A_{31}$ to $A_{33}$ are each independently selected from a $C_5$-$C_{60}$ carbocyclic group and a $C_1$-$C_{60}$ heterocyclic group, $L_{31}$ to $L_{33}$ are each independently selected from a substituted or unsubstituted $C_5$-$C_{60}$ carbocyclic group and a substituted or unsubstituted $C_1$-$C_{60}$ heterocyclic group, a31 to a33 are each independently selected from 0, 1, 2, and 3, $R_{31}$ to $R_{35}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, and —$P(=S)(Q_1)(Q_2)$, and $R_{31}$ to $R_{33}$ are optionally linked to form a substituted or unsubstituted $C_5$-$C_{60}$ carbocyclic group or a substituted or unsubstituted $C_1$-$C_{60}$ heterocyclic group, c31 to c33 are each independently selected from 1, 2, 3, 4, 5, and 6, $Q_1$ to $Q_3$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a biphenyl group, and a terphenyl group,

* indicates a binding site to a neighboring atom, and wherein the third compound is a thermally activated delayed fluorescence (TADF) emitter.

2. The organic light-emitting device of claim 1, wherein:

$L_{11}$ is selected from:

a benzene group, a naphthalene group, a phenalene group, an anthracene group, a fluoranthene group, a triphenylene group, a phenanthrene group, a pyrene group, a chrysene group, a perylene group, a fluorene group, a carbazole group, a dibenzofuran group, and a dibenzothiophene group; and a benzene group, a naphthalene group, a phenalene group, an anthracene group, a fluoranthene group, a triphenylene group, a phenanthrene group, a pyrene group, a chrysene group, a perylene group, a fluorene group, a carbazole group, a dibenzofuran group, and a dibenzothiophene group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, and $L_{31}$ to $L_{33}$ are each independently selected from:

a benzene group, a naphthalene group, a phenalene group, an anthracene group, a fluoranthene group, a triphenylene group, a phenanthrene group, a pyrene group, a chrysene group, a perylene group, a pyridine group, a pyrimidine group, a pyrazine group, a pyridazine group, a triazine group, a quinoline group, an isoquinoline group, a benzoquinoline group, a benzoisoquinoline group, a phthalazine group, a naphthyridine group, a quinoxaline group, a benzoquinoxaline group, a quinazoline group, a benzoquinazoline group, a fluorene group, a carbazole group, a dibenzofuran group, and a dibenzothiophene group; and a benzene group, a naphthalene group, a phenalene group, an anthracene group, a fluoranthene group, a triphenylene group, a phenanthrene group, a pyrene group, a chrysene group, a perylene group, a pyridine group, a pyrimidine group, a pyrazine group, a pyridazine group, a triazine group, a quinoline group, an isoquinoline group, a benzoquinoline group, a benzoisoquinoline group, a phthalazine group, a naphthyridine group, a quinoxaline group, a benzoquinoxaline group, a quinazoline group, a benzoquinazoline group, a fluorene group, a carbazole group, a dibenzofuran group, and a dibenzothiophene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group.

3. The organic light-emitting device of claim 1, wherein:

$X_{11}$ is selected from $N(R_{13})$, O, and S, and $X_{12}$ is a single bond.

4. The organic light-emitting device of claim 1, wherein:

$A_{11}$ and $A_{12}$ are each independently selected from a benzene group, a naphthalene group, a fluorene group, a carbazole group, a dibenzofuran group, a dibenzothiophene group, an indolofluorene group, an indolocarbazole group, an indolodibenzofuran group, an indolodibenzothiophene group, an indenofluorene group, an indenocarbazole group, an indenodibenzofuran group, an indenodibenzothiophene group, a benzofuranofluorene group, a benzofuranocarbazole group, a benzofuranodibenzofuran group, a benzofuranodibenzothiophene group, a benzothienofluorene group, a benzothienocarbazole group, a benzothienodibenzofuran group, and a benzothienodibenzothiophene group.

5. The organic light-emitting device of claim 1, wherein:

$R_{11}$ to $R_{16}$ are each independently selected from:

a binding site, hydrogen, deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, and —$Si(Q_1)(Q_2)(Q_3)$; and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, and —$Si(Q_{31})(Q_{32})(Q_{33})$; and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group that are each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, and —$Si(Q_{21})(Q_{22})(Q_{23})$, one selected from $R_{11}$ to $R_{13}$ and $R_{15}$ is a binding site, and $Q_1$ to $Q_3$, $Q_{21}$ to $Q_{23}$, and $Q_{31}$ to $Q_{33}$ are each independently selected from a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group.

6. The organic light-emitting device of claim 1, wherein:

$Y_{12}$ is selected from:

a methyl group, an ethyl group, an n-propyl group, an isopropyl group, an n-butyl group, an isobutyl group, a sec-butyl group, a tert-butyl group, a phenyl group, a biphenyl group, a terphenyl group, a naphthyl group, a phenanthrenyl group, a fluorenyl group, a carbazolyl group, a dibenzofuranyl group, a dibenzothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, a benzothienodibenzothiophenyl group, and —$Si(Q_1)(Q_2)(Q_3)$;

a phenyl group, a biphenyl group, a terphenyl group, a naphthyl group, a phenanthrenyl group, a fluorenyl group, a carbazolyl group, a dibenzofuranyl group, a dibenzothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, and a benzothienodibenzothiophenyl group, each substituted with at least one selected from deuterium, a methyl group, an ethyl group, an n-propyl group, an isopropyl group, an n-butyl group, an isobutyl group, a sec-butyl group, a tert-butyl group, a phenyl group, a biphenyl group, a terphenyl group, a naphthyl group, a phenanthrenyl group, a fluorenyl group, a carbazolyl group, a dibenzofuranyl group, a dibenzothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, a benzothienodibenzothiophenyl group, and —$Si(Q_{31})(Q_{32})(Q_{33})$; and a phenyl group, a biphenyl group, a terphenyl group, a naphthyl group, a phenanthrenyl group, a fluorenyl group, a carbazolyl group, a dibenzofuranyl group, a dibenzothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, and a benzothienodibenzothiophenyl group, each substituted with at least one selected from a phenyl group, a biphenyl group, a terphenyl group, a naphthyl group, a phenanthrenyl group, a fluorenyl group, a carbazolyl group, a dibenzofuranyl group, a dibenzothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, and a benzothienodibenzothiophenyl group that are each substituted with at least one selected from deuterium, a methyl group, an ethyl group, an n-propyl group, an isopropyl group, an n-butyl group, an isobutyl group, a sec-butyl group, a tert-butyl group, a phenyl group, a biphenyl group, a terphenyl group, a naphthyl group, a phenanthrenyl group, a fluorenyl group, a carbazolyl group, a dibenzofuranyl group, a dibenzothiophenyl group, an indenofluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, a benzothienodibenzothiophenyl group, and —$Si(Q_{21})(Q_{22})(Q_{23})$, and $Q_1$ to $Q_3$, $Q_{21}$ to $Q_{23}$, and $Q_{31}$ to $Q_{33}$ are each independently selected from a $C_1$-$C_{20}$ alkyl group, a phenyl group, a biphenyl group, a terphenyl group, a naphthyl group, a phenanthrenyl group, a fluorenyl group, a carbazolyl group, a dibenzofuranyl group, and a dibenzothiophenyl group.

7. The organic light-emitting device of claim 1, wherein: c11 and c12 are each 1.

8. The organic light-emitting device of claim 1, wherein:

$X_{31}$ is B, and X32 and $X_{33}$ are $N(R_{34})$; or $X_{31}$ is N, and $X_{32}$ and $X_{33}$ are $B(R_{34})$.

9. The organic light-emitting device of claim 1, wherein:

$A_{31}$ to $A_{33}$ are each independently selected from a benzene group, a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a perylene group, a thiophene group, a furan group, a silole group, a carbazole group, an indole group, an isoindole group, a benzofuran group, a benzothiophene group, a benzosilole group, a dibenzofuran group, a dibenzothiophene group, a benzocarbazole group, a dibenzocarbazole group, and a dibenzosilole group.

10. The organic light-emitting device of claim 1, wherein:

$R_{31}$ to $R_{35}$ are each independently selected from:

hydrogen, deuterium, —F, —Cl, —Br, —I, a cyano group, a $C_1$-$C_{20}$ alkyl group, and a $C_1$-$C_{20}$ alkoxy group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group, each substituted with at least one selected from deuterium, —F, —Cl, —Br, —I, a cyano group, a $C_1$-$C_{20}$ alkyl group, a $C_1$-$C_{20}$ alkoxy group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group; and —$B(Q_1)(Q_2)$ and —$N(Q_1)(Q_2)$, and $Q_1$ and $Q_2$ are each independently selected from:

hydrogen, deuterium, and a $C_1$-$C_{20}$ alkyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group.

11. The organic light-emitting device of claim 1, wherein:

the first compound is selected from compounds of Group I, and the third compound is selected from compounds of Group III:

Group I 1-1

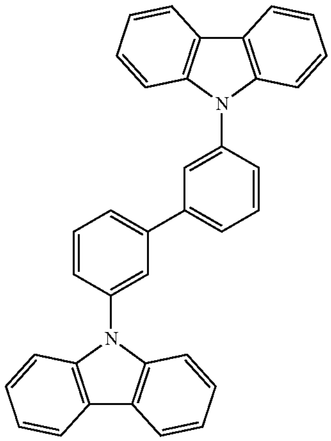

-continued 1-2

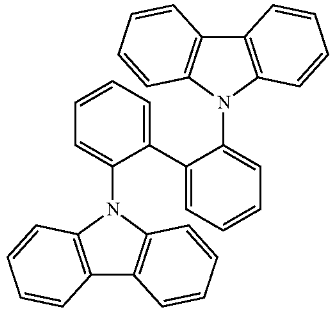

1-3

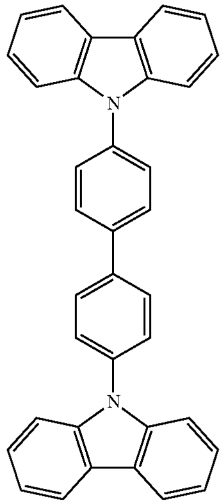

1-4

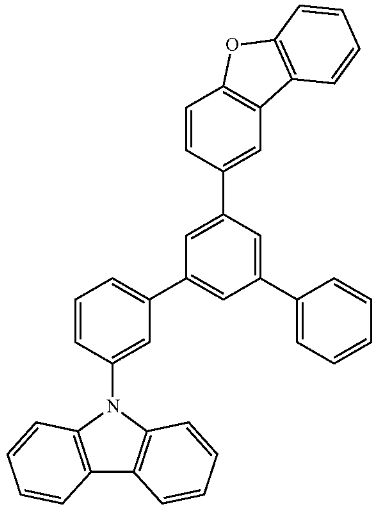

-continued
1-5
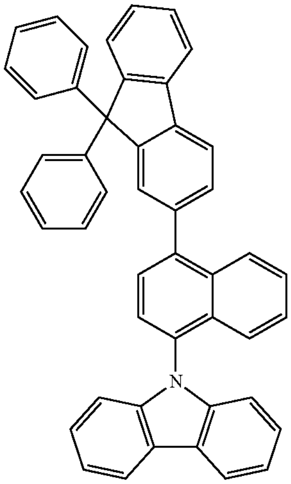
1-6
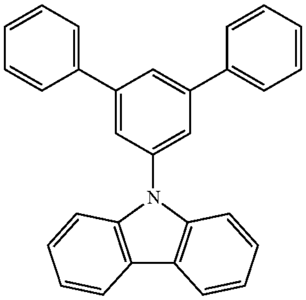
1-7
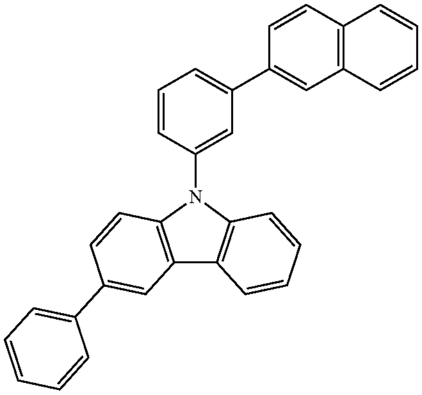
1-8
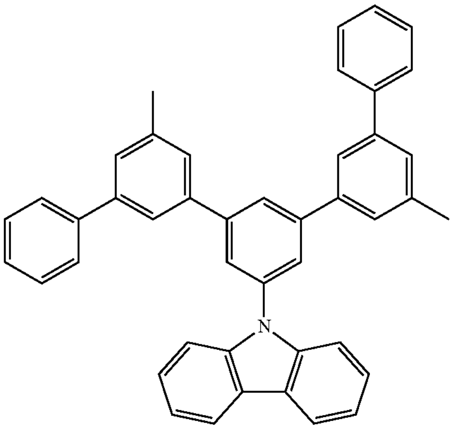
-continued
1-9
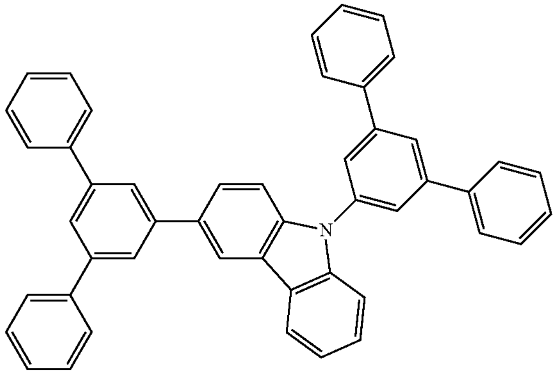
1-10
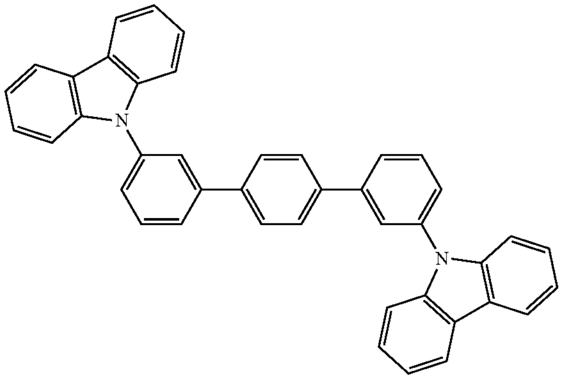
1-11
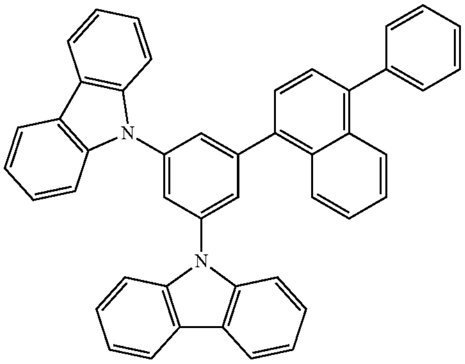
1-12
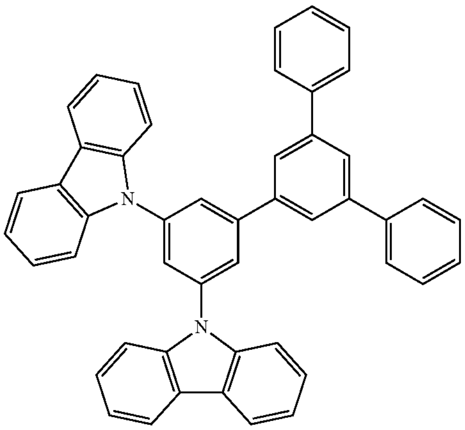

-continued
1-13
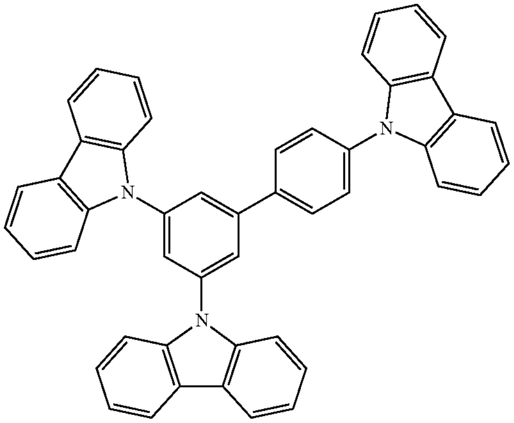
1-14
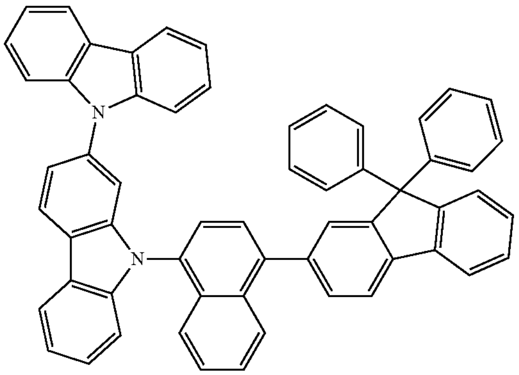
1-15
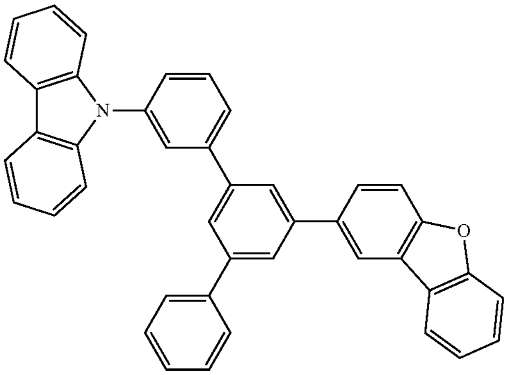
-continued
1-16
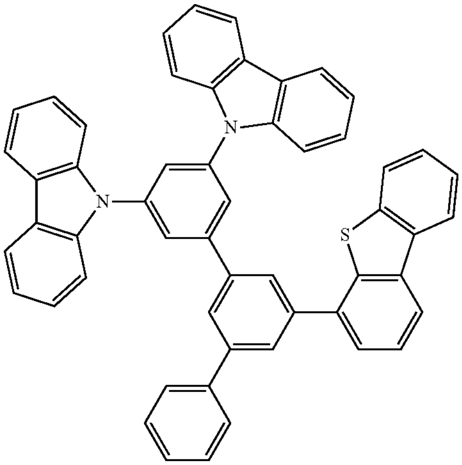
1-17
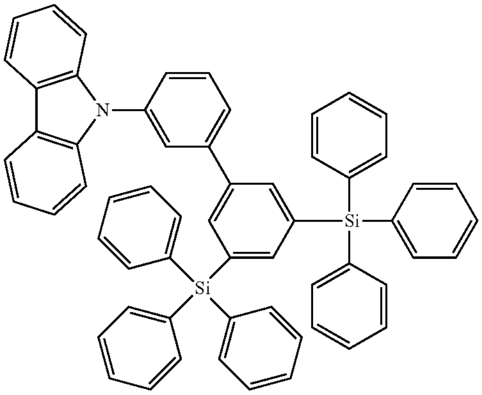
1-18
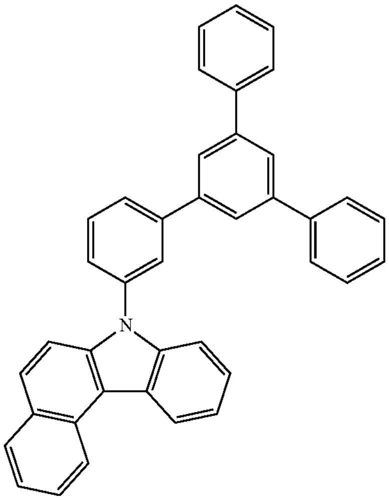

-continued
1-19
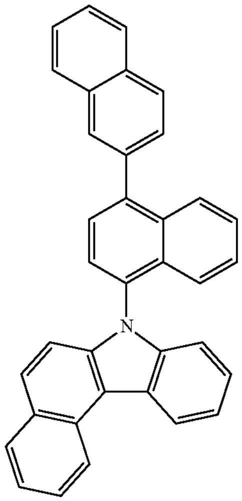
1-20
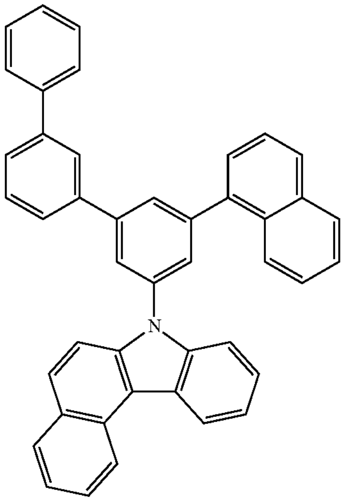
1-21
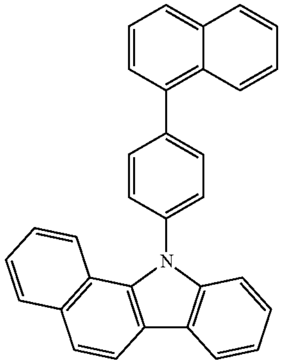
-continued
1-22
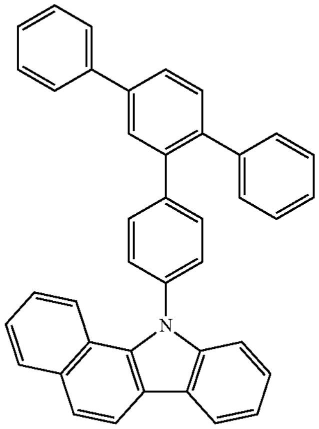
1-23
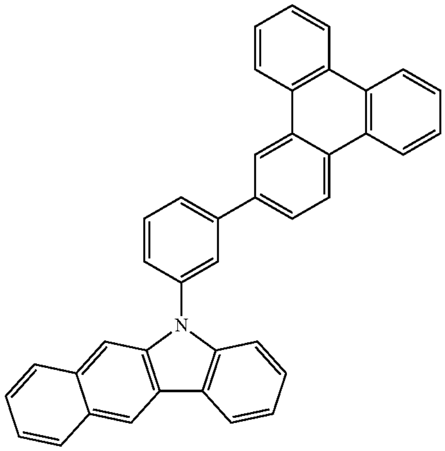
1-24
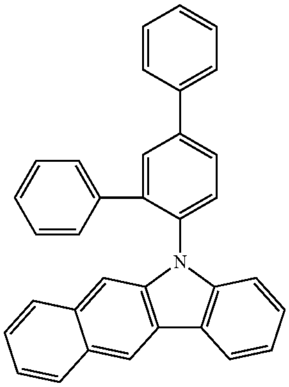

-continued
1-25
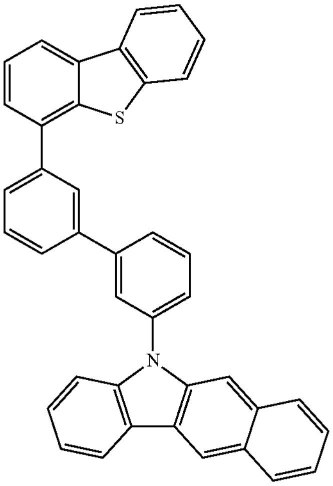
1-26
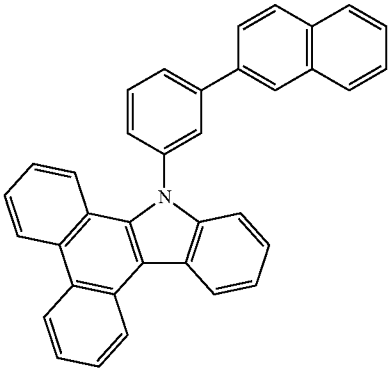
1-27
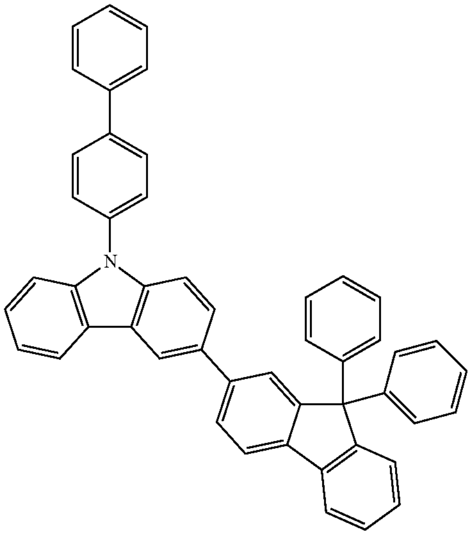
-continued
1-28
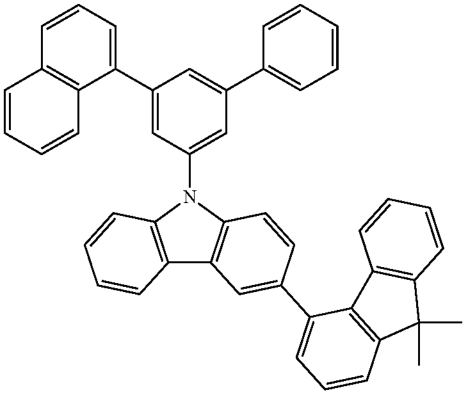
1-29
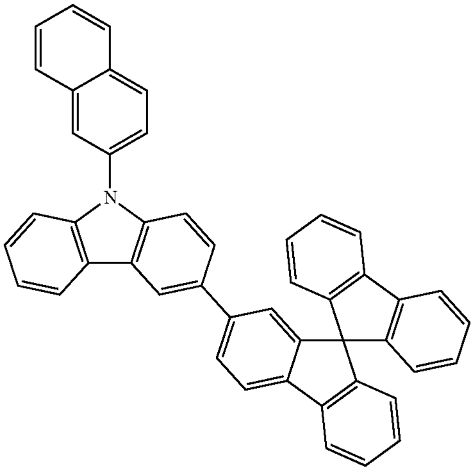
1-30
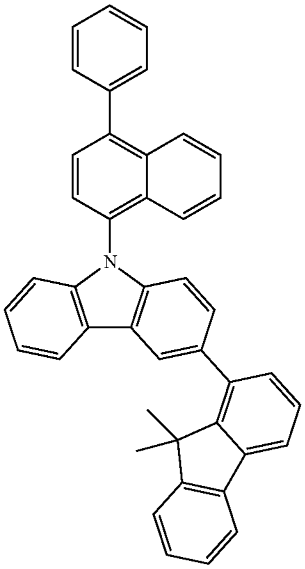

-continued
1-31
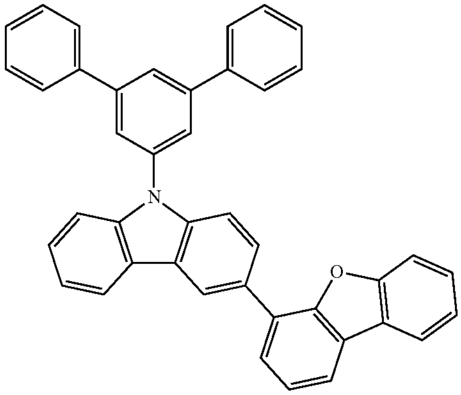
1-31
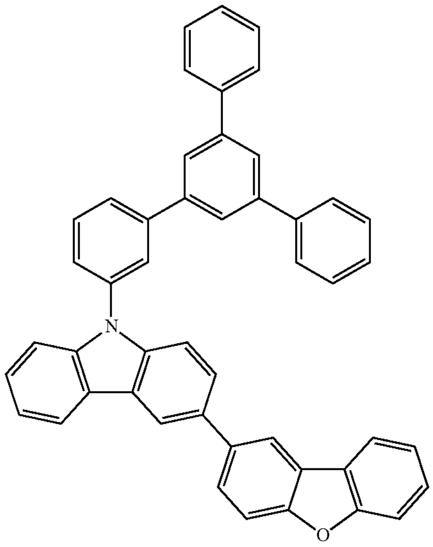
1-32
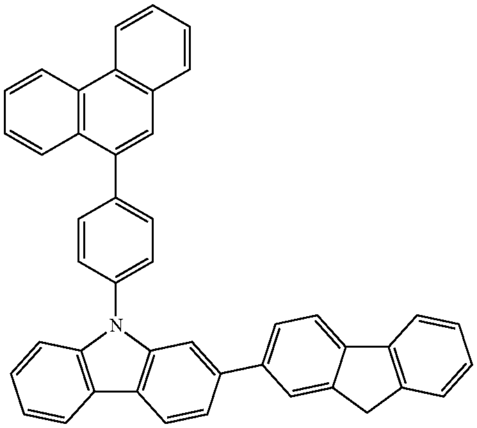
-continued
1-33
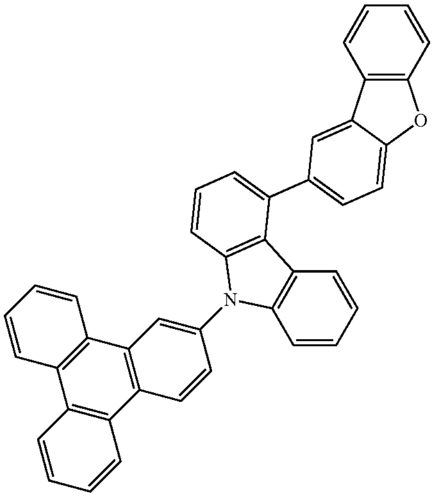
1-34
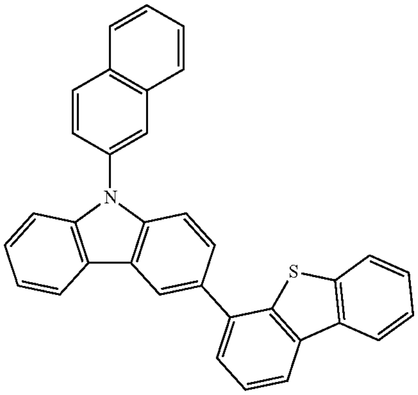
1-35
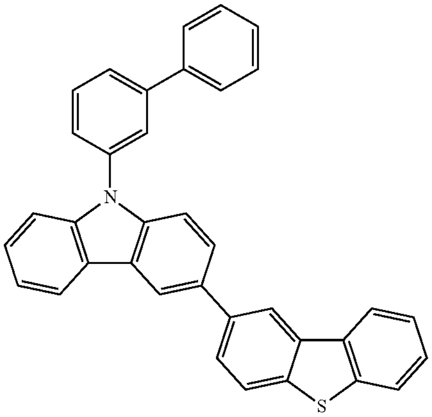

-continued
1-36
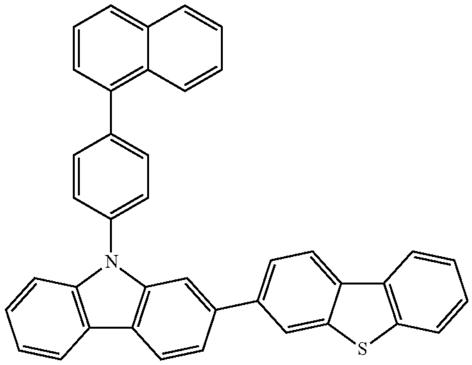
1-37
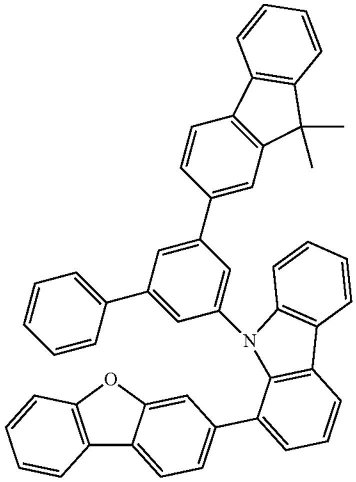
1-38
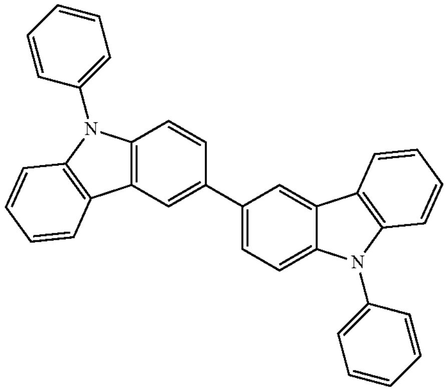
-continued
1-39
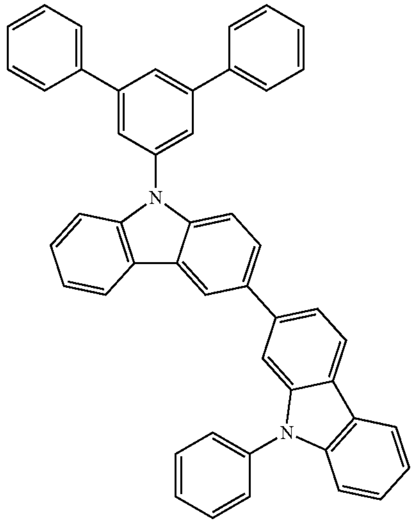
1-40
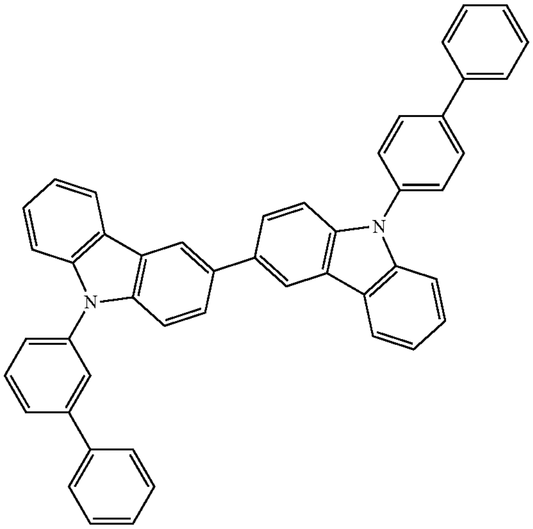
1-41
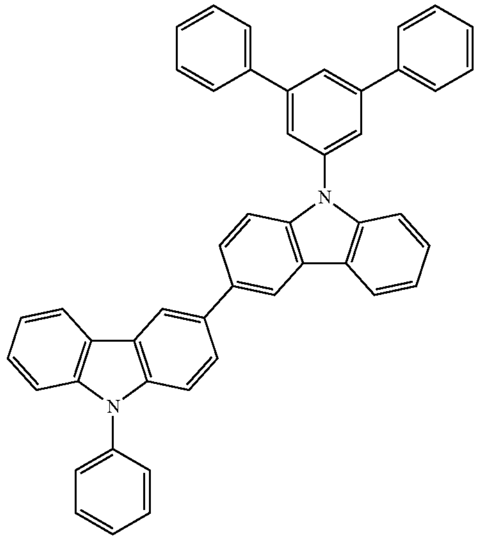

1-42
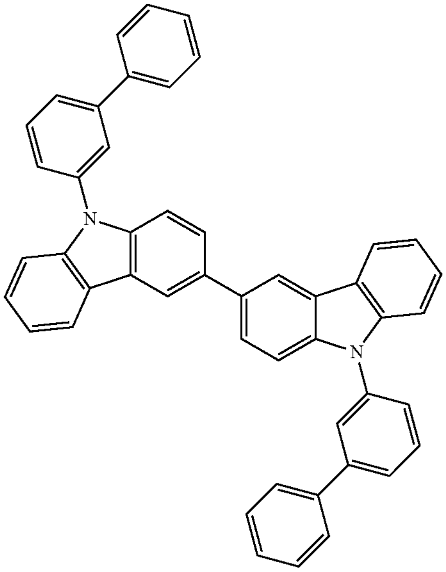
1-43
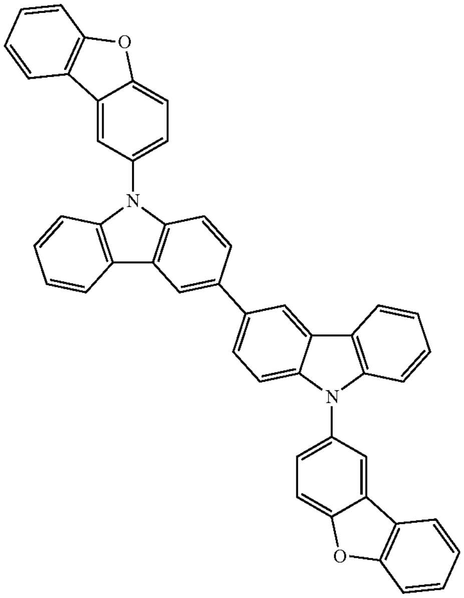
1-44
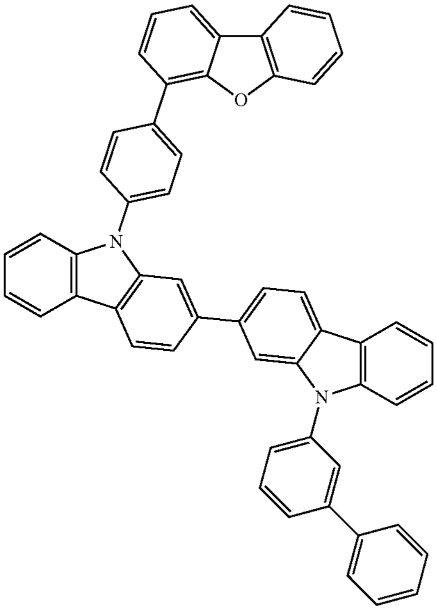
1-45
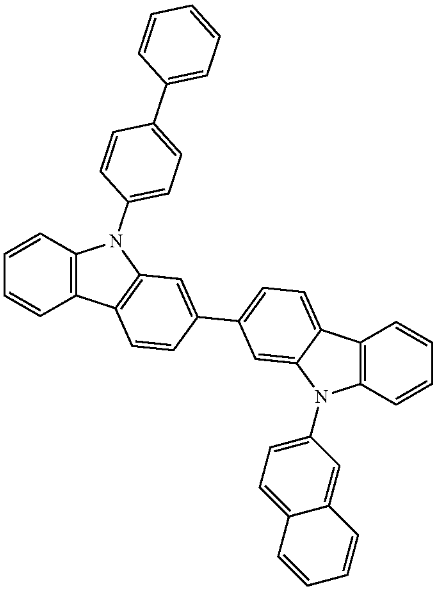

-continued
1-46
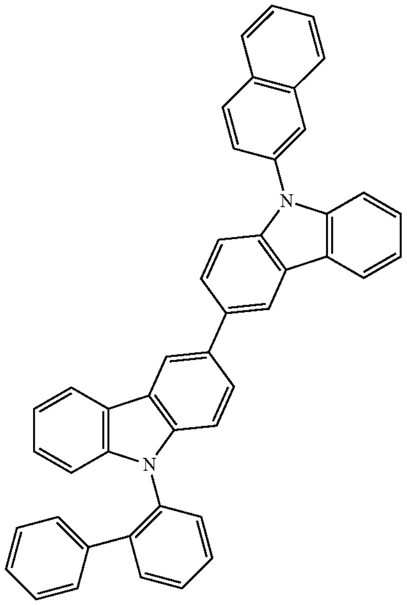
1-47
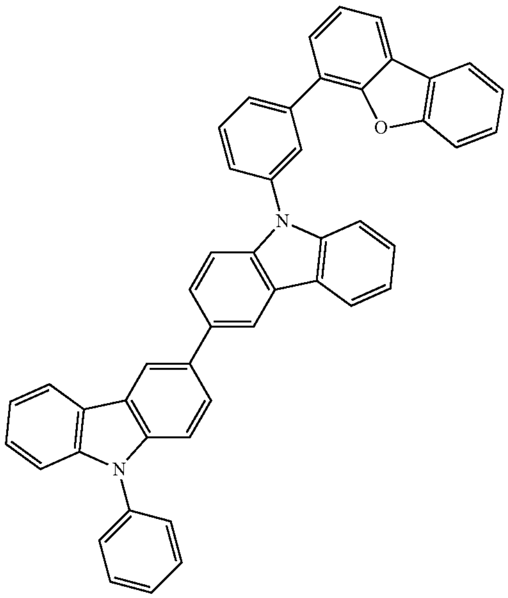
-continued
1-48
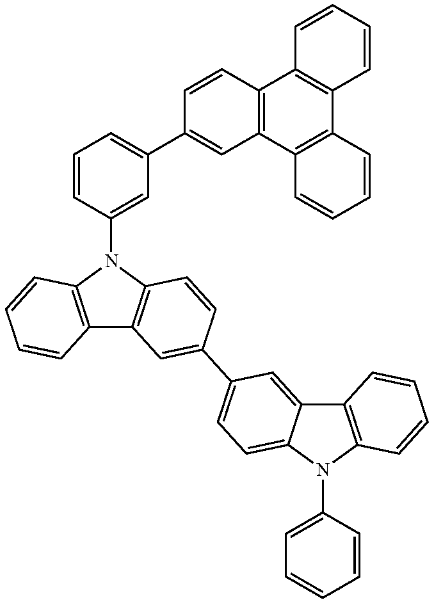
1-49
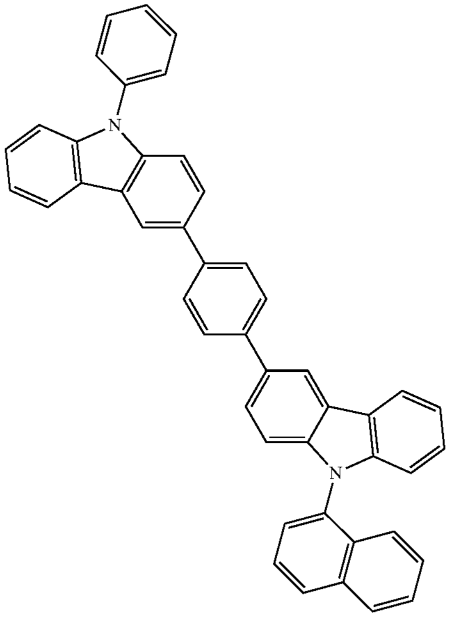

-continued
1-50
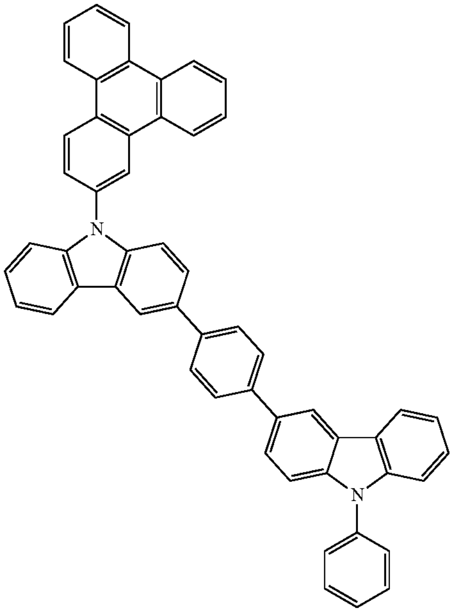
1-51
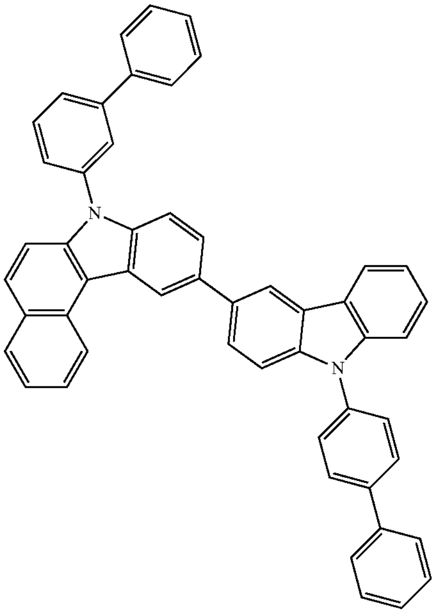
-continued
1-52
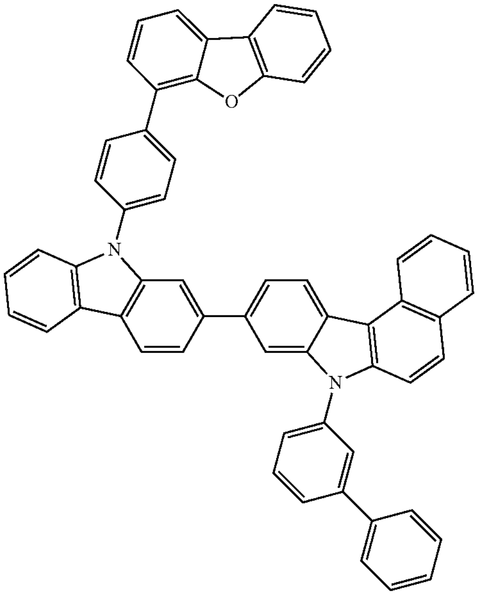
1-53
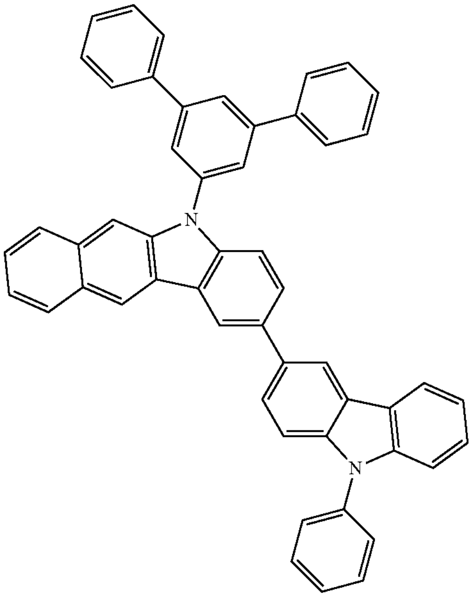

-continued
1-54
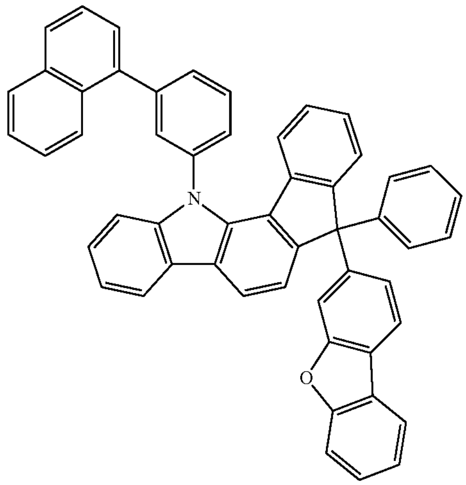
1-55
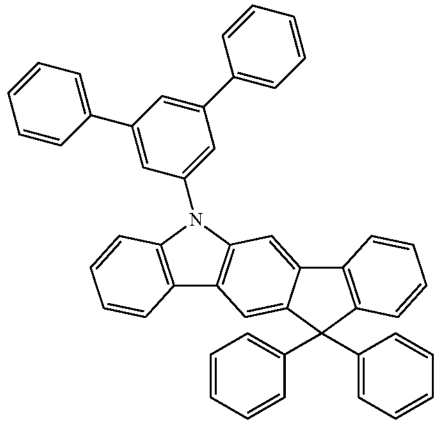
1-56
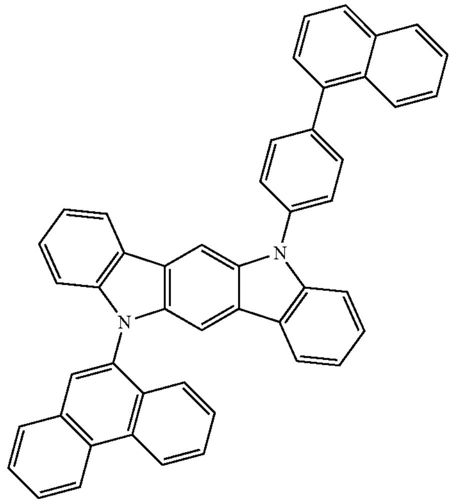
-continued
1-57
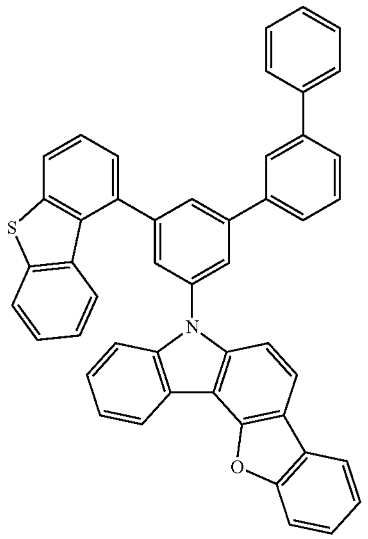
1-58
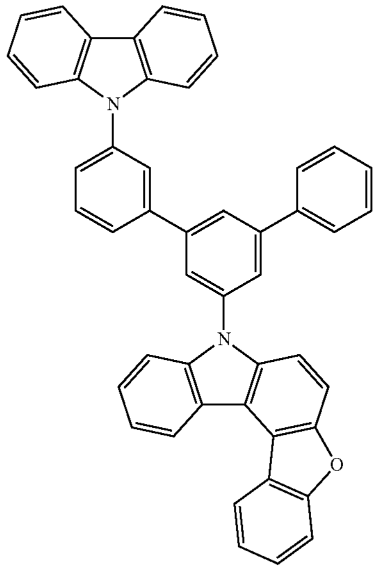
1-59
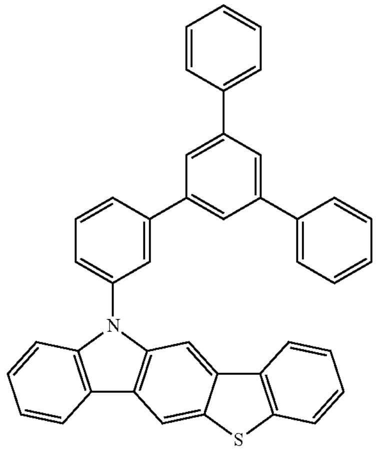

-continued
1-60
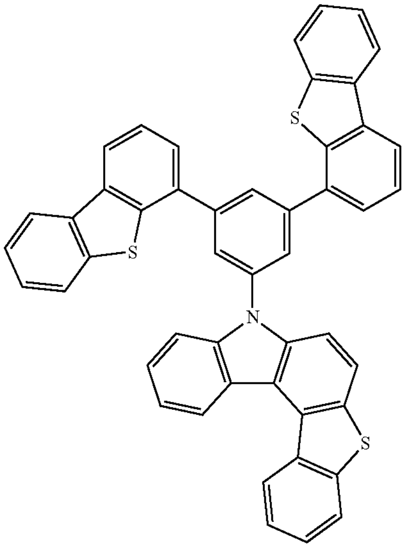
1-61
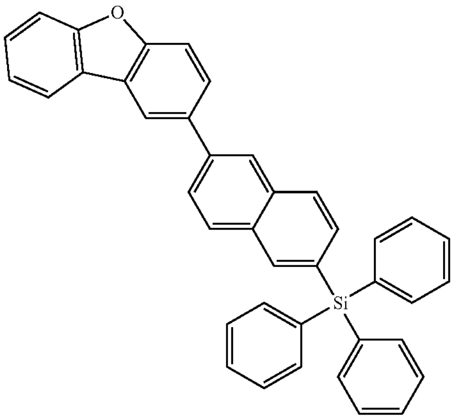
1-62
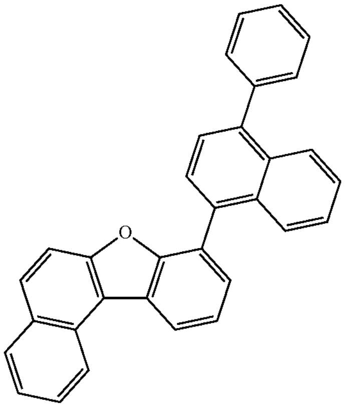
1-63
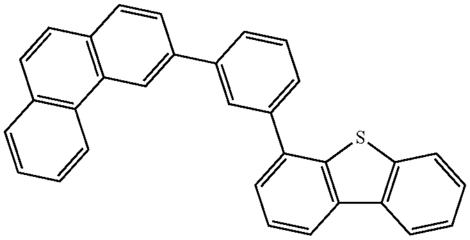
-continued
1-64
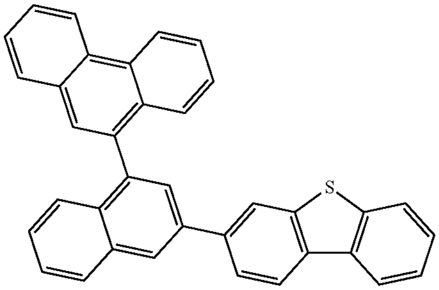
1-65
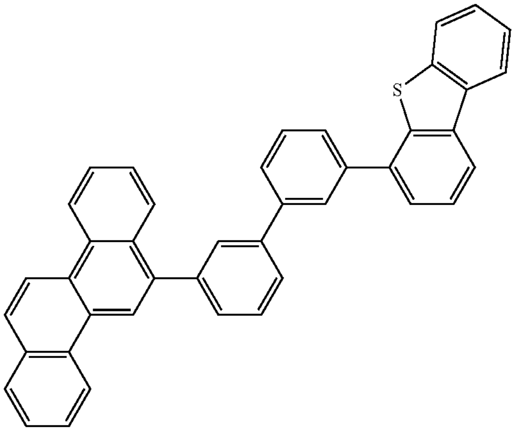
1-66
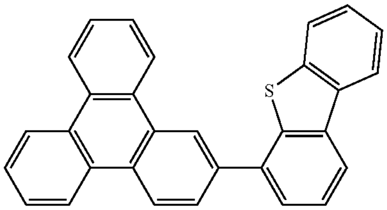
1-67
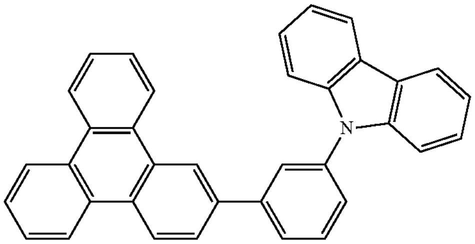
1-68
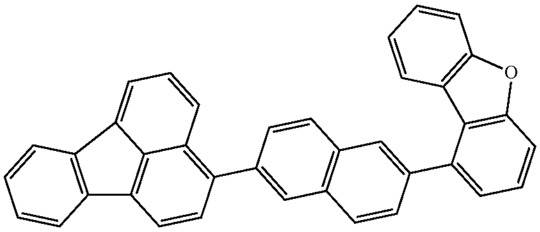

-continued
1-69
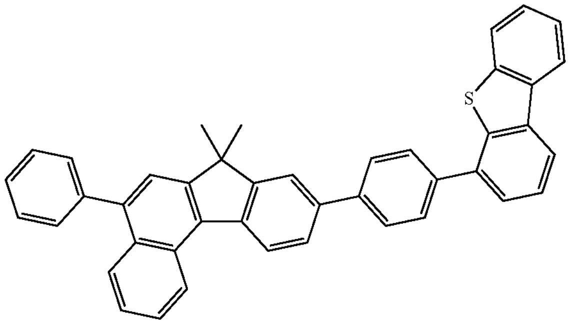
1-70
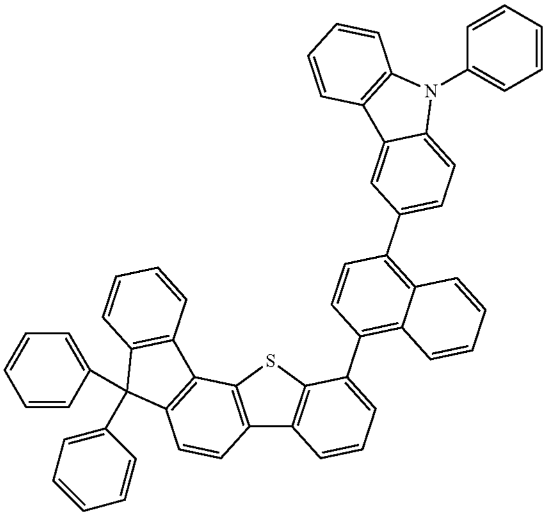
Group III
3-1
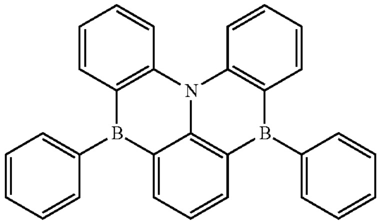
3-2
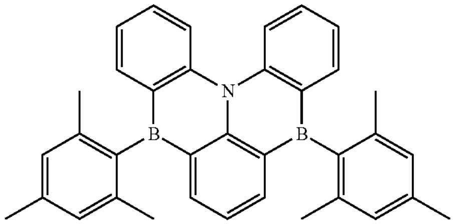
-continued
3-3
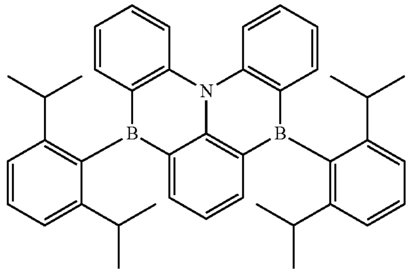
3-4
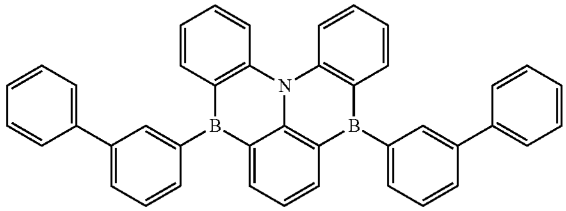
3-5
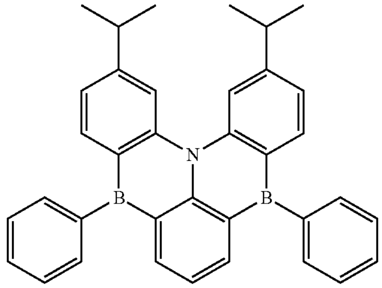
3-6
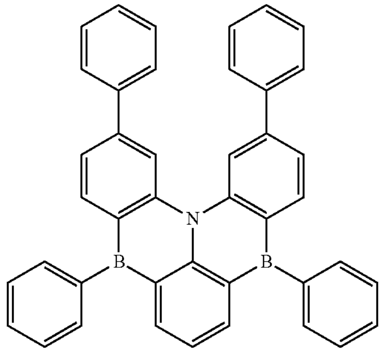
3-7
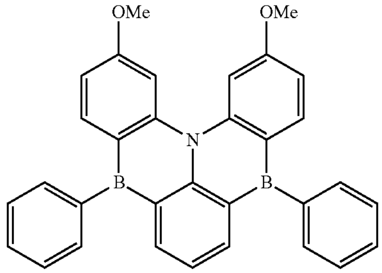

-continued
3-8
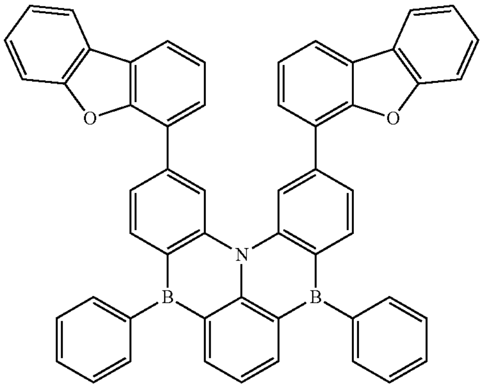
3-9
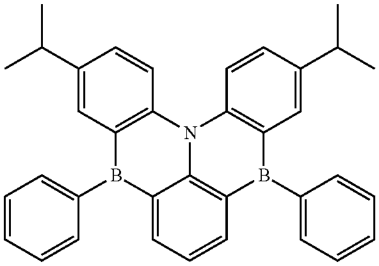
3-10
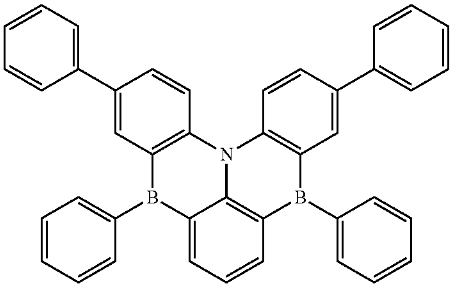
3-11
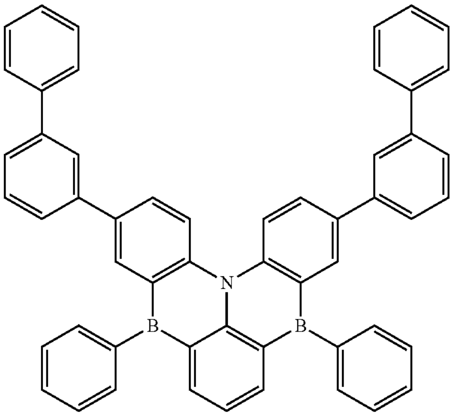
3-12
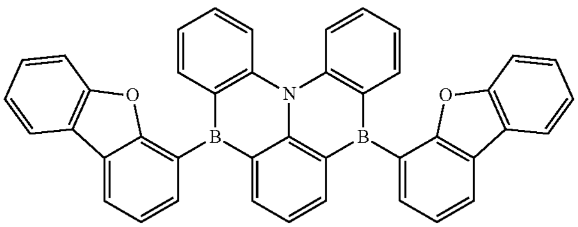
-continued
3-13
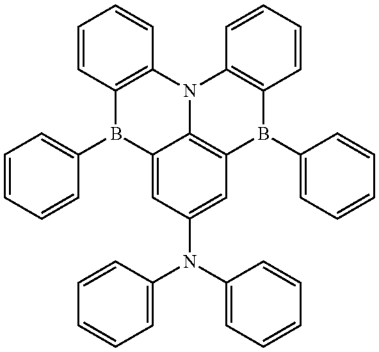
3-14
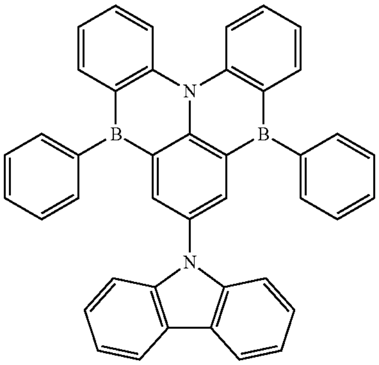
3-15
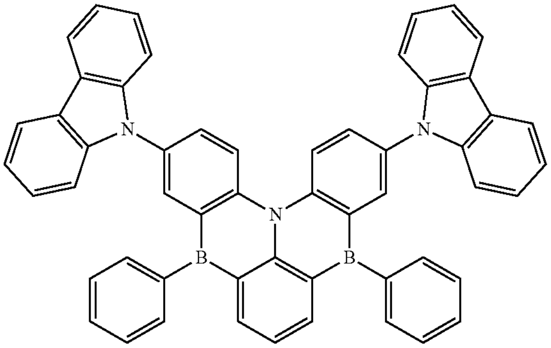
3-16
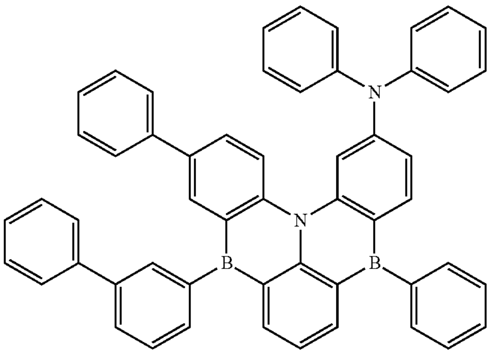

-continued
3-17
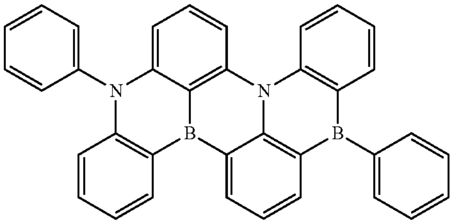
3-18
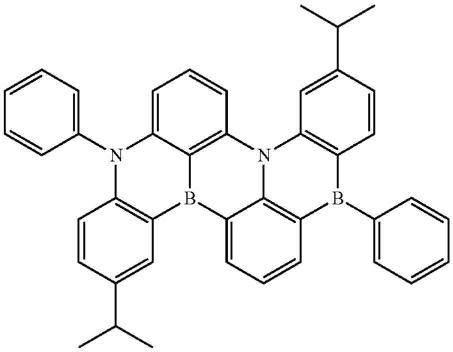
3-19
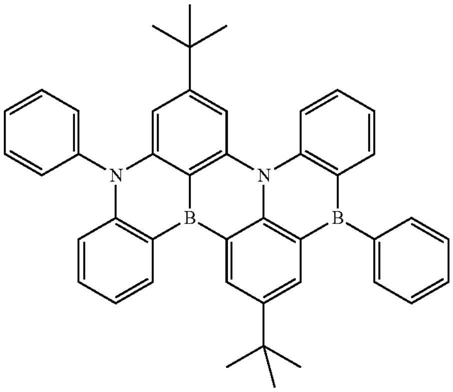
3-20
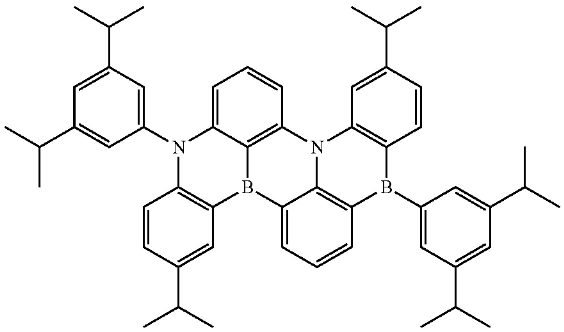
3-21
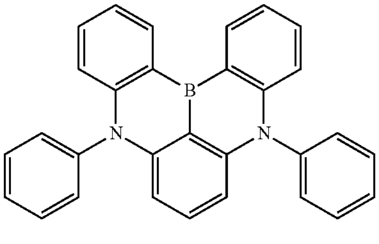
-continued
3-22
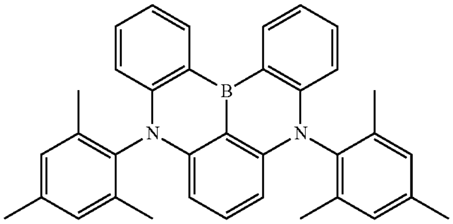
3-23
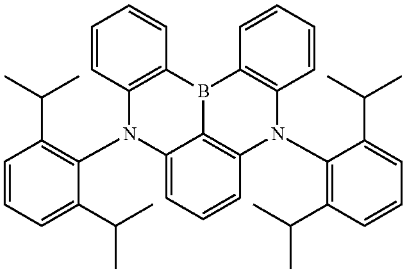
3-24
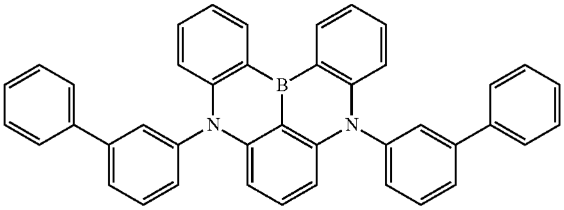
3-25
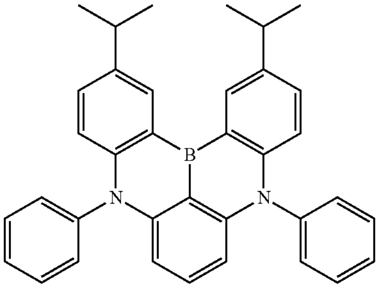
3-26
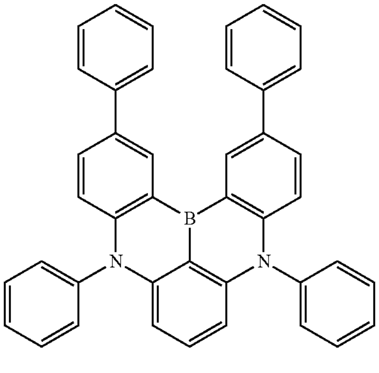

-continued
3-27
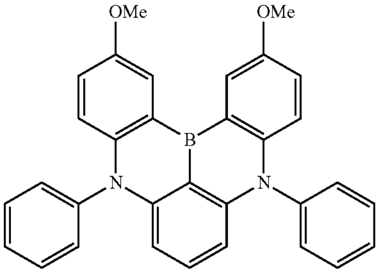
3-28
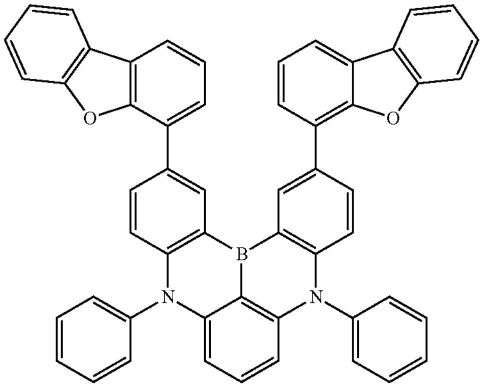
3-29
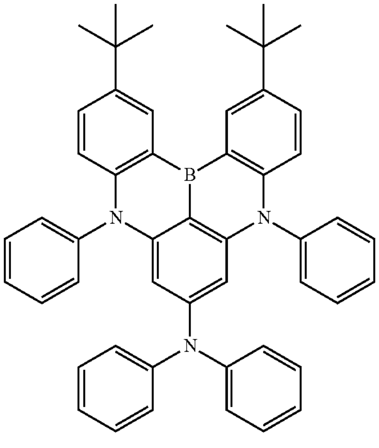
3-30
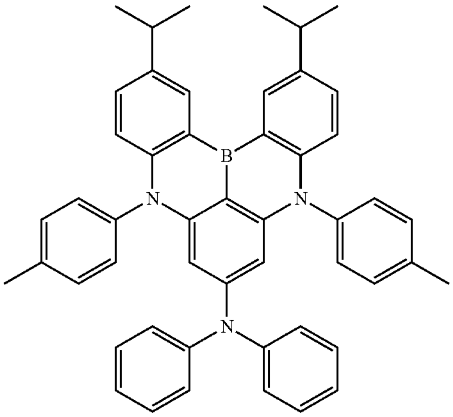
-continued
3-31
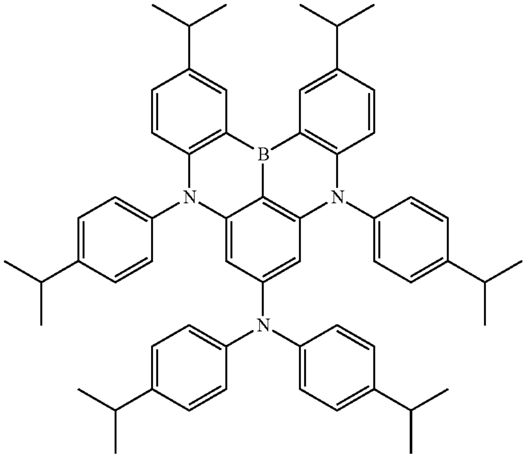
3-32
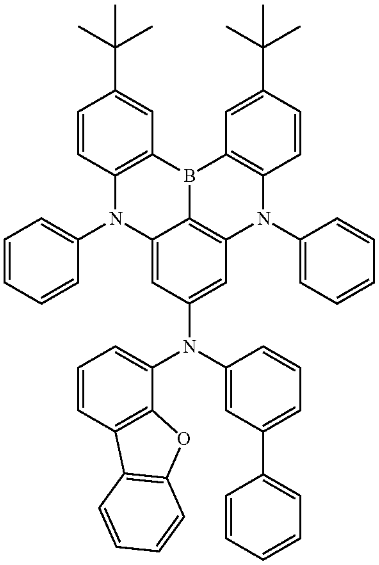
3-33
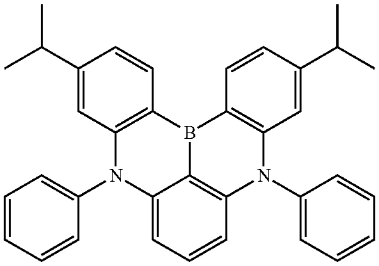
3-34
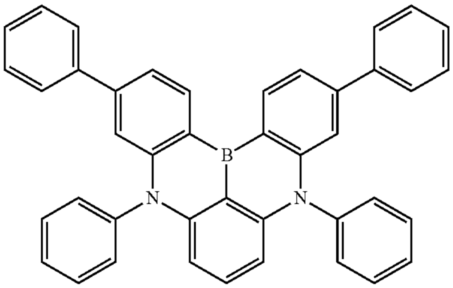

-continued
3-35
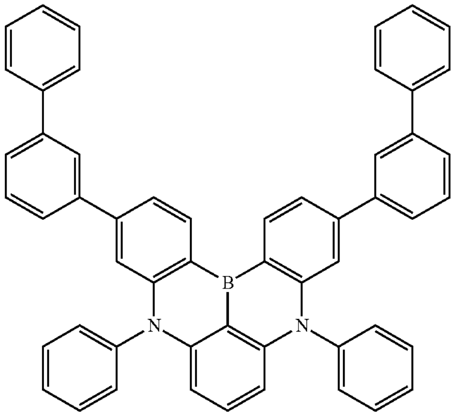
3-36
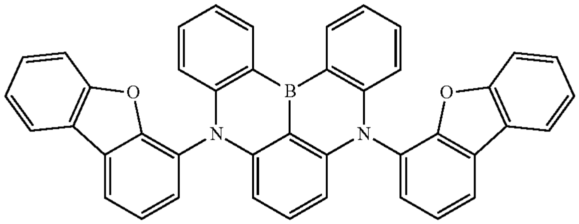
3-37
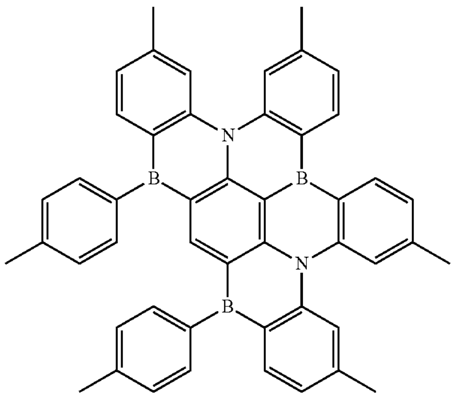
3-38
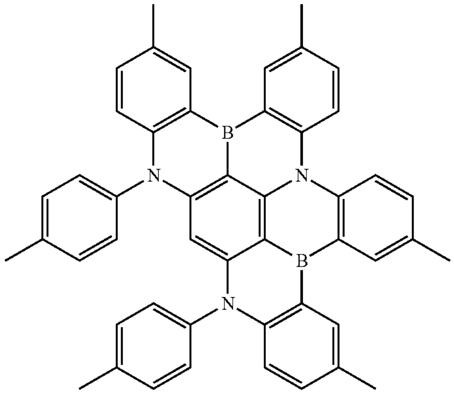
-continued
3-39
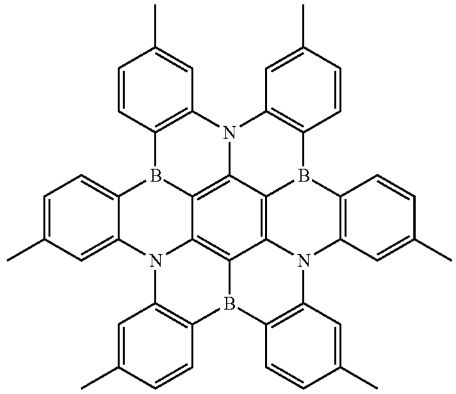
3-40
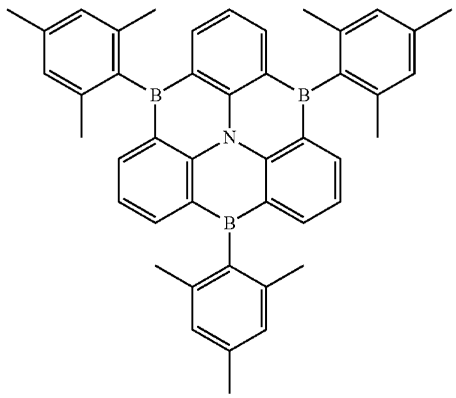
3-41
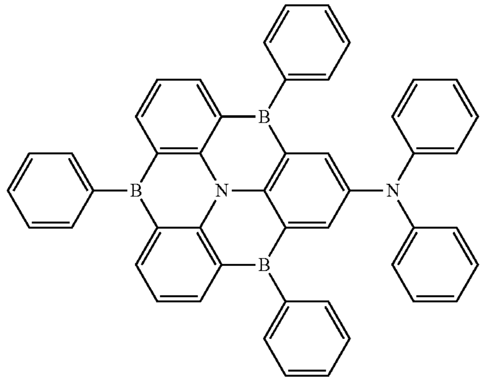

-continued 3-42

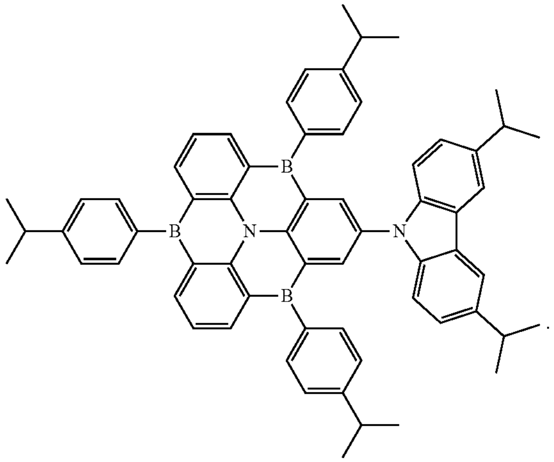

12. The organic light-emitting device of claim 1, wherein: the third compound has a maximum emission wavelength in a range of about 450 nm to about 650 nm.

13. The organic light-emitting device of claim 1, wherein: the organic light-emitting device emits delayed fluorescence in a range of about 450 nm to about 650 nm.

14. The organic light-emitting device of claim 1, wherein:

the first electrode is an anode, the second electrode is a cathode, the organic layer further comprises a hole transport region between the first electrode and the emission layer and/or an electron transport region between the emission layer and the second electrode, the hole transport region comprises a hole injection layer, a hole transport layer, an emission auxiliary layer, an electron blocking layer, or any combination thereof, and the electron transport region comprises a hole blocking layer, an electron transport layer, an electron injection layer, or any combination thereof.

15. A display apparatus comprising:

a thin-film transistor comprising a source electrode, a drain electrode, and an active layer; and the organic light-emitting device of claim 1, wherein the first electrode of the organic light-emitting device is electrically coupled to one selected from the source electrode and the drain electrode of the thin-film transistor.

* * * * *